United States Patent [19]
Noguchi et al.

[11] Patent Number: 6,040,610
[45] Date of Patent: Mar. 21, 2000

[54] SEMICONDUCTOR DEVICE

[75] Inventors: Mitsuhiro Noguchi; Yukihito Oowaki, both of Yokohama, Japan

[73] Assignee: Kabushiki Kaisha Toshiba, Kawasaki, Japan

[21] Appl. No.: 09/056,632

[22] Filed: Apr. 8, 1998

[30] Foreign Application Priority Data

Apr. 8, 1997 [JP] Japan .................................. 9-089538
Jan. 14, 1998 [JP] Japan ................................. 10-005986

[51] Int. Cl.$^7$ ..................................................... H01L 29/72
[52] U.S. Cl. .......................... 257/392; 257/314; 257/355; 257/371; 257/544; 327/143
[58] Field of Search ..................... 257/314, 355, 257/371, 392, 544; 327/143

[56] References Cited

U.S. PATENT DOCUMENTS

| | | |
|---|---|---|
| 4,092,548 | 5/1978 | Beilstein, Jr. et al. . |
| 4,460,835 | 7/1984 | Masuoka . |
| 4,660,835 | 4/1987 | Masuoka ................................. 257/392 |

FOREIGN PATENT DOCUMENTS

| | | |
|---|---|---|
| 6-216346 | 8/1994 | Japan . |
| 8-204140 | 8/1996 | Japan . |

OTHER PUBLICATIONS

Tadahiro Kuroda, et al., "A 0.9–V, 150–MHZ, 10–mW, 4 mm$^2$, 2–D Discrete Cosine Transform Core Processor with Variable Threshold–Voltage (VT) Scheme," IEEE Journal of Solid–State Circuits, vol. 31, No. 11, (Nov. 1996), pp. 1770–1779.

Shin'ichiro Mutoh, et al., "1–V Power Supply High–Speed Digital Circuit Technology with Multithreshold–Voltage CMOS," IEEE Journal of Solid–State Circuits, vol. 30, No. 8, (Aug. 1995), pp. 847–854.

S. Thompson et al., "Dual Threshold Voltages and Substrate Bias: Keys to High Performance, Low Power, 0.1 $\mu$m Logic Designs," 1997 Symposium on VLSI Technology Digest of Technical Papers, pp. 69–70, Jan.

Fariborz Assaderaghi, et al., "A Dynamic Threshold Voltage MOSFET (DTMOS) for Ultra–Low Voltage Operation," IEDM 94, pp. 809–812., Jan.

J. Chen, et al., "Subbreakdown Drain Leakage Current in MOSFET," IEEE Electron Device Letters, vol. EDL–8, No. 11, (Nov. 1987), pp. 515–517.

*Primary Examiner*—Edward Wojciechowicz
*Attorney, Agent, or Firm*—Oblon, Spivak, McClelland, Maier & Neustadt, P.C.

[57] ABSTRACT

A semiconductor device comprises a chip including a MISFET having a source and a drain, in which one of the source and the drain is connected to a second current supply node, an impedance element having a first terminal connected to the other of the source and the drain and a second terminal connected to a first current supply node, and a switching element, in which a well or a body electrode of the MISFET has an active state and a standby state, and is connected to a bias voltage generator for generating different voltages through the switching element, the threshold voltage $V_{ths}$ during standby state of the MISFET is higher than the threshold voltage $V_{tha}$ during active state of the MISFET, a voltage applied to a gate of the MISFET being able to take two stationary values, and the following relationship is satisfied $V_{DD}(1-V_{ths}/V_{DD}) < V_{ths} - V_{tha}$, where $V_{DD}$ represents the higher voltage among the two stationary values.

25 Claims, 42 Drawing Sheets

SEMICONDUCTOR DEVICE

BACKGROUND OF THE INVENTION

The present invention relates to a semiconductor device for carrying out high-speed switching with a low power supply voltage, in particular to a semiconductor device suitable to a power supply voltage of 1V or less.

Hitherto, an inverter having a MISFET has been widely used as one of logic circuits. As shown FIG. 1, in this inverter an n (channel)-type MISFET 4 and a p (channel)-type MISFET 5 are connected in series between a power supply terminal ($V_{DD}$) and a ground terminal (0V). A source or a drain of the MISFET 4 is coupled to a source or a drain of the MISFET 5 so that the coupling portion constitutes an output terminal of the inverter, and a gate of the MISFET 4 and a gate of the MISFET 5 are commonly coupled to form an input terminal 6 of the inverter.

When a power supply voltage is referred to as $V_{DD}$ in such an inverter having the MISFET as shown in FIG. 1, a consumed electric power is in proportion to $V_{DD}^2$. When a gate insulation film is attempted to be made thinner for higher-speed switching under a condition that the source voltage $V_{DD}$ is kept high, an electric field which is applied to the gate insulation film increases to cause an electric field-breakdown of the gate, a rise in a leakage current in the gate, and a poor dielectric breakdown voltage. Therefore, it is known that it is useful for reducing consumed electric power and improving reliability to lower a power supply voltage under the condition that the gate voltage is kept constant.

The delay time $\tau_{pd}$ in such a static inverter as shown in FIG. 1 is as follows:

$$\tau_{pd} = kC_L V_{DD}/(V_{DD}-V_{th})^n$$

wherein $C_L$ represents the load capacitance of the next stage at the inverter, $V_{th}$ represents the threshold voltage of a p-type MISFET and an n-type MISFET, k is a proportional constant, and n is from 1 to 2. The voltage at an input terminal 6 of the inverter changes from 0 to $V_{DD}$. Thus, in a low power supply voltage in which the $V_{DD}$ is, for example, 1V or less, the difference between the threshold voltage $V_{th}$ and the power supply voltage $V_{DD}$ is reduced so that the $\tau_{pd}$ increases, thereby making a high-speed operation difficult.

In a CMOS circuit, active researches have been made on reduction of a power supply voltage resulting in reduction of an electric power to be consumed. It is necessary for a low voltage-operation without degradation in operation speed that the threshold voltage $V_{th}$ is reduced. However, if the $V_{th}$ is reduced too much, it is impossible to satisfactorily cut off the subthreshold electric current penetrating through the source and drain electrodes of the transistor. In applications by use of a voltage which is not more than a built-in potential of a pn-junction of Si, it is known that such a circuit as shown in e.g., FIG. 2 is effective for obtaining a good cut-off characteristic. (F. Assaderaghi, D. Sinitsky, S. Parke, J. Bokor, P. K. Ko, and C. Hu., IEDM, Technical Digest, 809, (1994)). The circuit shown in FIG. 2 will be described briefly.

In FIG. 2, each of gates of transistors Q1 and Q2 is electrically connected to a substrate or a body electrode. In the specification, this structure is referred to as GST (Gate-Substrate Tie). The Q1 and the Q2 have a p-channel type MISFET and an n-channel type MISFET, respectively, and they constitute a CMOS inverter.

In the Q2 structure shown in FIG. 2, when a positive voltage $V_{DD}$ is applied to the gate, the positive voltage is also applied to the substrate. Accordingly, a threshold voltage is reduced to a lower level by a substrate bias effect than in the case in which the substrate voltage is kept 0V, so that electric current drivability of Q2 is raised. When the gate voltage is 0V, the substrate bias voltage is also kept 0V. This causes the same leakage current as in the case that the substrate bias voltage is kept 0V, so that the ON/OFF ratio is improved over the circuit in which its substrate bias voltage is kept constant.

However, in the present circuit, the leakage current during standby state is determined in the case in which the substrate voltage is set to 0V. The substrate bias voltage during standby state is closer to the substrate bias voltage during active state than, for example, a circuit in which the substrate voltage is $V_{DD}$ during active state and the substrate voltage is less than 0V, i.e., a negative during standby state, so that the increase of the threshold voltage by a substrate bias effect is smaller and the leakage current from a current penetrating through the source and the drain during standby state increases more.

As shown in FIG. 3, in a circuit in which the inverters as shown in FIG. 2 are connected in series, the leakage current during standby state may cause another problem. In the circuit shown in FIG. 3, an output terminal of the first inverter having transistors Q1 and Q2 is connected in series to an input terminal of the second inverter having transistors Q3 and Q4 to form a node. The Q1 and Q3 have p-channel type MISFETs and the Q2 and Q4 have n-channel type MOSFETs. They all constitute CMOS inverters.

When the voltage at an input node 101' of the first inverter is set up to a higher voltage than the logic inversion voltage, e.g., to $V_{DD}$, the voltage at an input node 112 of the second inverter is about 0V. In this case, the transistor Q3 is having a p-type MISFET, so that the pn-junction of the Q3 between a node 106' connected to a power supply for the power supply voltage $V_{DD}$ and a substrate electrode 102 is forward-biased. Thus, a forward diode current flows. At that time, in the Q2 transistor its gate and substrate electrode are positively biased, and the threshold voltage is low, and Q2 is turned on. As a result, the forward diode current, which is a direct current, from the Q3 flows through the Q2 to a ground voltage node 106. The passage of this current is shown an arrow of a solid line in FIG. 3. On the contrary, when the voltage at a node 101' is lower than the inversion voltage, a similar penetration current flows through the transistors Q4 and Q1.

In this circuit, the leakage current during standby state is also determined in the case the substrate voltage is set to 0V. The leakage current during standby state is larger than, for example, a circuit in which the substrate voltage during active state is $V_{DD}$ and one during standby state is negative.

As described above, if a gate insulation film is attempted to be made thinner in prior logic circuits such as an inverter of MISFETs in order to realize a high-speed operation, the electric field applied to the gate insulation film increases to cause dielectric breakdown of the gate and increase a leakage current. Reduction in the substrate voltage $V_{DD}$ also causes increase in delay time $\tau_{pd}$. In short, in any logic circuit in which its threshold voltage is kept constant, it is difficult to reduce delay time $\tau_{pd}$ with the reduction in the substrate voltage $V_{DD}$. In any logic circuit in which there is used only a GST transistor wherein a gate is connected to a substrate, it is also difficult to make penetration current during standby state small under a condition that electric current drivability during active state is kept.

BRIEF SUMMARY OF THE INVENTION

An object of the present invention is to provide a semiconductor device for making it possible to prevent increase in delay time $\tau_{pd}$ following reduction in a power supply voltage and realize a circuit structure for keeping a maximum electric field applied to a gate a determined value or less.

Another object of the invention is to provide a semiconductor device of which a circuit structure makes it possible to reduce penetration current during standby state and ensure electric current drivability during active state, and to make leakage current during active state small.

The first main point of the present invention is that electric current drivability during active state is improved by using a transistor whose threshold voltage $V_{th}$ can be changed during active state and during standby state by change in a substrate bias, even if a power supply voltage is reduced. The characteristic of the present invention is that the relationship between a power supply voltage and delay time for the transistor whose threshold voltage can be changed has been clarified and that a circuit structure has been realized for overcoming various problems associated with changing a substrate bias, in particular toward the forward direction.

The second main point of the invention is that a GST transistor is combined with a transistor whose threshold voltages $V_{th}$ can be changed during active state and during standby state by change in a substrate bias. (The transistor is referred to as a "substrate bias changing transistor"). In the present invention, by applying the substrate bias of the substrate bias changing transistor negatively, the penetrating current during standby state is made smaller than in any prior combination of the GST transistor with prior transistor. Electric current drivability during active state is also maintained by combining the GST with the substrate bias changing transistor to which a substrate bias is applied shallowly. Thus, the characteristic of the invention is to realize consistency with reduction in a leakage current at active/standby state and improvement in electric current drivability, which is difficult for prior structures. The structures of the present invention are as follows.

(1) A semiconductor device comprises: a chip including a MISFET having a source and a drain, in which one of the source and the drain is connected to a second current supply node; an impedance element having a first terminal connected to the other of the source and the drain and a second terminal connected to a first current supply node; and a switching element, in which a well or a body electrode of the MISFET has an active state and a standby state, and is connected to a bias voltage generator for generating different voltages through the switching element, the threshold voltage $V_{ths}$ during standby state of the MISFET is higher than the threshold voltage $V_{tha}$ during active state of the MISFET, a voltage applied to a gate of the MISFET being able to take two stationary values, and the following relationship is satisfied:

$$V_{DD}(1-V_{ths}/V_{DD}) < V_{ths}-V_{tha},$$

where $V_{DD}$ represents the higher voltage among the two stationary values.

(1-1) The voltage of the first current supply node is $V_{DD}$ and the voltage of the second current supply node is 0V when the MISFET is an n-type.

(1-2) The voltage of the first current supply node is 0V and the voltage of the second current supply node is $V_{DD}$ when the MISFET is a p-type.

(1-3) The impedance element is a resistor or a MISFET in which one of its source and drain is connected to its gate.

(1-4) The impedance element is a p-type MISFET when the MISFET is an n-type, and a gate of the p-type MISFET is connected to a gate of the n-type MISFET.

(1-5) A well or a body voltage of the n-type MISFET is higher than $V_{DD}$ when the MISFET is an n-type.

(1-6) The impedance element is an n-type MISFET when the MISFET is a p-type, and a gate of the n-type MISFET is connected to a gate of the p-type MISFET.

(1-7) A well voltage of the p-type MISFET is lower than 0V when the MISFET is a p-type.

(2) The chip has a substrate bias control circuit comprising a logic circuit including a MISFET, a step-down circuit, an n-type MISFET and a p-type MISFET, one of a source and a drain of the p-type MISFET in the substrate bias control circuit is connected to third current supply node, one of a source and a drain of the n-type MISFET is connected to fourth current supply node, gates of these MISFETs are commonly connected to the active/standby control input terminal, the other of the source and the drain of the p-type MISFET and the n-type MISFET are commonly connected to be connected to a substrate or a body electrode of the MISFET in the logic circuit, and one of power supply terminals of the logic circuit is connected to a current/voltage output portion of the step-down circuit, and the other of the power supply terminal is connected to either the first or the second current supply node.

(2-1) The substrate bias control circuit comprises two oscillators in which their oscillated frequencies or duty rations are different from each other, and a switching circuit for switching outputs from these oscillators by active/standby control input to supply the outputs into an input of an inverter having the p-type MISFET and the n-type MISFET.

(2-2) The substrate bias control circuit has a booster circuit for applying a higher voltage than a power supply voltage into the inverter having the p-type MISFET and the n-type MISFET.

(2-3) A voltage of the third current supply node is $V_{DD}$ and a voltage of the fourth current supply is 0V.

(3) The chip comprises a logic circuit having a MISFET, a first voltage supply node for giving a higher voltage than a power supply voltage $V_{DD}$ supplied to the logic circuit, a second voltage supply node for giving a lower voltage than the $V_{DD}$, selecting circuit for selecting either one of outputs from the first and second voltage supply nodes in accordance with either one of inputs under the two conditions during active state and standby state so as to give the output to a substrate or a body electrode of the MISFET of the logic circuit, and a charging MISFET in which one of its source and drain is connected to the substrate and the body electrode of the MISFET of the logic circuit, and the charging MISFET turns from a cut-off condition to a conductive condition in changing from the condition during standby state to the condition during active state and the other of the source and the drain of the MISFET is kept within the range from 0 or more Volt to $V_{DD}$ or less voltage.

(4) A semiconductor device comprises a chip including a logic circuit having a MISFET which is selectively operated under an active condition or a standby condition, a first voltage supply node for giving a voltage, which is lower than a ground voltage, corresponding to the standby condition, a second voltage supply node for giving a voltage, which is higher than a power supply voltage, corresponding to the active condition, a switching circuit for selecting either one of the first and second voltage supply nodes to give the voltage thereof a substrate or a body electrode of the MISFET in the logic circuit, wherein the switching circuit comprising a p-type MISFET and an n-type MISFET, the first voltage supply node being connected to one of a source and a drain of the n-type MISFET, and the second voltage supply node being connected to one of a source and a drain of the p-type MISFET, and the others of the sources and the drains of the n-type MISFET and the p-type MISFET being commonly connected to the substrate or the body electrode of the MISFET in the logic circuit, gates of the p-type MISFET and the n-type MISFET being commonly connected to a control input terminal for control of the two conditions, i.e., the active condition and the standby condition, and voltages at the control input terminal being within a range from a ground voltage of the logic circuit to a power supply voltage thereof.

(4-1) The first voltage supply node generates a negative voltage $V_1$ under the standby condition, a voltage $V_2$ of the first voltage supply node under the active condition is a voltage more positive than the $V_1$, the second voltage supply node outputs a positive voltage $V_3$, and a voltage $V_4$ of the second voltage supply node under the standby condition is a voltage more negative than the $V_3$ under the active condition; and which satisfies the following relationship: $V_{th1}<V_s$ and $V_{th3}>V_a$, and ($V_{th2}>V_a$ and $V_{th1}<V_a$) or ($V_{th3}>V_s$ or $V_{th4}<V_s$), provided that when the voltage of the first voltage supply node of the selecting circuit is fixed to $V_1$ and a control signal is changed, a control input voltage which changes from a cut-off condition to a conductive condition is represented by $V_{th1}$; when the voltage of the first voltage supply node of the selecting circuit is fixed to $V_2$ and the control signal is changed, a control input voltage which changes from the cut-off condition to the conductive condition is represented by $V_{th2}$; when the voltage of the second voltage supply node of the selecting circuit is fixed to $V_3$ and the control signal is changed, a control input voltage which changes from the cut-off condition to the conductive condition is represented by $V_{th3}$; when the voltage of the second voltage supply node of the selecting circuit is fixed to $V_4$ and the control signal is changed, a control input voltage which changes from the cut-off condition to the conductive condition is represented by $V_{th4}$; the stationary voltage of the control signal under the standby condition is represented by $V_s$; and the voltage of the control signal under the active condition is represented by $V_a$.

According to the present invention, the structure (1) makes it possible not to increase gate delay time even if the power supply voltage is reduced, and to keep a gate electric field not more than a constant value. Thus, it is possible to manufacture a high-speed circuit highly reliable on the gate insulator even if dielectric breakdown voltage of the gate, and the charge amount flowing the gate insulation film are kept constant. It is also possible to reduce the power supply voltage, so as to suppress generation of hot carriers by drain electric field and improve reliability of the transistor more. The structures (2)–(4) makes it possible to keep the range of a substrate bias changing amount wide at active/standby state wide even if the power supply voltage is lowered, thereby reducing electric power consumption during standby state.

(5) A semiconductor device in which a p-type MISFET, an n-type MISFET, and a resistor are formed on the same chip, one of a source and a drain of the p-type MISFET being connected to a first current supply node, one of the n-type MISFET being connected to a second current supply node, the others of the sources and the drains of the respective MISFET being commonly connected, at least one of a well or a body electrode of the p-type MISFET and a well or a body electrode of the n-type MISFET being through the resistor to the commonly connected portion of the source/drains of the respective MISFET, gates of the respective MISFET being commonly connected to form an input of an inverter, the product of the total capacitance of the well or the body electrode and resistance of the resistor being longer than gate delay time of the inverter, and the voltage of the well or the body electrode being the same as the voltage of the commonly connected source/drains when an input signal is under a stationary state.

(5-1) The first current supply node is a power supply node $V_{DD}$ of a logic circuit, and the second current supply node is a ground node of the logic circuit.

(5-2) The resistor has a pn-junction structure in the same layer as the layer in which the source and drain electrodes of the MISFET are formed.

The structure (5) makes it possible to lower the threshold voltage at input rise time and raise it at input fall time, and consequently shorten gate delay time when the input rise time or input fall time is late.

(6) A semiconductor device comprises: a first conductive semiconductor layer; a first conductive well and a second conductive well provided on the first conductive semiconductor layer, the wells being adjacent to the layer; a first conductive channel type MISFET formed in the second conductive well; a second conductive channel type MISFET formed in the first conductive well; a diode element formed in the second conductive wells; and a current supply node; at least one of the MISFETs being selectively operated under an active condition and an standby condition; a source and a drain of the first conductive channel type MISFET being connected to the current supply node, one terminal of the diode element being connected to the current supply node, the second conductive well being connected to the other terminal of the diode element, the forward direction of the diode elements being consistent with the forward direction of a pn-junction formed by the source and the drain of the first conductive channel type MISFET and the second conductive well; the built-in potential of the diode element being a lower voltage than the built-in potential of a pn-junction formed by the source and the drain of the first conductive channel type MISFET and the second conductive well; and a forward bias is applied between the source and the drain of the first conductive channel type MISFET and the second conductive well, under the active condition.

(7) A semiconductor device which comprises: a first conductive semiconductor layer; a first conductive well and a second conductive well provided on the first conductive semiconductor layer, the wells being adjacent to the layer; a first conductive channel type MISFET formed in the second conductive well; a second conductive channel type MISFET formed in the first conductive well; and diode element formed in the first and the second conductive wells; the first conductive well being connected to one terminal of the diode element, the second conductive well being connected to the other terminal of diode element, and ones of sources and drains of the respective MISFETs being commonly connected, the forward direction of the diode element being consistent with the forward direction of a pn-junction formed by the first conductive well and the second conductive well, the built-in potential of the diode element being a lower voltage than the built-in potential of a pn-junction formed by the first conductive well and the second conductive well; and a forward bias being applied to the first conductive well and the second conductive well during active state, and a backward bias being to applied to the first conductive well and the second conductive well during standby state.

The structure (6) or (7) makes it possible to overcome latching-up, which is a problem in controlling a substrate bias.

(8) A semiconductor device comprises: a first conductive semiconductor layer; a first conductive well and a second conductive well provided on the first conductive semiconductor layer, the wells being adjacent to the layer; a first conductive channel type MISFET formed in the second conductive well; a second conductive channel type MISFET formed in the first conductive well and a switching circuit; at least one of the MISFETs being selectively operated under an active condition or a standby condition, the second conductive well being connected to one terminal of the switching circuit, the first conductive well being connected to the other terminal of the switching circuit, ones of sources and drains of the respective MISFETs being commonly connected, the switching circuit turning from a cut-off condition from a conductive condition, in changing from the condition during active state to the condition during standby state, a forward bias being applied to the first and the second conductive wells during active state, and a backward being applied to these wells during standby state.

(9) A semiconductor device comprises: a first conductive semiconductor layer; a first conductive well and a second conductive well provided on the first conductive semiconductor layer, the wells being adjacent to the layer; a first conductive channel type MISFET formed in the second conductive well; a second conductive channel type MISFET formed in the first conductive well; a first and a second current supply nodes; at least one of the first and the second channel MISFETs being selectively operated under an active condition and a standby condition, the second conductive well being connected to an output of the first bias voltage generator through the first voltage supply node, the first conductive well being connected to an output of the second voltage generator through the second voltage supply node, the electric current drivability of the first bias voltage generator being changed in accordance with an output voltage of the second bias voltage generator, a forward bias being applied to the first and the second conductive wells during active state, and a backward bias being applied to these wells during standby state.

The structure (8) or (9) makes it possible to prevent overshoot and undershoot of j the voltage of the wells by capacitive coupling between the wells, thereby overcome latching-up.

(10) A semiconductor device comprises: a chip in which first and second MISFETs and a voltage supply node are formed, wherein a gate and a well electrode, or the gate or a body electrode of the first MISFET being connected to each other, a source of the first MISFET and a drain of the second MISFET being connected to each other, a source of the second MISFET being connected to a current supply node, a well or a body electrode of the second MISFET being connected to the voltage supply node and being able to fall in at least two stationary conditions during standby state and during active state, $V_{th}$ and $V_{ths}$ being set to satisfy $V_{th} < V_{ths}$ wherein $V_{ths}$ represents the threshold voltage during standby state of the second MISFET and $V_{th}$ represents the threshold voltage of the first MISFET, and the voltage of a gate of the second MISFET being able to fall in at least two stationary conditions during standby state and active state, the second MISFET becoming a cut-off state during standby state, and the second MISFET becoming conductive as active state.

(10-1) The gate and the well electrode of the first MISFET or the gate and the body electrode thereof being connected to each other, and plural of the MISFETs are in parallel connected so that sources thereof are common and drains thereof are common and gates thereof are independently biased from each other.

(10-2) The conductive type of the majority carriers of the first and the second MISFET are the same.

(10-3) The relationship $V_{th} > V_{tha}$ is satisfied when the threshold during active state of the second MISFET is represented by $V_{tha}$.

(10-4) A backward bias is applied to the well or the body electrode of the second MISFET during standby state, and a forward bias is applied to the well or the body electrode of the second MISFET during active state, compared to the source electrode voltage the second MISFET.

(10-5) A source electrode of the third MISFET is connected to a node to which the source electrode of the first MISFET and the drain electrode of the second MISFETs are connected, and the gate electrode of the third MISFET is connected to the well or the body electrode thereof, and the third and the first MISFETs are formed on the same chip.

(10-6) A negative bias is applied to the gate of the second MISFET during standby state, compared to its source electrode voltage.

(11) A semiconductor device comprises a chip in which first, second and third MISFETs and a voltage supply node, wherein a gate and a well electrode of the first MISFET or the gate and a body electrode thereof being connected to each other, a drain of the first MISFET being connected to a drain electrode of the second MISFET and a gate electrode of the third MISFET, a source electrode of the second MISFET being connected to a current supply node, majority carriers of the first MISFET and the third MISFET are the same conductive type, a well or a body electrode of the third MISFET is connected to the voltage supply node and has two stationary conditions during standby state and during active state, and a voltage is applied to the well or the body independently of its gate voltage.

(11-1) The gate and the well electrode of the first MISFET or the gate and the body electrode thereof being connected to each other, and plural of the MISFETs are in parallel connected so that sources thereof are common and drains thereof are common and gates thereof are independently biased from each other.

(11-2) A gate electrode of a fourth MISFET is connected to the gate electrode of the third MISFET, one of source and drain electrodes of the fourth MISFET is connected to a drain electrode of the third MISFET, and a voltage is applied to a well or a body electrode of the fourth MISFET independently on the gate voltage of the fourth MISFET.

(11-3) The conductive type of the majority carriers of the first and the second MISFET are different from each other.

(11-4) A backward bias is applied to the well or the body electrode of the second MISFET during standby state, and a forward bias is applied to the well or the body electrode of the second MISFET during active state, compared to the source electrode voltage the second MISFET.

The structure (10) or (11) makes it possible to suppress an increase in gate delay time and realize higher-scale integration, and to reduce leakage currents at standby and active state and maintain electric current drivability during active state in comparison with prior structures in which transistors whose substrate biases are not changeable are connected in series.

(12) A first region of a first conductive type and a second region of a second conductive type are formed on a semiconductor substrate of the first conductive type. The first region is isolated from the semiconductor substrate by insertion of the second region. On the first region, a third region of the first conductive type and a fourth region of the second conductive type are formed. On the second region, a fifth region of the first conductive type and a sixth region of the second conductive type are formed. The third, fourth, fifth and sixth regions are isolated by element isolation regions, respectively.

According to the above-mentioned invention, it is possible that gate delay time $\tau_{pd}$ does not increase and the gate electrical field is kept a constant voltage or less even if the power supply voltage is reduced. Thus, it is possible to form a high-speed circuit having high reliability in connection with dielectric breakdown voltage of the gate and current amount flowing through the gate. It is also possible to reduce the power supply voltage, thereby preventing generation of hot carriers by drain electric field and improving reliability of the transistor. Furthermore, the present invention can overcome the problem of latching-up, which is a problem in controlling a substrate bias.

According to the invention, it is also possible to prevent increasing in gate delay time, realize high-scale integration and to reduce leakage currents in standby and active states and maintain electric current drivability in comparison with prior structures in which transistors whose substrate biases are not changeable are connected in series. This makes it possible to realize a circuit in which a short cut current is reduced during standby state, electric current drivability during active state is maintained, and the leakage current is kept small during active state.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE SEVERAL VIEWS OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE INVENTION

Referring to the attached drawings, embodiments according to the present invention will be described below.

Embodiment 1

The inventors have newly found a method for making $\tau_{pd}$ small and keeping a maximum electric field $E_{max}$ applied to a gate insulation film constant by forming a logic circuit with use of a MISFET for changing the threshold voltage $V_{th}$ during active state and during standby state even if $V_{DD}$ is reduced under a condition that a load capacitance is constant. Each of FIGS. 4A and 4B illustrates a structure example of the circuit.

Figure 4A:
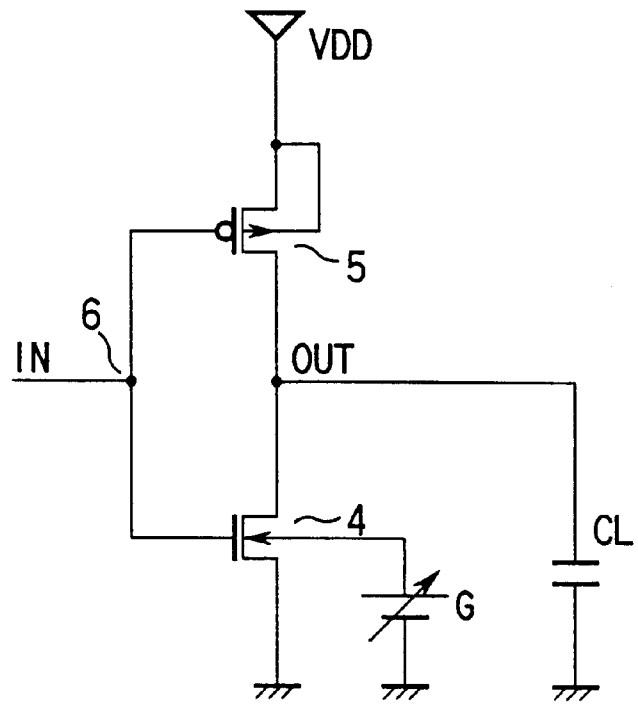
FIGS. 4A and 4B are views illustrating circuit structures of an inverter concerned with the first embodiment.
Figure 4B:
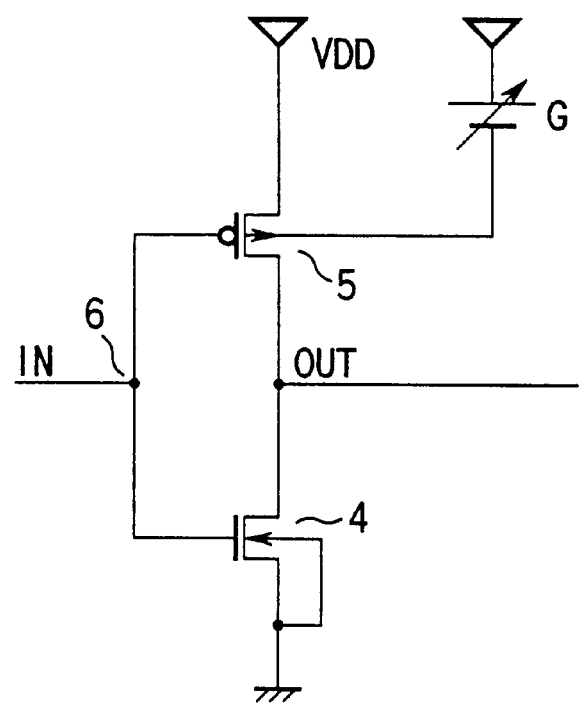

In the circuit shown in FIG. 4A, a gate electrode of an n(channel)-type MISFET 4 is connected to a gate electrode of a p(channel)-type MISFET 5 so as to form an input electrode 6 (IN) of an inverter. A drain electrode of the n-type MISFET 4 is also connected to a drain electrode of the p-type MISFET 5 to form an output (OUT) of the inverter. A source electrode of the n-type MISFET 4 is connected to a node at the voltage 0V (the second current supply node), and a source electrode of the p-type MISFET 5 is connected to a node at the voltage $V_{DD}$ (the first current supply node). This structure constitutes a static-type inverter.

A characteristic of the structure shown in FIG. 4 is to connect a substrate electrode of the n-type MISFET 4 to a variable bias power supply G. This power supply G is used to change the threshold voltage of the transistor by a substrate bias effect, and can output at least two voltages corresponding to active state and standby state. Herein, it is assumed that the threshold of the n-type MISFET during standby state is V1, and that during active state is V1–ΔV.

Figure 5A:
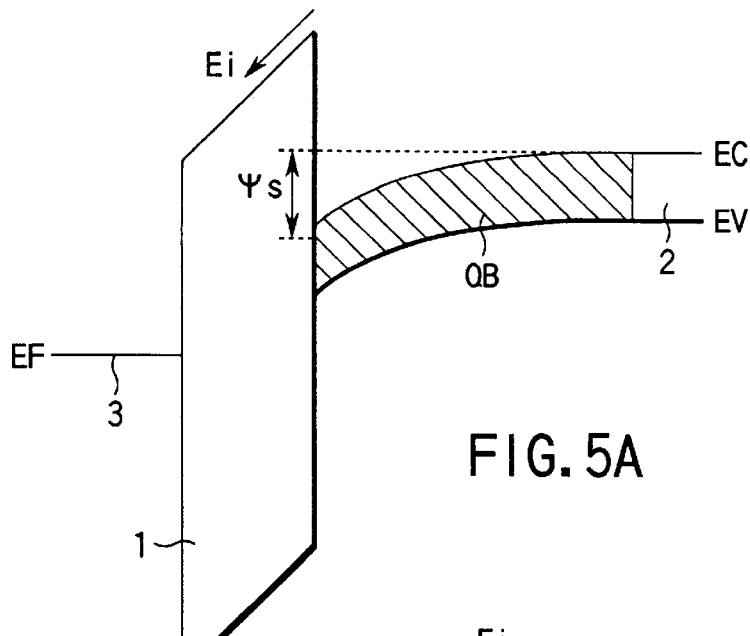
FIGS. 5A and 5B are a band diagram of an n-type MIS structure and a view showing dependency of an insulator field on the threshold.
Figure 5B:
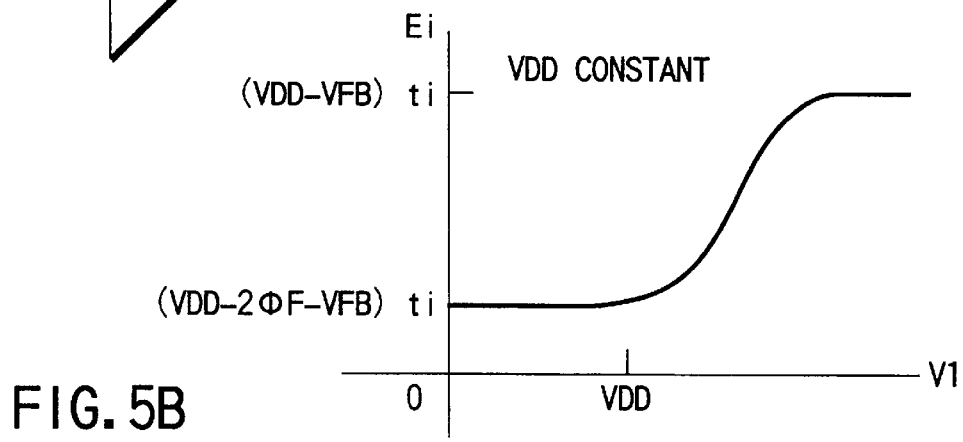

Before the description of the method according to the present invention, the following will explain how the maximum electric field $E_{max}$ applied to a gate insulation film depends on a power supply voltage and a MISFET structure, referring to a band diagram between a gate and a well of an n-type MISFET shown in FIGS. 5A and 5B, as one example. Instead of an electrode referred to as a well electrode for convenience sake in the first and second embodiments, there may be used a body electrode in a partially depleted transistor on an SOI (silicon-on-insulator) structure, a back gate electrode formed below a channel, or a back gate electrode formed below an SOI insulation film.

FIG. 5A is a band diagram of a gate insulation film 4 and a MIS interface of a semiconductor 2. In FIGS. 5A and 5B, $E_C$ represents the lower end of a conduction band, and $E_v$ represents the upper end of a valence band. In FIG. 5A, the portion in which diagonal lines are drawn represents a depletion layer electrical charge in the semiconductor, and $Q_B$ represents a surface charge density obtained by integrating the depletion layer electrical charge in the direction perpendicular to the gate insulation film 1. When the gate voltage measured on the basis of the source is represented as $V_G$ and a charge originated from trapping by defect is ignored owing to little quantity thereof, the electric field applied to the gate insulated film is as follows:

$$E_i = (V_G - \psi_S - V_{FB})/t_i \tag{1}$$

wherein $t_i$ is the film thickness of the gate insulation film 1, $V_{FB}$ is the flat band voltage of the MIS capacitor, and $\psi_s$ is the bending quantity of the surface band of the semiconductor 2.

In the case of $V_G \geq V_1$, $\psi_s$ is substantially fixed to about $2\phi_F$ wherein $\phi_F$ is a Fermi level of the semiconductor 2 measured on the basis of the mid gap, because the surface of the semiconductor 2 has a formed inversion layer. Thus, the equation (1) can be represented as follows.

$$E_i=(V_G-2\phi_F-V_{FB})/t_i \qquad (2)$$

As a result, $E_i$ does not depend on the threshold voltage V1.

On the other hand, in the case of $V_G<V_1$, $\psi_S$ is smaller than $2\phi_F$, since the surface of the semiconductor is depleted so as not to have any formed inversion layer. When in this case in which $V_G$ is kept constant, the bending quantity of the surface $\psi_S$ becomes smaller with the rise in the threshold. Thus, as the threshold rises, $E_i$ also rises. In particular in the case of the CMOS inverter shown in FIG. 1, $V_G$ becomes equal to $V_{DD}$. Consequently, as shown in FIG. 5B, $E_i$ rises in the case of $V_{DD}<V_1$, and $E_i$ is kept constant in the case of $V_{DD} \geqq V_1$.

For reducing a subthreshold leakage current and a diffusion leakage current of the well and the pn-junction during standby state, it is preferred to raise the threshold $V_1$. For preventing an electric field-breakdown of the gate insulation film, increase in a leakage current and poor dielectric breakdown voltage, it is desired to control the absolute value of $E_i$ at a low value and satisfy $V_{DD} \geqq V_1$. In the case of the n-type MISFET shown by the reference number 4 in FIGS. 4A and 4B, for satisfying both of these requirements it is desired that $V_{DD}$ is made equal to $V_1$.

Incidentally, the requirement "$V_{DD} \geqq V_1$", which is necessary for maintaining reliability of the gate insulation film, is preferable for maintaining data in the logic circuit during standby state, too. For example, it is assumed that the inverter shown in FIG. 4A is changed from an active state to a standby state under the condition that its output is 0V. In the standby state, the leakage current flowing into the load $C_L$ through the p-type MISFET is represented by $I_0$. When $V_1$ is lower than the power supply voltage $V_{DD}$, electric current drivability is maintained because the n-type MISFET 4 is under a conductive state. On the contrary, when $V_1$ becomes higher than the power supply voltage $V_{DD}$, the n-type MISFET 4 turns into a cut-off state, that is, a subthreshold leakage region, so that electric current drivability will drop sharply and control of the flowing current will become very difficult. For this reason, the leakage current flowing into the load $C_L$ through the p-type MISFET 5 causes a rise in an output voltage. If it rises over the input threshold of the next logic circuit, data become easy to destroy.

In this connection, the voltage $V_{DD}$ may be changed by the range from 5 to 10% thereof by, for example, change in an external power supply voltage or electric current-consumption of a logic circuit connected in parallel. Also, any device driven with a battery has a large change width of its voltage, e.g., 10 or more %. Thus, it is desired that the absolute value of $E_i$ has a room for change in the power supply voltage. It is understood that, in connection with the threshold voltage, preferably the constant $\beta (\leqq 1)$ is fixed so as to meet the relationship "$V_1=\beta V_{DD}$", since the threshold voltage varies, for example, by statistical deviation of the number of impurities in the substrate 2 shown in FIGS. 5A and 5B.

The following will describe a requirement for making $\tau_{pd}$ small and keeping the maximum electric field $E_{max}$ applied to the gate insulation film even if $V_{DD}$ is reduced.

It is assumed that the threshold voltage during standby state is fixed so as to meet the relationship "$V_1=\beta V_{DD}$" and subsequently a substrate bias is applied more forwardly during active state than during standby state so that in FIGS. 4A and 4B the junction of the source/drain and the well will correspond to the forward bias direction. The method for changing the substrate bias during active state from that during standby state is known in e.g., Jpn. Pat. Appln. KOKAI Publication No. 6-216346 and 6-89574. However, the inventors have newly found that an electric field applied to a gate insulation film does not increase even if a substrate bias is applied along the forward bias direction under a condition that $V_{DD}$ is constant.

In short, when the substrate bias is applied along the forward direction, $E_i$ becomes constant, as is understood from the equation (2), in the case in which an inversion layer is formed.

It is assumed that during active state the threshold voltage of the n-type MISFET changes to $(V_1-\Delta V)$ by application of the substrate bias. When the input 6 is changed from 0V to $V_{DD}$, the delay time $\tau_{pd}$ of the output is represented as follows:

$$\tau_{pd}=\gamma C_L V_{DD}/[V_{DD}-(V_1-\Delta V)]^e, =\gamma C_L V_{DD}/[(1-\beta)V_{DD}+\Delta V]^e \qquad (3)$$

wherein $\gamma$ is a constant independent of $V_{DD}$ and of the substrate bias voltage, e is a parameter satisfying the inequality "$1<e \leqq 2$", in general the inequality "$1.3 \leqq e \leqq 1.5$", and is closer to 1 as a carrier speed approaches the saturated voltage thereof, and particularly in a long channel transistor e is 2. $\Delta V$ corresponds to the difference between the threshold voltage during standby state and that during active state, and depends on the substrate bias but hardly depends on $V_{DD}$.

Figure 6:
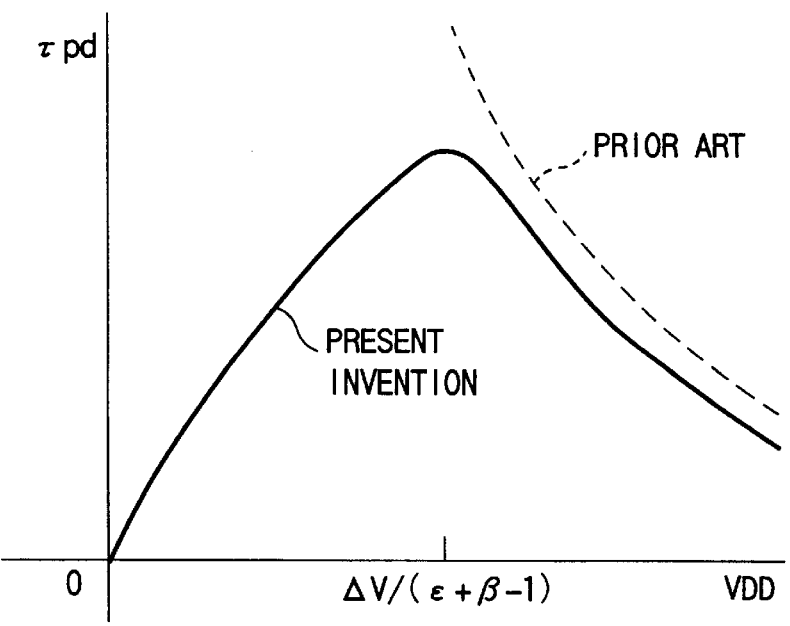
FIG. 6 is a view for explaining an effect by change in a substrate bias for inverter-delay in the first embodiment.

FIG. 6 shows $\tau_{pd}$-dependency on $V_{DD}$ in the prior case in which the substrate bias is not changed, that is, V is 0V and the case in which $\Delta V$ is a finite positive constant. In the prior case, $\tau_{pd}$ increases dependently on $V_{DD}^{(1-e)}$ as $V_{DD}$ decreases. In the case in which $\Delta V$ is a finite positive constant, however, the inventors have firstly found that within the following range $\tau_{pd}$ decreases as $V_{DD}$ decreases even if the load capacitance $C_L$ is constant.

$$V_{DD}<\Delta V/[(e-1)(1-\beta)] \qquad (4)$$

Where, the threshold voltage during standby state is represent by $V_{ths}$, the threshold voltage during active state is represented by $V_{tha}$, and e is 2 in the inequality (4), the following is satisfied.

$$V_{DD}(1-V_{ths}/V_{DD})<V_{ths}-V_{tha} \qquad (5)$$

Similarly, the above-mentioned findings are also approved in the p-type MISFET shown in FIG. 4B, in considering delay time $\tau_{pd}$ of an output in the case wherein an input 6 is changed from $V_{DD}$ to 0V. FIG. 4B shows an example of forming a terminal, as shown in FIG. 4A, at which the substrate bias is changed between an active state and an standby state, not on the n-type MISFET but on the p-type MISFET. The power supply for this example is used to change the threshold voltage of the transistor by a substrate bias effect, and can output at least two-level voltages. It is assumed that the threshold voltage $V_{ths}$ of the p-type MISFET during standby state is $V_1$, and the threshold voltage $V_{tha}$ during active state is $V_1-\Delta V$.

Figure 7A:
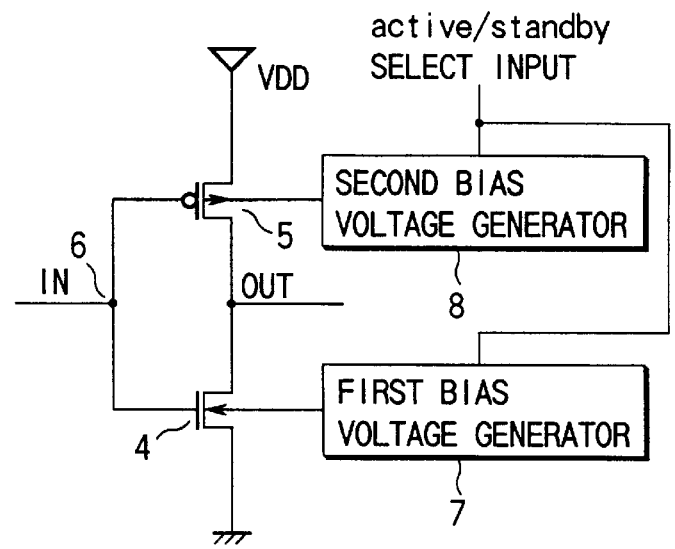
FIGS. 7A to 7C are circuits structure example of an inverter concerned with the first embodiment.
Figure 7B:
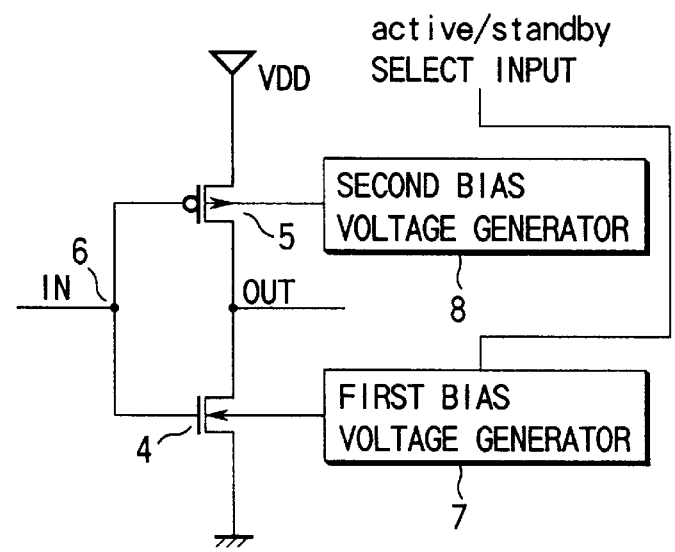
Figure 7C:
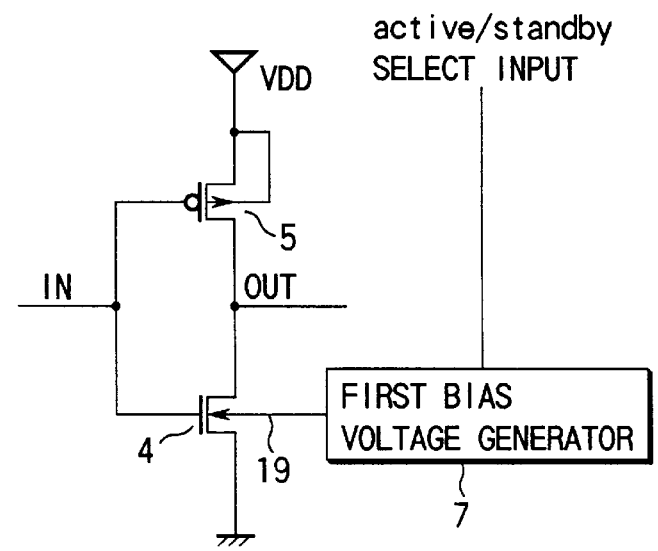

For reducing $\tau_{pd}$, desired is a circuit in which $\Delta V$ does not depend on the power supply voltage and is obtained as a constant value. Therefore, in a desired circuit structure for changing the substrate voltage, an n-type MISFET 4 and a p-type MISFET 5 are connected to the first and second substrate bias voltage generators 7 and 8, respectively, and each of the generators 7 and 8 has a selecting input for selecting an active or standby state, as shown in FIG. 7A. As show in FIG. 7B, a selecting input for selecting an active/standby state may be connected to only a substrate bias generator 7. As shown in FIG. 7C, a substrate bias generating circuit 7 may be disposed to an n-type MISFET 4, and a selecting input for selecting active or standby state may be disposed to this substrate bias generating circuit 7.

Figure 8A:
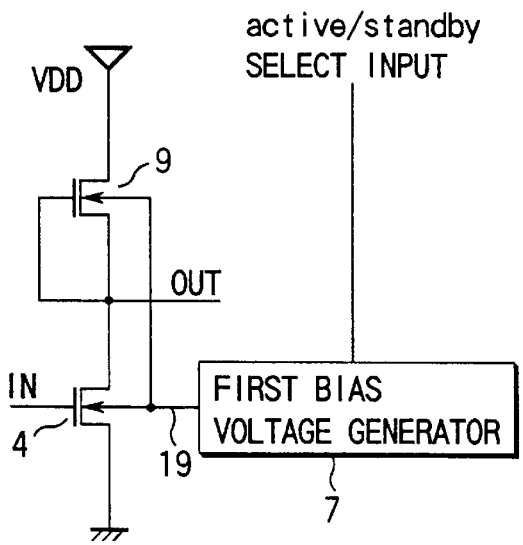
FIGS. 8A and 8B are circuits structure example of an inverter concerned with the first embodiment.
Figure 8B:
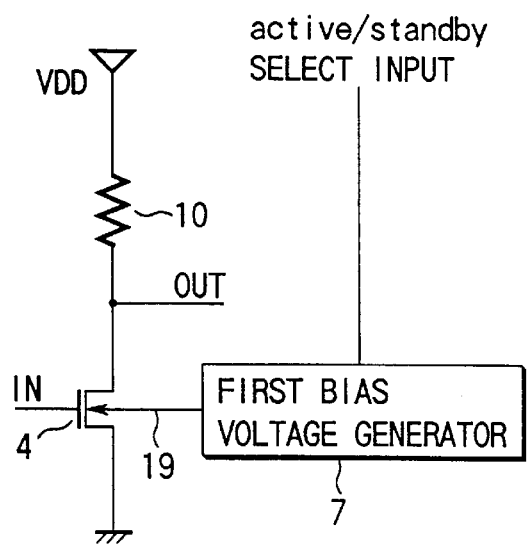

In the above embodiment, circuits for a CMOS inverter are described. However, the equation (3) is satisfied in the so-called nMOS circuits. Thus, it may be acceptable to use an nMOS inverter using a depletion type of a MOS load 9 as shown in FIG. 8A, or an inverter using a resistor load 10 as shown in FIG. 8B. In FIGS. 7A to 7C, it is acceptable not to control the substrate bias of the n-type MISFET, but to control the substrate bias of p-type MISFET in the same manner as in FIG. 4B.

Figure 9A:
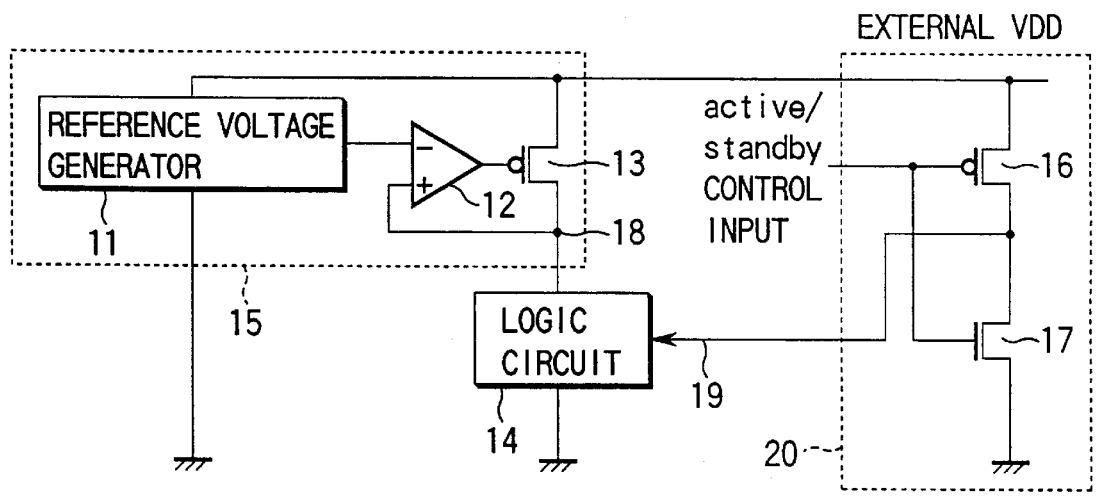
FIGS. 9A and 9B are a block diagram of a circuit for controlling a substrate bias in the first embodiment, and a structure example of a logic circuit therein.
Figure 9B:
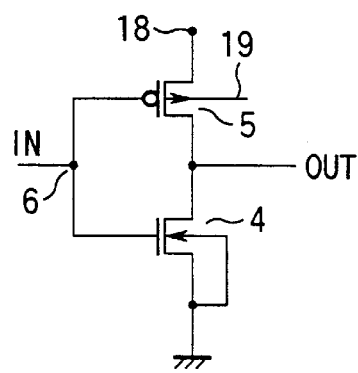

In order to reduce $\tau_{pd}$, a step-down circuit 15 may be disposed, thereby reducing a voltage for applying a logic circuit 14, as shown in FIGS. 9A and 9B. FIG. 9A illustrates a structure of the step-down circuit and a controlling circuit. FIG. 9B illustrates a circuit diagram of a logic circuit portion. FIGS. 9A and 9B illustrate a reference voltage generator 11, a comparator 12 for comparing a voltage output with the reference voltage, a transistor 13 for amplifying an output generated by the comparator 12, and an internal power supply voltage node 18. An output terminal of the reference voltage generator 11 is connected to an input terminal of the compactor 12. These are functioned as a step-down circuit in the block 15 represented by a dotted line, and the internal power supply voltage node 18 is connected to the logic circuit 14. The figure shows a p-type MISFET as the transistor 13 for amplifying the comparator output. In stead of the p-type MISFET, a pnp bipolar transistor may be used instead of it, and an emitter, a base and a collector are connected to an external $V_{DD}$ terminal, the output of the comparator 12, and the internal power supply node 18, respectively.

In FIGS. 9A and 9B, a source terminal of a p-type MISFET 16 and a source terminal of an n-type MISFET 17 are also connected to a point between an external power supply $V_{DD}$ and a ground terminal, respectively, so as to form an inverter. To this inverter an active/standby controlling signal is inputted, and an output of the inverter is connected to a node 19 for applying a substrate bias to the logic circuit 14. The node 19 can be changed from the external voltage $V_{DD}$ to 0V.

The internal power supply voltage, which is supplied to the logic circuit 14 is higher than 0V and lower than the external voltage $V_{DD}$. As a result, this structure permits a substrate bias voltage to be changed from a voltage higher than the internal power supply voltage to 0V to form a controlling circuit 20 for applying a substrate bias with a range wider than the internal power supply voltage. This makes it possible to make differential $\Delta V$ in the threshold larger than the case of applying a substrate voltage bias within the range between the internal power supply voltage and 0V.

The inventors have found that an electric power to be consumed can be reduced for charging and discharging a load capacitor of an inverter in the case of using such a step-down voltage circuit as shown in FIG. 9A than the case of using no step-down circuit. This will be explained, referring to FIGS. 10A and 10B.

Figure 10A:
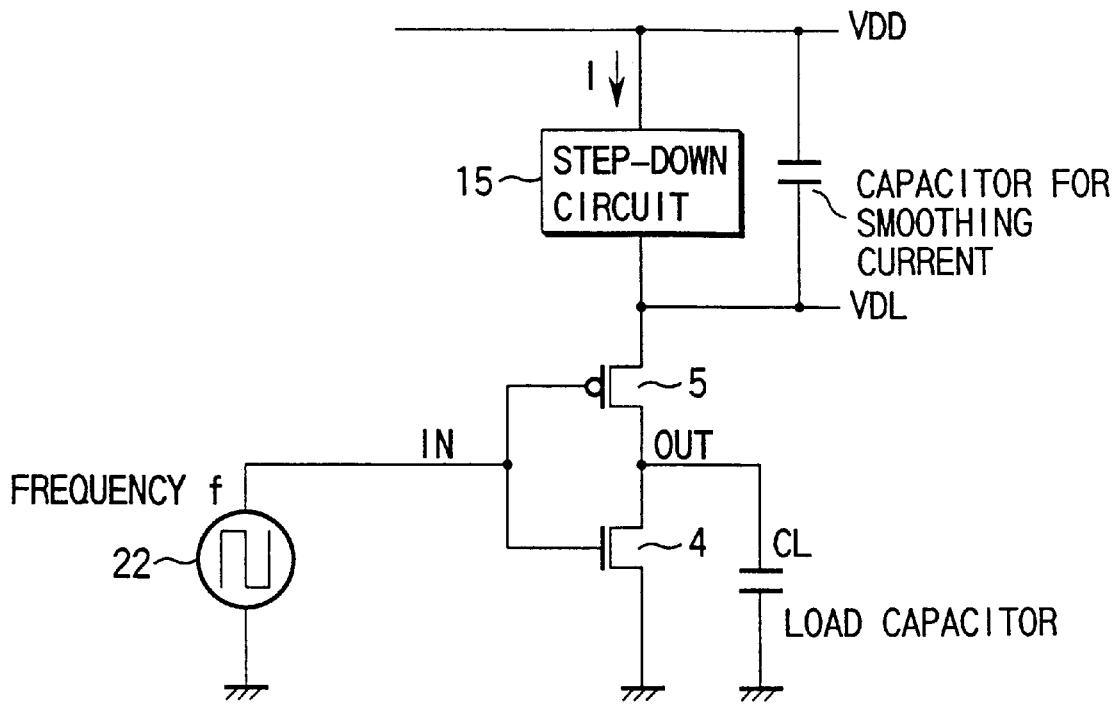
FIGS. 10A and 10B are views for explaining achievement of reduction in consumed electric power by using a step-down circuit in the first embodiment.
Figure 10B:
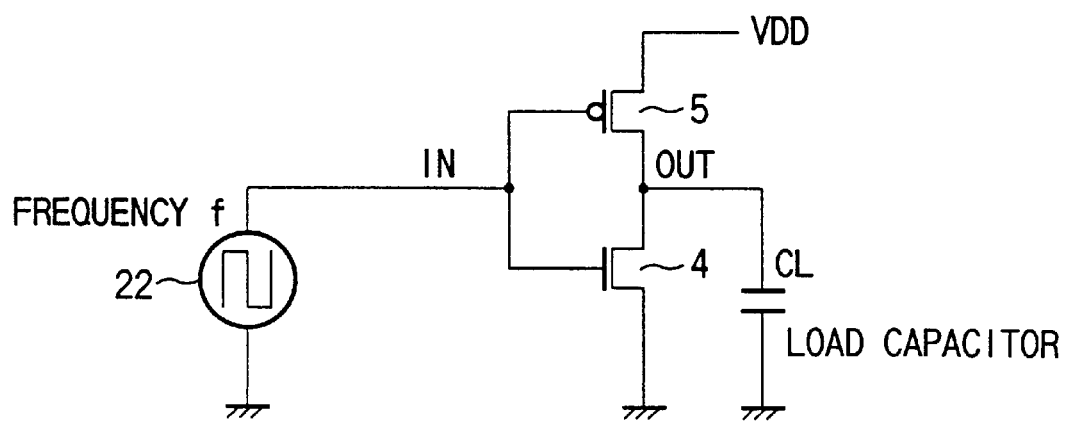

In FIGS. 10A and 10B, a p-type MISFET 5 and an n-type MISFET 4 are connected to each other to form an inverter. Its input is connected to a rectangular wave oscillator 22 generating a wave having a frequency f. It is assumed that in FIG. 10A the voltages at the oscillator 22 are two values, i.e., 0V and $V_{DL}$ and in FIG. 10B they are two values, i.e., 0V and $V_{DD}$, and that in FIG. 10A one of pMOSFETs is connected to an output (OUT) of a step-down circuit 15 and exhibits $V_{DL}$ lower than $V_{DD}$. The step-down circuit 15 is connected in parallel to a capacitor for smoothing electric current. It is also assumed that the step-down circuit 15 can respond with a time constant which is sufficiently longer than the gate delay of the above-mentioned inverter, and a substantial constant direct current can be supplied through the step-down circuit 15.

At that time, the electric power consumed by charging and discharging the load capacitance $C_L$ of the inverter shown in FIG. 10A is $fC_L V_{DL}^2$. Furthermore, the charge passing through the inverter is $fC_L V_{DL}$ per unit time. Thus, this becomes equal to the current passing through the step-down circuit, and the electric power consumed by the step-down circuit is $fC_L V_{DL}(V_{DD}-V_{DL})$. As a result, the value of all the electric power consumed by charging and discharging the load capacitor in the circuit shown in FIG. 10A is the sum of the above-mentioned values, i.e., $fC_L V_{DL} V_{DD}$. On the contrary, in the case of the circuit shown in FIG. 10B using no step-down circuit, the total electric power consumed by charging and discharging the load capacitor therein is $fC_L V_{DD}^2$. Since, in general, $V_{DL}$ is lower than $V_{DD}$, the electric power consumed by charging and discharging the load capacitance Can be smaller in the case of using the down-step circuit than in the case of using no down-step circuit.

In the prior art, mere reduction of the external power supply voltage $V_{DD}$ causes a problem that $\tau_{pd}$ increases. However, in the case of using the requirements of the present invention, that is, using the circuit structure in the present embodiment shown in FIG. 10A under the condition of $V_{DL} < \Delta V/[(e-1)(1-\beta)]$, it is possible to reduce $\tau_{pd}$ and the total electric power consumed by charging and discharging the load capacitor even if the external power supply voltage $V_{DD}$ is constant. This structure causes the electric current I flowing through the wire to be reduced, and consequently it is possible to lighten problems about electro-migration of the wire and reliability.

In the structure shown in FIG. 9A, the voltage at the substrate bias terminal 19 is generated without boost by any external voltage. This structure is simpler than the structure in which a booster circuit, for which an oscillator and a charge pump are necessary, is formed, and makes use of a power supply line with a low impedance possible. As a result, it can change its substrate voltage at a high speed and at a low electric power consumption.

The structure of the logic circuit 14 includes, e.g., a structure in which a substrate terminal of a p-type MISFET 5 of an inverter is connected to a substrate bias changing terminal 19, as shown in FIG. 9B, instead of the structures as shown in FIGS. 7A to 7C. Combination of the structures shown in FIGS. 9A and 9B makes it possible to change a substrate bias from a voltage for biasing a pn-junction, formed by the source and the drain of a p-type MISFET 5 and a substrate, in the forward direction to a voltage for biasing in the reverse direction.

Figure 11A:
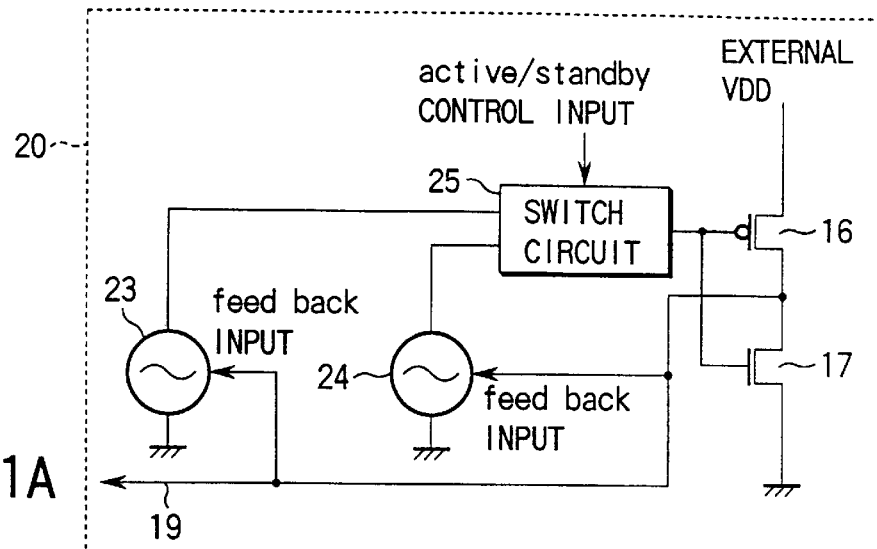
FIGS. 11A and 11B are views of a structure example of a circuit block for controlling a substrate bias in the first embodiment.
Figure 11B:
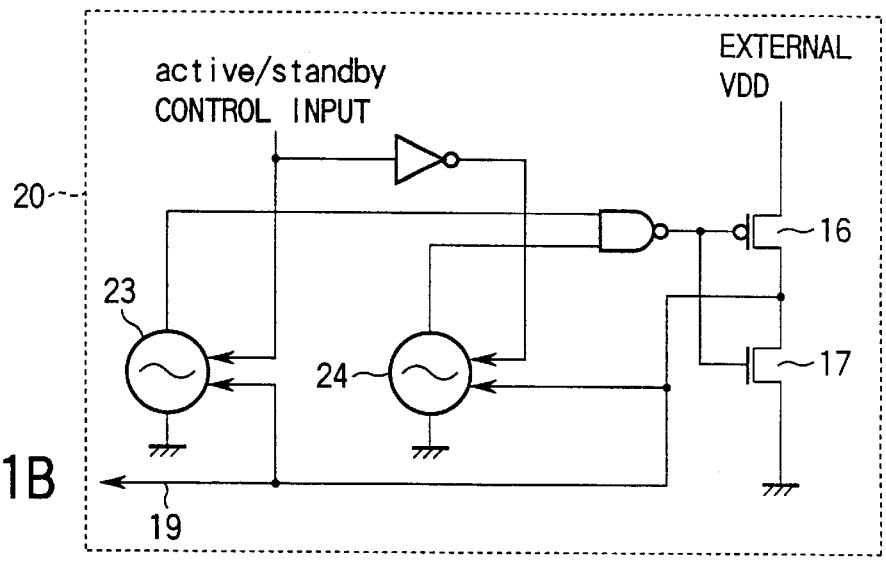

A substrate bias control circuit may be a substrate bias control circuit 20 as shown in FIGS. 11A and 11B. In an example shown FIG. 11A, oscillators 23 and 24 having different oscillating frequencies or duty ratios can be switched by an active/standby control input, and be connected to inputs of transistors 16 and 17 for applying a substrate bias voltage. Thus, a middle voltage between the external voltage $V_{DD}$ and 0V can be given as a substrate bias voltage. Use of the substrate bias voltage output 19 for feedback inputs for the oscillators makes it possible to supply a stable voltage.

In the embodiment shown in FIG. 11B, either one of the oscillators 23 and 24 is selectively operated by an active/ standby control input to switch a substrate bias voltage to an output suitable for an active or standby state. In this case, one of the oscillators 23 and 24 can be stopped, and consequently an electric power to be consumed can be reduced.

Figure 12:
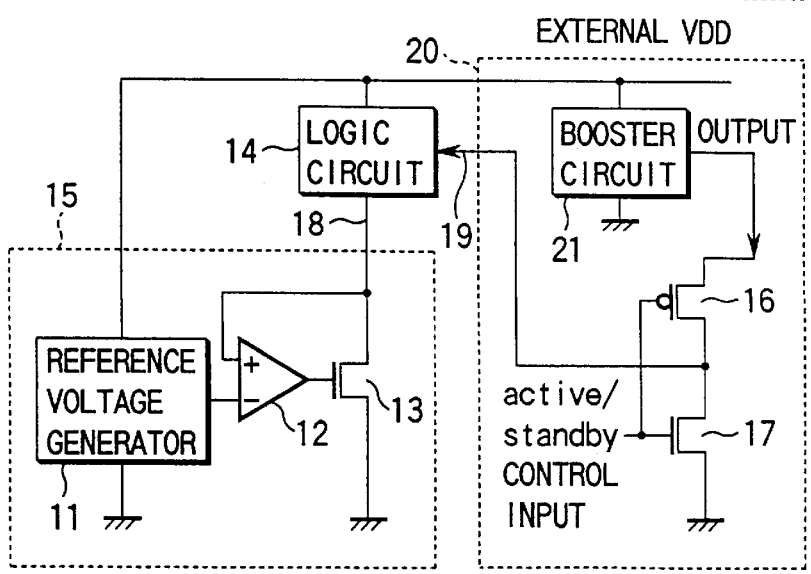
FIG. 12 is a view of a structure example of a circuit block for controlling a substrate bias in the first embodiment.

FIG. 9A showed an example in which a step-down circuit is put within the $V_{DD}$ side thereof. Reversibly, the step-down circuit may be put within a ground side, as shown FIG. 12. Such a structure makes it possible to use an n-type transistor, the current drivability of which is higher than a p-type transistor, and realize a circuit in which a response time is shorter and a device size is smaller. FIG. 12 shows an n-type MISFET as a transistor 13 for amplifying a comparator output. In stead of the n-type MISFET, the MISFET may be replaced by an npn bipolar transistor, and an emitter, a base and a collector may be connected to an external ground terminal, an output of a comparator 12 and an internal power supply node 18, respectively.

As shown in FIG. 12, for example, one of source and drain terminals of a p-type MISFET 17, in a substrate bias generator block 20, the one being not connected to a MISFET 16 may be connected to, for example, an output of a booster circuit 21. That the booster circuit 21 generates the substrate bias voltage during a standby state is more preferable that the booster circuit 21 generates the substrate bias voltage during an active state. This is because in the former the electric current drivability of the booster circuit and a circuit of the booster circuit may be small.

According to these structures, it is possible to apply a substrate bias over the range of power supply voltages of a logic circuit 14, and keep a larger ΔV. Also, a standby state can be changed into an active state at a high speed.

Figure 13A:
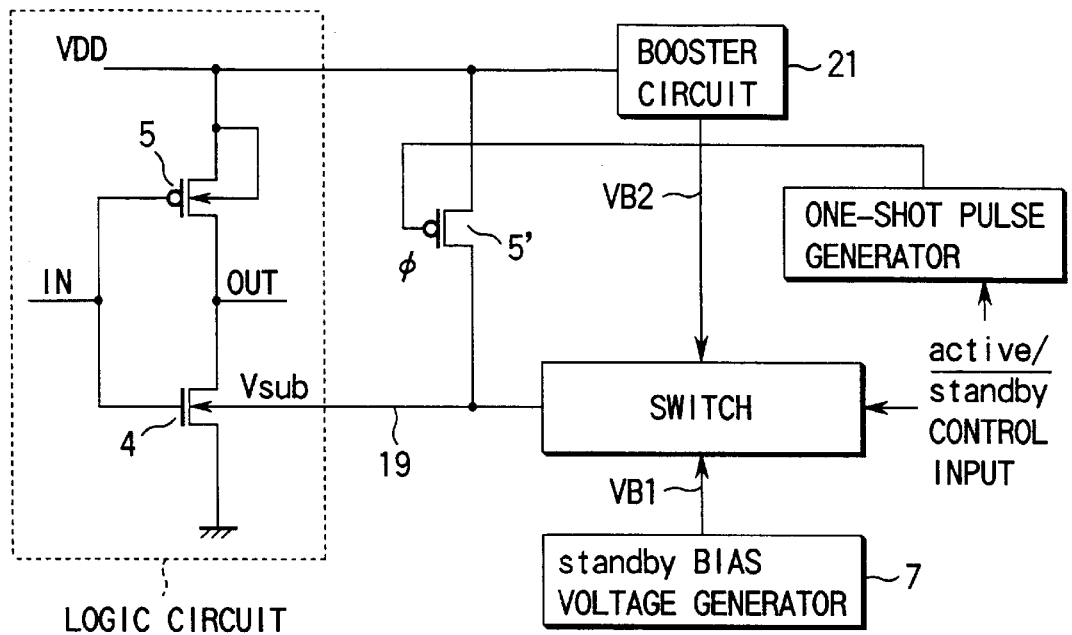
FIGS. 13A and 13B are views of a structure example of a circuit for changing a substrate bias in the first embodiment and a timing chart thereof.

When the external voltage $V_{DD}$ is low, in order to obtain a large ΔV, a voltage $V_{B2}$ higher than $V_{DD}$ may be generated by a booster circuit 21 and be applied as a well voltage for an n-type MISFET 4 of a logic circuit, as shown in FIG. 13A. In the example shown in FIG. 13A, an input for the booster circuit 21 is $V_{DD}$, and under this condition the circuit 21 generates a boosted voltage $V_{B2}$. The booster circuit 21 and another substrate bias generator 7, in which the output voltage is $V_{B1}$ are connected to a well terminal 19 of the n-type MISFET 4 through a switch. This switch causes the well voltage of the n-type MISFET 4 to be switched into $V_{B2}$ and $V_{B1}$ by active/standby control inputs, respectively.

A switch for switching a standby voltage and an active voltage over the range of a power supply voltage will be described in detail later, referring to FIG. 17.

The characteristic in examples corresponding to FIGS. 13 to 16 is that a switching element is formed not between an output of a booster circuit and a substrate terminal 19, but is formed between a power supply $V_{DD}$ and the substrate terminal 19. Such formation of the element makes it possible to charge a p-type well 4 by the power supply line $V_{DD}$ having an impedance lower than a booster circuit having a low electric current supplying ability and a high output impedance, and realize higher-speed switching from a standby state to an active state. Since the electric current drivability of the booster circuit may be small, a capacitor having a smaller region can constitute the booster circuit to enlarge an integrated-scale and reduce an electric power to be consumed, in the boosting method on the basis of a charge pump circuit using a capacitor.

When a MISFET is formed as an output of the booster circuit, a cut-off condition must be kept even if one of source/drain electrode voltages is $V_{B2}$ and the other is $V_{sub}$. In the structure shown in FIG. 13A, one of the source/drains electrodes can be lowered from $V_{B2}$ to $V_{DD}$. This would make it possible to improve reliability of the gate insulation film of the transistor 5', and reduce the change degree of the threshold voltage by punch through between the source and the drain of the transistor 5', and by a substrate bias effect.

Figure 13B:
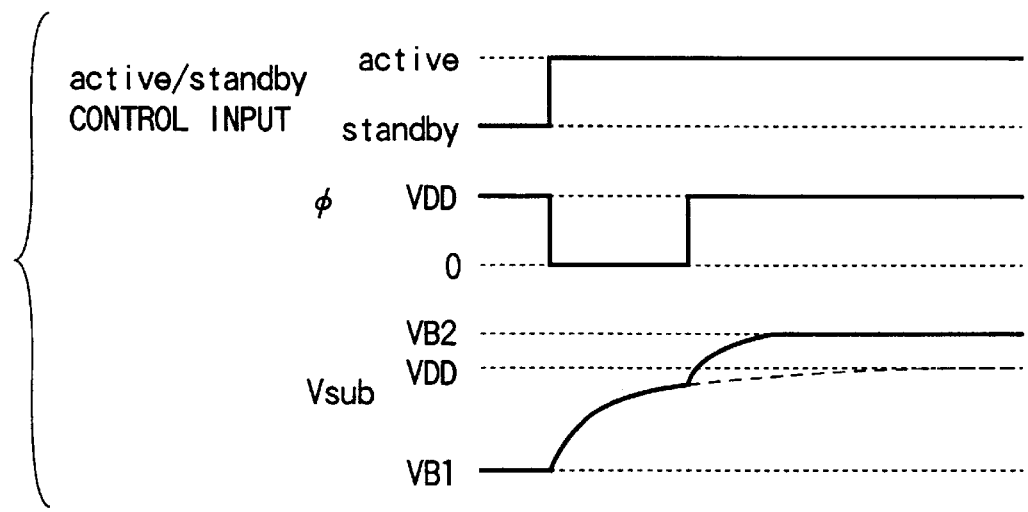

In the example shown in FIG. 13A, a transistor 5' (a switching element) is formed to the $V_{DD}$ line and a well terminal 19 of an n-type MISFET 4, and a gate electrode thereof is connected to a circuit for generating one-shot pulse in response to an active/standby control input. Thus, it is possible to shorten time when a standby state is transited to an active state, and suppress the transit time variation against variation of a power supply voltage. The one-shot pulse is generated by change from standby state to active state, as shown in FIG. 13B. Pulse width is determined so that the voltage at the well terminal 19 is within the range from $V_{B1}$ to $V_{DD}$. Since the impedance of the power supply $V_{DD}$ line is in general smaller than the output impedance of the booster circuit in which an electric power to be consumed is made small, it is possible to charge from $V_{B1}$ to a level of $V_{DD}$ at a higher speed.

For simplification, FIG. 13A shows an inverter as a representative of logic circuits. The logic circuit may be a logic circuit such as a NAND, a NOR, or a pass gate circuit. Alternatively, plural logic circuits may be used in which their conductivity types are the same. A one-shot pulse generator is known in, for example Jpn. Pat. Appln. KOKAI Publication No. 8-204140. Thus, herein explanation thereof is omitted.

A modification of an example using the booster circuit 21 is a circuit illustrated in 14A. FIG. 14B shows a timing chart thereof. In the modification, an operation of a pulse generator is controlled by the voltage $V_{sub}$ of a node 19. The threshold voltage of a p-type MISFET is represented by $V_{thp}$. Change of a pulse of the pulse generator from $V_{DD}$ to 0V is caused by change from standby state to active state. Change of the pulse from 0V to $V_{DD}$ is caused when $V_{sub}$ becomes a certain threshold voltage ($V_{DD}-V_{thp}$) or higher. Such a structure makes it possible to keep the substrate voltage $V_{sub}$ at which the state of a transistor 5' changes from ON to OFF the value ($V_{DD}-V_{thp}$). Thus, even if the power supply voltage $V_{DD}$ changes, the voltage $V_{sub}$ has always a voltage margin by $V_{thp}$. As a result, it is possible to prevent a leakage current flowing from a booster circuit 21 to the power supply wire through a substrate terminal 19, thereby lowering the power consumption.

Figure 14A:
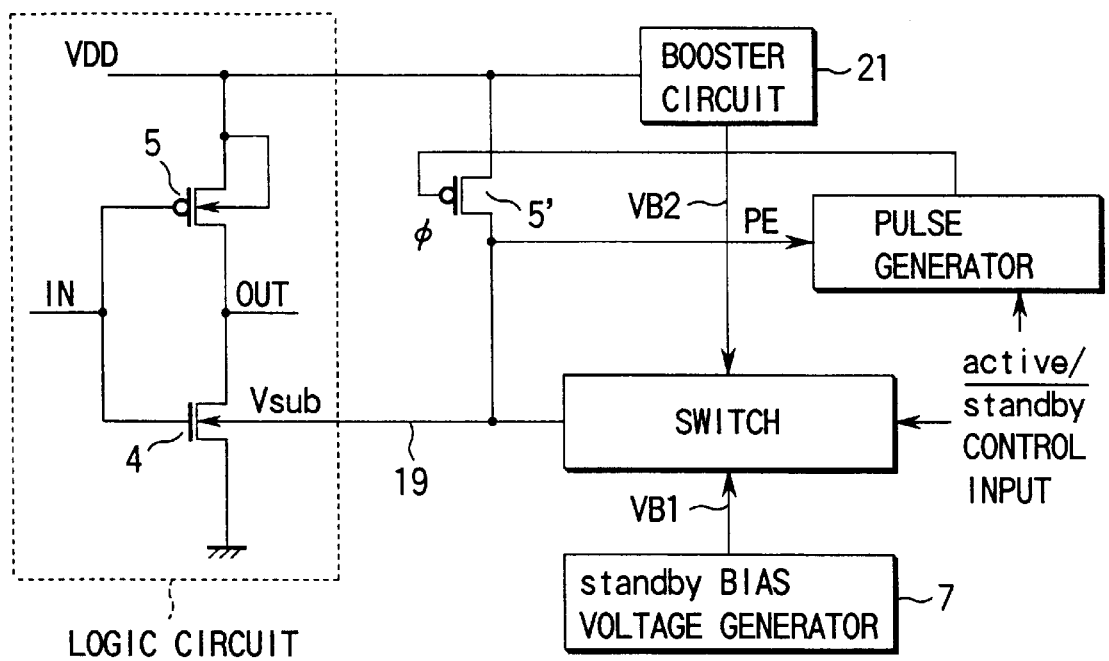
FIGS. 14A and 14B are views of a structure example of a circuit for changing a substrate bias in the first embodiment and a timing chart thereof.
Figure 14B:
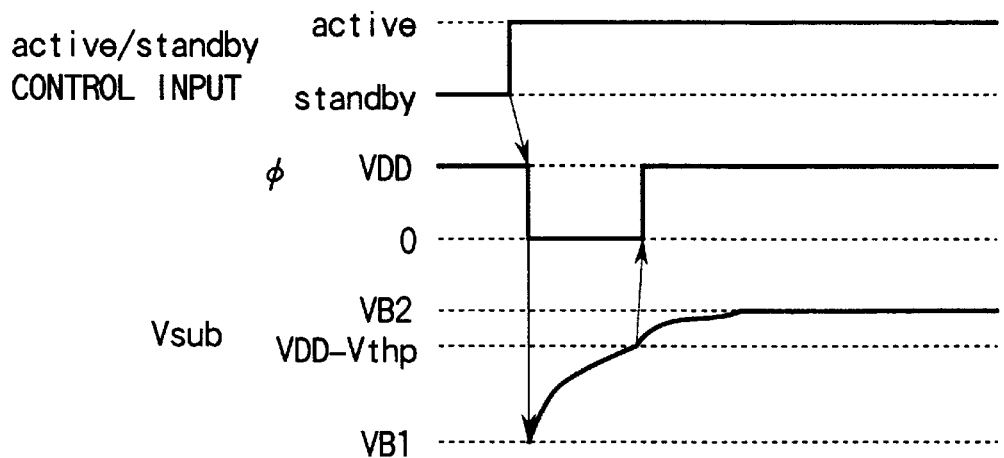
Figure 15A:
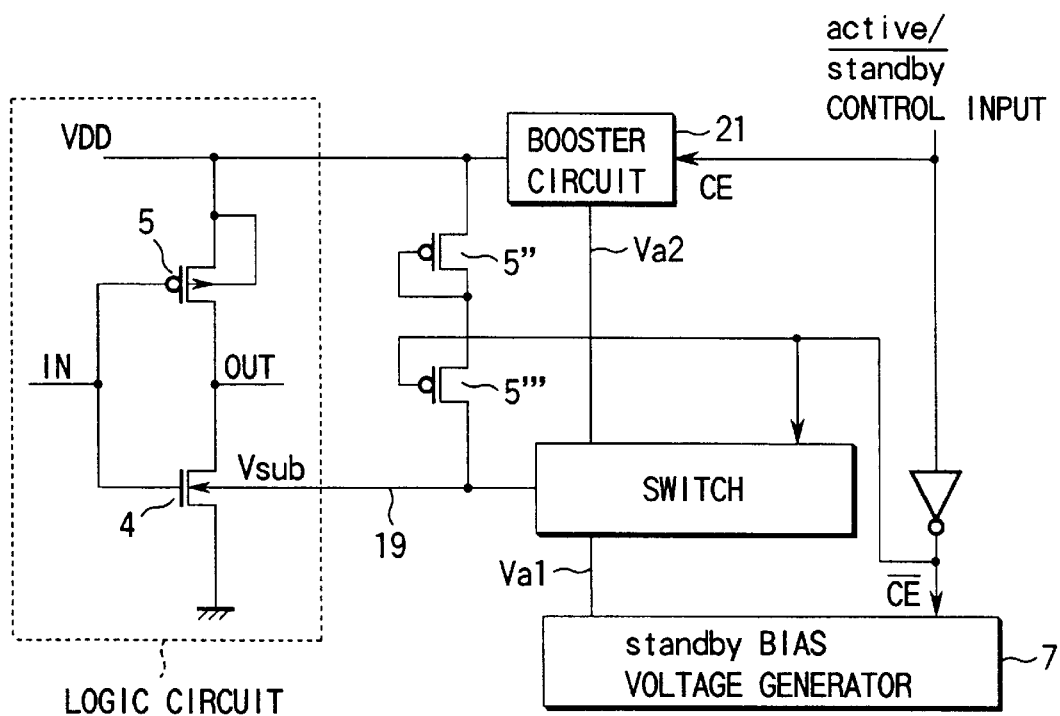
FIGS. 15A and 15B are views of a structure example of a circuit for changing a substrate bias in the first embodiment and a timing chart thereof.
Figure 15B:
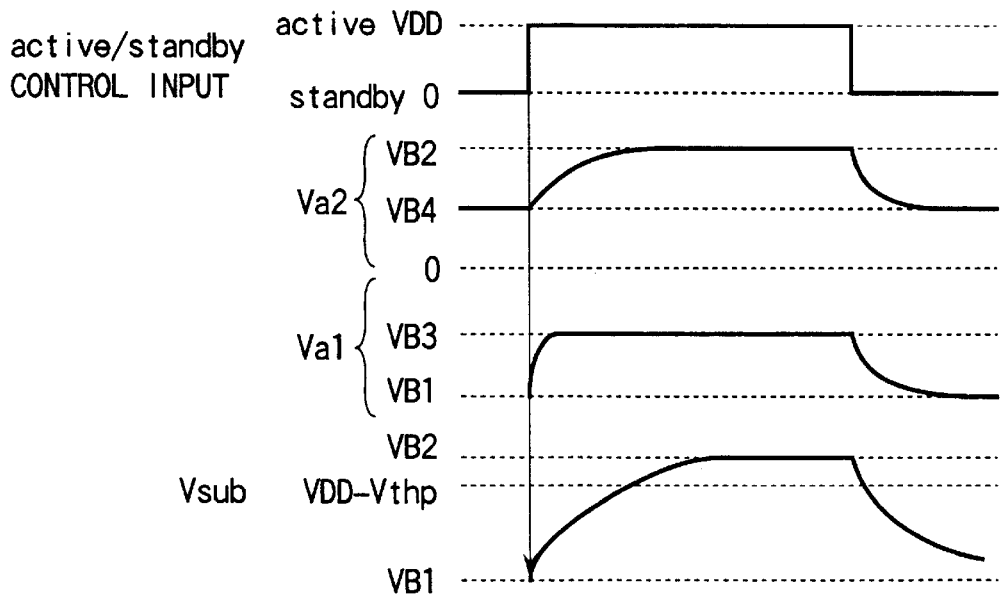

FIG. 15A illustrates a modification of the circuit shown in FIG. 14A. In FIG. 15A, one of source and drain electrodes of a p-type MISFET 5" is connected to a $V_{DD}$ line, the other of them is connected to a gate electrode. Thus, a rectifying diode with a threshold of $V_{thp}$ is formed. FIG. 15B shows a timing chart thereof. This diode 5" is connected in series to a transistor switch 5''', and further connected to a well terminal 19. According to this structure, both of the transistors 5" and 5''' become conductive when the voltage at the $V_{sub}$ terminal is ($V_{DD}-V_{thp}$) or less during active state. Thus, this structure makes it possible to carry out charge at a high speed when a standby state is transited to an active state, in the same manner as in shown FIG. 14A.

Figure 16:
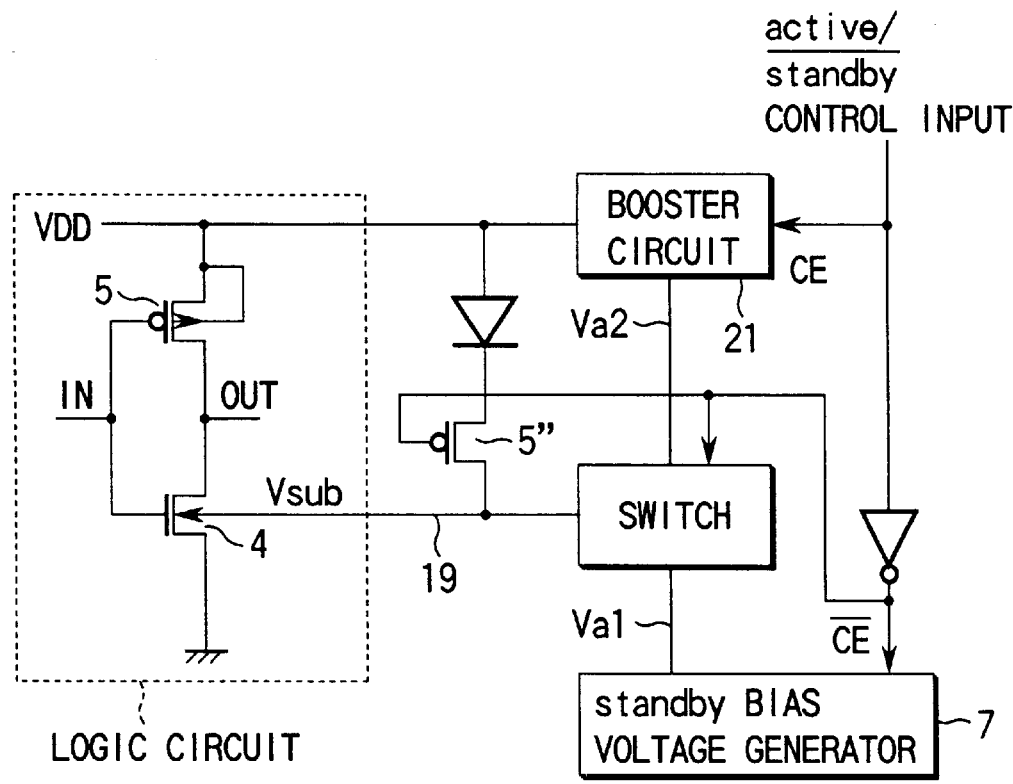
FIG. 16 is a view of a structure example of a circuit for changing a substrate bias in the first embodiment.

Of course, the MOS diode 5" in FIG. 15A may be replaced by a pn-junction diode or a Schottky barrier diode, as shown FIG. 16. A MOS diode having an n-type MISFET may be used instead of the p-type MISFET.

In the example shown in FIG. 15A, an active/standby control input is inputted into a booster circuit 21 and a substrate bias circuit 7. The inventors have found a new structure about a method of controlling a switch for switching them and a power supply. The active/standby control input is set so as to improve electric current supplying ability of the booster circuit 21 at an active state, and reduce the ability thereof or stop the boost at a standby state. The output voltage from it is represented by $V_{a2}$. On the other hand, the active/standby control input is set so as to improve electric current applying power of the standby substrate bias circuit 7 at a standby state, and reduce the ability thereof or stop generation of any bias voltage at an active state. The output voltage from it is represented by $V_{a1}$. By controlling the output voltages from both the circuits 21 and 7 in such a manner as above, it is possible to reduce the voltage applied to the switch, between $V_{sub}$ and $V_{a1}$ and between $V_{sub}$ and $V_{a2}$, to a lower value than the case in which the both the circuits 21 and 7 are always operated.

In the prior art, for example, in which both bias circuits are operated without any change in electric current drivability, during active state the voltage $V_{B2}$ is applied to the $V_{sub}$ and the $V_{a2}$, the voltage $V_{B1}$ is applied to the $V_{a1}$, and the $V_{a1}$ must be cut-off by a switch for switching an electric current. Thus, in a switch using a path gate circuit having an n-type MISFET, as shown in FIG. 17, it is necessary to satisfy the relationship of $V_{GA}-V_{thn}<V_{B1}$, wherein $V_{GA}$ represents the gate voltage of the n-type MISFET during active state, and $V_{thn}$ represents the threshold voltage of the transistor. If it is assumed that the voltage $V_{GA}$ is from 0V to $V_{DD}$, commonly to the logic circuit for applying a substrate bias is applied, the voltage $V_{B1}$ is limited within the range satisfying the relationship $V_{B1}>-V_{thn}$. To remove this limitation, it is necessary to apply a voltage being lower than 0V to the voltage $V_{GA}$.

However, in using the circuit illustrated in FIG. 15A and stopping generation of a bias voltage in the standby substrate bias circuit 7, the voltage $V_{a1}$ approaches 0V rather than $V_{B1}$ (the approached voltage is referred to as $V_{B3}$) as shown in FIG. 15B, and consequently the cut-off ability by the switch for switching a current may be low. On the contrary, in the case of stopping generation of a bias voltage in the booster circuit 21 during standby state, the $V_{a2}$ approaches 0V rather than $V_{B2}$ (the approached voltage is referred to as $V_{B4}$), as shown in FIG. 15B, and consequently the difference between $V_{B1}$ and $V_{a2}$ becomes small. Thus, the cut-off ability by the switch for switching a current may be lower than the case in which both the circuits are operated.

Figure 17:
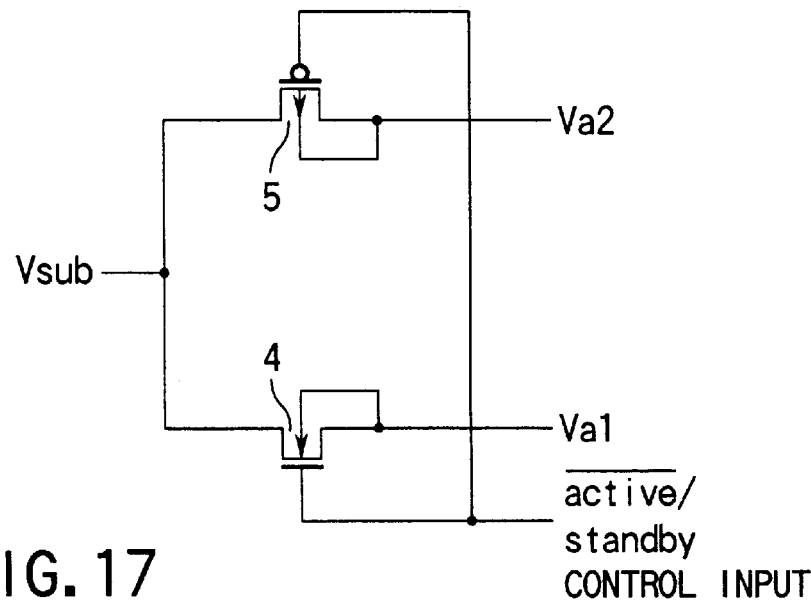
FIG. 17 is a view of a structure example of a circuit for a switch in the first embodiment.

Therefore, switching can be carried out by, e.g., a simple switching circuit as shown FIG. 17, without application of an negative voltage or boost of the gate voltage of the switching MISFET. In this case, it would be required to set the logic voltage amplitude of active/standby control inputs inputted into the gate of the switch to 0V and the voltage $V_{DD}$, set the threshold voltage $V_{ths}$ of the p-type MISFET 5 so as to satisfy the relationship "$V_{B4}-V_{DD}<V_{thp}<V_{B2}$", and set the threshold voltage $V_{thn}$ of the n-type MISFET 4 so as to satisfy the relationship "$-V_{B3}<V_{thn}<V_{DD}-V_{B1}$".

Such setting-up as above makes it possible to use a transistor, in which a switching signal input has a range between 0V and $V_{DD}$, as a switching transistor by the same threshold voltage as a MISFET of the logic circuit, and make a boosting power supply for the switching input, application of a negative voltage and a voltage converter unnecessary to ensure reliability of an gate insulation film.

In the example shown in FIG. 17, a p-type MISFET is used for a switch for applying a forward bias to an n-type well and an n-type MISFET is used for a switch for applying a backward bias to it. Complementarily, an n-type MISFET is used for a switch for applying a forward bias to a p-type well, and a p-type MISFET is used for a switch for applying a backward bias to it.

In a MOSFET comprising a typical well having a constant dopant concentration, $\Delta V$ is represented by the following:

$$\Delta V = (2\epsilon_s q N_A)^{0.5}(t_i/\epsilon_i)\{(2\phi_F-V_{BSS}-(2\phi_F-V_{BSS})^{0.5})-(2\phi_F-V_{BSa})^{0.5}\} (6)$$

wherein $N_A$ represents the substrate dopant concentration, $\epsilon_s$ represents the dielectric constant of a semiconductor, $V_{BSS}$ and $V_{BSa}$ represent the substrate voltage during standby state and during active state, respectively, measured on the basis of the source electrode $V_{BSa}$ and q represents an elementary electric charge.

In a silicon MOSFET having a substrate dopant concentration of $1\times10^{18}$ cm$^{-3}$ and $t_i$ of 6 nm, $\Delta V$ is about 0.43V in the case of $V_{BBS}=-1V$ and $V_{BSa}=0V$. If it is assumed that an n-type MOSFET satisfies the relationship "$\beta=0.8$, i.e., $V_1=0.8V_{DD}$", $\tau_{pd}$ decreases as the voltage $V_{DD}$ decreases within the range of "$V_{DD}<V/\{(e-1)(1-\beta)\}\leq 2.15V$" because of the requirement "$e\leq 2$". When the case of $V_{DD}$ being 0.4V is compared with the case of $V_{DD}$ being 0.5V under a condition of satisfying the equations "$\Delta V=0.2$ [V] and $V_1=0.8V_{DD}$ and $e=2$", $\gamma C_L V_{DD}/\{(1-\beta)V_{DD}+\Delta V\}^e$ is smaller in the case of $V_{DD}$ being 0.4V than in the case of $V_{DD}$ being 0.5V. In the former case, even an enhancement type MISFET, not depletion type MISFET, can have a region in which high-speed switching can be realized by reducing its power supply.

Since the substrate bias constant $(2\epsilon_s q N_A)^{0.5}(t_i/\epsilon_i)$ of a usual MOSFET is from 0.1 to 1 [$V^{0.5}$], the change amount of a substrate bias voltage is larger than the power supply voltage $V_{DD}$. Thus, for the above-mentioned bias voltage generator, a booster circuit or a circuit in which a voltage may step down from an external voltage, as shown in FIGS. 9A and 12 is desired. In general, within the range of $V_{DD}<\Delta V/(1-\beta)$ the requirement of the present embodiment is satisfied because of $e\leq 2$. Thus, as the voltage $V_{DD}$ decrease, $\tau_{pd}$ also decreases.

It is desired for preventing tunnel leak between source/drain electrodes and a substrate electrode in a silicone MOSFET that its substrate dopant concentration is $1\times10^{19}$ cm$^{-3}$ or less. When a substrate bias is changed from 0.6 to $-3V$ under this condition, $\Delta V$ can be also changed from 0V to about 6V in the case of $t_i=6$ nm. Thus, The power supply voltage satisfying the requirement of the present embodiment, i.e., $V_{DD}<\Delta V/(1-\beta)$ can be realized easily at 6V or less.

In the present embodiment, a short channel region in which velocity saturation is caused exhibits an effect that $\tau_{pd}$ is reduced at a higher $V_{DD}$ than a region in which no velocity saturation is caused. This is because the value e approaches 1 from 2 in the short channel region and consequently the upper limit $\Delta V/\{(e-1)(1-\beta)\}$ rises.

Embodiment 2

The present embodiment relates to a circuit structure of reducing a gate delay time $\tau_{pd}$ of a CMOS logic circuit when an input signal has a gradient. To reduce $\tau_{pd}$, it is known that necessary is reducing a logic inverting threshold voltage $V_{inv}$, besides improving electric current drivability of the logic circuit (see Basis of MOS integrated circuit, under the supervision of Yoshiyuki Takeishi and Takashi Hara). This will be described briefly referring to an example of a CMOS inverter, below.

Figure 1:
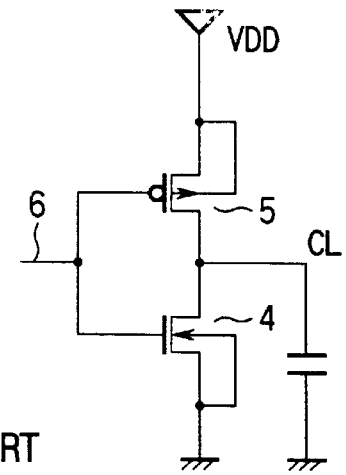
FIG. 1 is a view illustrating a circuit structure of a prior MISFET inverter.
Figure 2:
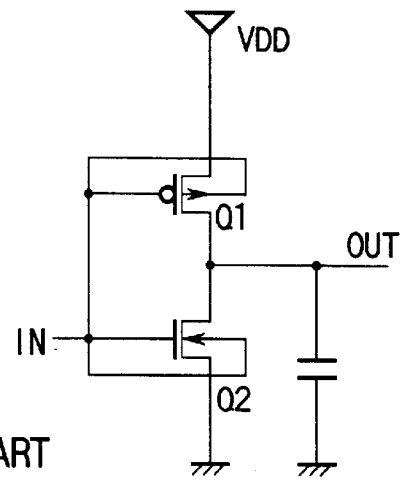
FIG. 2 is a view illustrating a static inverter having a GST transistor.
Figure 18A:
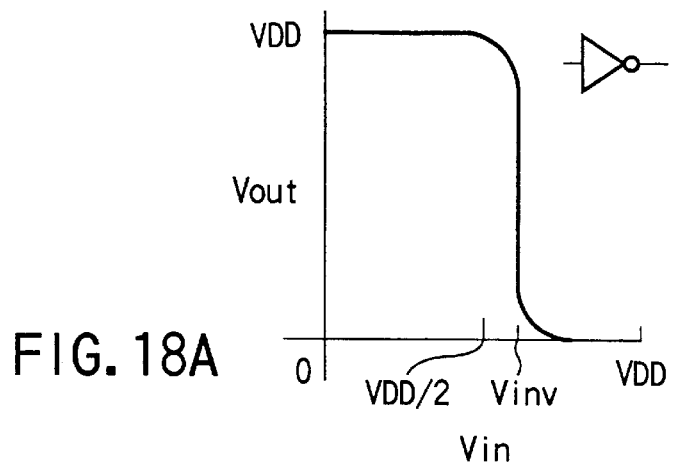
FIGS. 18A and 18B are views for explaining circuit delay in the case in which the input/output property of an inverter and input have constant gradients.

FIG. 18A shows the input and output property of the CMOS inverter shown in FIG. 1. The inverter is illustrated to be inserted in this figure. An input inversion voltage $V_{inv}$ is defined as the voltage that the input voltage becomes equal to the output voltage when the input voltage is the voltage $V_{inv}$. In general, when the n-type MISFET 4 and the p-type MISFET 5 shown in FIG. 2 are different from each other in their electric current drivability and threshold voltages, the voltage $V_{inv}$ is not necessarily the voltage $V_{DD}/2$, as shown in FIG. 18A.

Figure 18B:
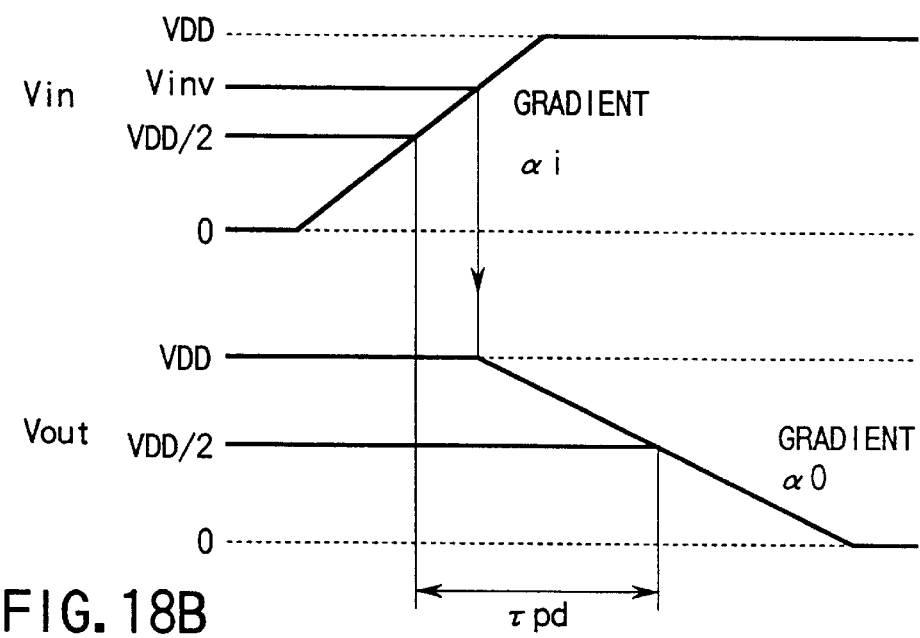

FIG. 18B is a schematic view of an input waveform into the inverter and an output waveform from it. It is assumed that $\alpha_i$ is the gradient of the input waveform, $\alpha_0$ is the gradient of the output waveform, and the input and the output may be changed from 0V to the voltage $V_{DD}$. When the input is the voltage $V_{inv}$ or less, electric current drivability of the n-type MISFET is lower than that of the p-type MISFET. Thus, the output is substantially fixed to the voltage $V_{DD}$, and discharge of a load capacitor is not carried out. When the input is the voltage $V_{inv}$ or more, electric current drivability of the n-type MISFET sharply rises. Thus, discharge of the load capacitor is started. When the inverter delay time $\tau_{pd}$ at that time is defined as a period from a time when the input waveform becomes $V_{DD}/2$ to a time when the output waveform becomes $V_{DD}/2$, $\tau_{pd}$ is represented by the following equation.

$$\tau_{pd} = (2V_{inv} - V_{DD})/2\alpha_i + V_{DD}/2\alpha_0 \tag{7}$$

As is evident from the equation (7), it is possible to make a switching speed higher by dropping $V_{inv}$ to approximate 0V when the input is changed from 0V toward the voltage $V_{DD}$, that is, toward the rising direction. On the contrary, it is possible to make the speed higher by raising $V_{inv}$ to approximate the voltage $V_{DD}$ when the input is changed from the voltage $V_{DD}$ toward 0V, that is, toward the falling direction.

Figure 19A:
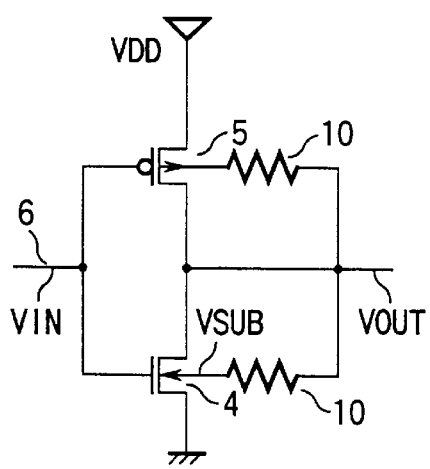
FIGS. 19A and 19B are views of a structure example of a high-speed switching circuit in the second embodiment.

An embodiment for realizing the above-mentioned property may be a circuit show in FIG. 19A. In this circuit shown in FIG. 19A, a gate electrode of an n-type MISFET 4 is connected to a gate of a p-type MISFET 5 to constitute an input electrode 6 of an inverter. One of source and drain electrodes of the n-type MISFET 4 is connected to one of source and drain electrodes of the p-type MISFET 5 to constitute an output of the inverter. The other of the electrodes of the n-type MISFET 4 is connected to be a 0V point, and the other of the electrodes of the p-type MISFET 5 is connected to be a voltage $V_{DD}$ point. This structure constitutes the inverter as a static type.

The characteristic of the structure shown in FIG. 19A is that a well electrode of the n-type MISFET 4 or a well electrode of the p-type MISFET 5 is connected to the output of the inverter through a resistor 10, and an output voltage from it is fed backed to a substrate bias voltage. The product of the resistance R of the resistor 10 and the total capacitance $C_w$ of the respective wells connected to the resistor 10, i.e., $RC_w$ is longer than the inverter delay time in the case of giving a step-input which stands up from 0V to the voltage $V_{DD}$ sharply, and the voltage at the well electrode or body electrode is equal to the output voltage from the inverter under the condition that the input is stationary.

In examples shown in FIGS. 19A, 19B, 21A, 22A and 22B according to the present embodiment, the junction between a source/drain junction and a substrate is biased in the forward direction. Thus, in order to a reduce leakage current due to the forward bias, it is desired that the power supply voltage $V_{DD}$ is set to be 0.6 or less V in the case of using Si as a semiconductor. Considering that the gate delay $\tau_{pd}$ in high-speed switching circuits at the present time is typically from about 10 to about 100 ps and that the well capacitance $C_w$ in the next portion is from 1 to 100 fF per $\mu$m of a channel width of the MISFET, the resistance of the resistor 10 is preferably more than 100Ω$\mu$m of the channel width of the MISFET.

Figure 20:
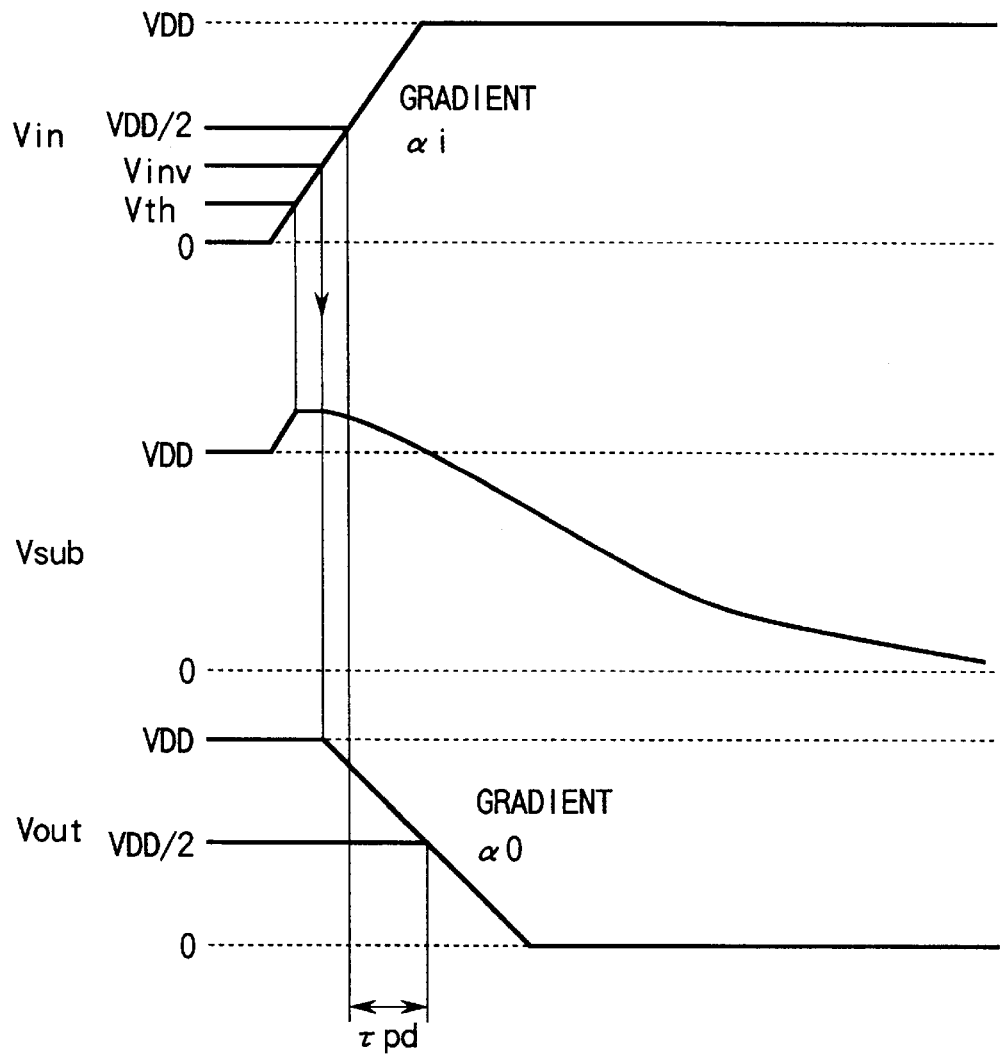
FIG. 20 is a view illustrating a substrate bias and circuit delay in the case in which the input of the inverter shown in FIGS. 19A and 19B has a constant gradient.

The following will describe operation of the present circuit. FIG. 20 is a view showing changes in the inverter input voltage $V_{in}$, the well voltage $V_{sub}$ of the n-type MISFET 4 and the inverter output voltage $V_{out}$, which correspond to FIG. 19A, with passage of time. When the input is 0V, the output is the voltage $V_{DD}$. Thus, the initial value of the well voltage is stationarily the voltage $V_{DD}$. Next, when the input rises along the gradient $\alpha_i$ from 0V to $V_{DD}$, the well voltage also rises along $C_g/C_{tot}\alpha_i$, wherein $C_g$ represents the gate capacitance of the n-type MISFET 4 and $C_{tot}$ represents the total capacitance of the p-type well of the n-type MISFET 4, by capacitance coupling until the gate voltage reaches the threshold voltage $V_{th}$ of the n-type MISFET 4. As a result, the p-type well of the n-type MISFET 4 is biased to a more positive voltage, and the threshold voltage decreases by a substrate bias effect. Thus, electric current drivability increases more than the case of fixing the substrate bias to the voltage $V_{DD}$.

On the contrary, in the p-type MISFET 5 electric current drivability is reduced as much as a rise in the gate voltage. For this reason, the inverter inversion voltage $V_{inv}$ approaches 0V, and the delay time during which electrical charge accumulated in the load capacitance is discharged becomes shorter than the case of fixing the substrate bias to the voltage $V_{DD}$. When the inverter input $V_{in}$ becomes higher than the voltage $V_{inv}$, electrical charge accumulated in the well through the resistor 10 is discharged with a time constant of $RC_w$ to the output terminal. At last, the voltage $V_{sub}$ becomes 0V, which is the same as the voltage $V_{out}$. The inversion voltage $V_{inv}$ rises more in the case in which the voltage $V_{sub}$ is equal to 0V than the case in which the voltage $V_{sub}$ is equal to the voltage $V_{DD}$. Therefore, the switching speed when the input is changed from the voltage $V_{DD}$ to 0V is improved.

Figure 19B:
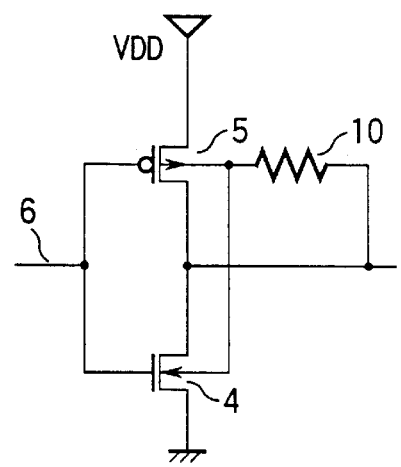

A modification of the example shown in FIG. 19A may be a circuit, shown in FIG. 19B, in which a resistor 10 is commonly used for an n-type MISFET 4 and a p-type MISFET 5 to short-circuit both wells. This circuit makes it possible to reduce the number of resistors and the region of inverters. In the circuit shown in FIG. 19B, when an input rises along a gradient $\alpha_i$ from 0V to the voltage $V_{DD}$, a channel inversion layer of the p-type MISFET 5 is already formed at a switching initial stage. For this reason, the substrate bias voltage of the n-type MISFET 4 is fixed to the voltage $V_{DD}$ not to cause a drop in the threshold voltage of the n-type MISFET 4 by capacitance coupling. However, the inversion voltage $V_{inv}$ is changed down when the inversion voltage $V_{in}$ is 0V and the inversion voltage $V_{inv}$ is changed up when the inversion voltage $V_{in}$ is the voltage $V_{DD}$, in accordance with change in the stationary state of the voltage $V_{sub}$. Thus, the characteristic of switching-operation at a high speed is maintained.

As a prior art, it is known in Jpn. Pat. Appln. KOKAI Publication No. 6-085262 that to a well electrode of a MISFET constituting an inverter, an input of the inverter is connected. In the present embodiment, an input is not connected to a well electrode, which is different from the prior art in which the input of the inverter is connected to the well electrode. For this reason, a feedback capacitance between the well and the drain, that is, a Miller capacitive component does not increase and the speed of switching operation is higher.

Figure 21A:
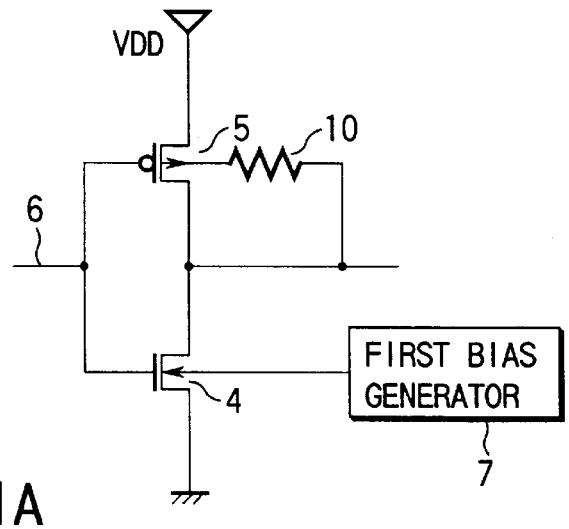
FIGS. 21A to 21C are views of structure examples of a high-speed switching circuit in the second embodiment.

A modification of the present embodiment is illustrated in FIG. 21A. In the modification shown therein, a well electrode 10 of a p-type MISFET is connected through a resistor 10 to an output of an inverter, and a well electrode of an n-type MISFET 4 is connected to another substrate bias circuit 7. In such a manner as above, only one of the wells may be connected to the logic output terminal. Of course, the well electrode of the n-type MISFET 4 may be connected through the resistor 10 to the output of the inverter, and the p-type MISFET 5 may be connected to another substrate bias circuit 7. The first bias circuit 7 may be replaced with a power supply line, that is, by a 0V or a $V_{DD}$ power supply line.

Figure 21B:
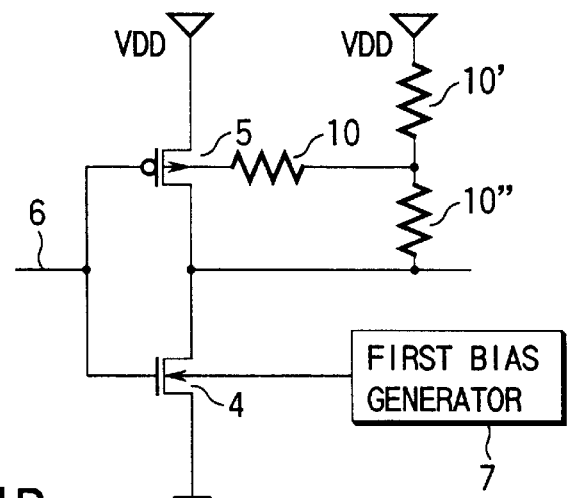

FIG. 21B shows an example in which an output of an inverter is divided by resistors 10' and 10" to drop its voltage, and is connected through the resistor 10 to a well electrode of an n-type MISFET 4. This structure makes it possible to reduce the voltage applied to a well of a p-type MISFET 5 by resistor-division to less than $V_{DD}$ and to raise $V_{DD}$ over the built-in voltage at the pn-junction formed by the well electrode and the source/drain junction of the p-MISFET 5.

Figure 21C:
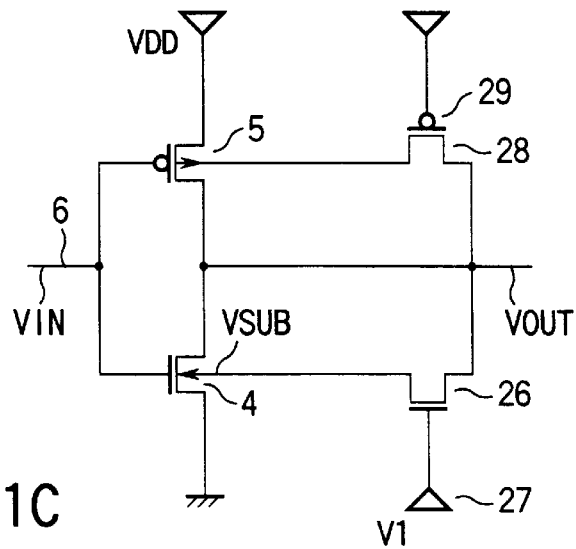

Instead of the resistor, the third MISFET 26 and the fourth MISFET 28 may be used, as shown FIG. 21C. In this example, a well electrode of an n-type MISFET 4 is connected to one of source/drain electrodes of the third MISFET 26, and the other of the source/drain electrodes of the MISFET 26 is connected to an output of the inverter. To a gate terminal 27 of the MISFET 26, applied is the voltage $V_1$ which is a higher than the threshold voltage $V_{th}$ of the MISFET 26. The product $RC_w$ of the resistance R between the source and the drain of the MISFET 26 and the total capacitance $C_w$ of the well to which the MISFET 26 is connected is longer than the gate delay time of the inverter having the MISFETs 4 and 5, the gate delay time being the value when the sharp step input from 0V to $V_{DD}$ is given.

Similarly, one of source and drain electrodes of the fourth MISFET 28 is connected to a well electrode of the p-MISFET 5, and the other of the source and the drain electrodes of the MISFET 28 is connected to the output of the inverter. To a gate terminal 29 of the MISFET 28, the voltage is applied which is lower than ($V_{DD}$—the threshold of the MISFET 28).

An electric current can flow to the MISFET 26 when the output voltage $V_{out}$ is lower than the voltage ($V_1-V_{th}$). On the contrary, an electric current to the MISFET 26 is cut-off when the output voltage $V_{out}$ is higher than the voltage ($V_1-V_{th}$). Accordingly, the upper limit of the $V_{sub}$ is fixed to the voltage ($V_1-V_{th}$) regardless of the power supply voltage $V_{DD}$. For this reason, a constant bias voltage can be obtained even if the power supply voltage $V_{DD}$ changes. It is evident that a p-type MISFET 5 and a voltage limiter p-type MISFET 28 in FIG. 2C also operate similarly.

Figure 22A:
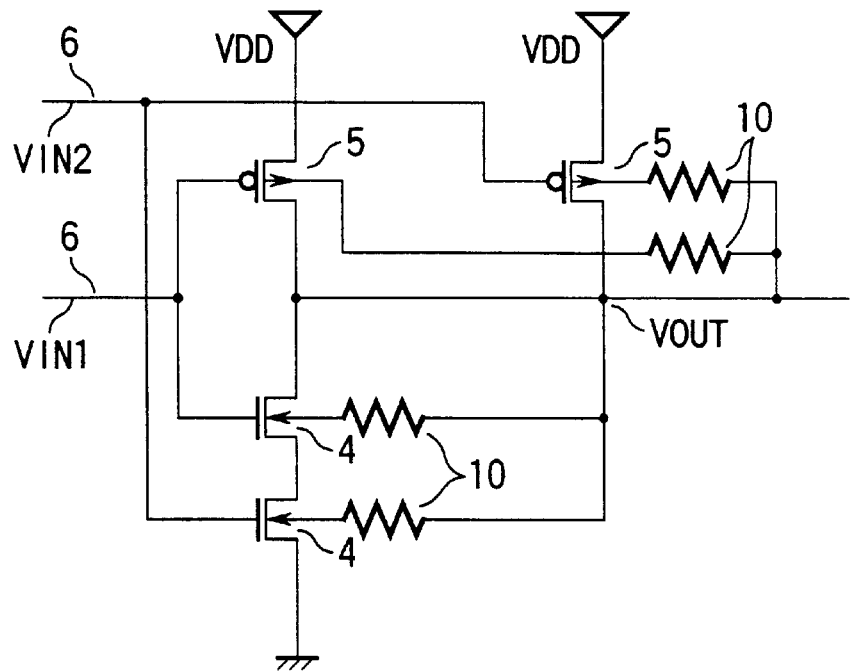
FIGS. 22A and 22B are views of structure examples of a high-speed switching circuit in the second embodiment.
Figure 22B:
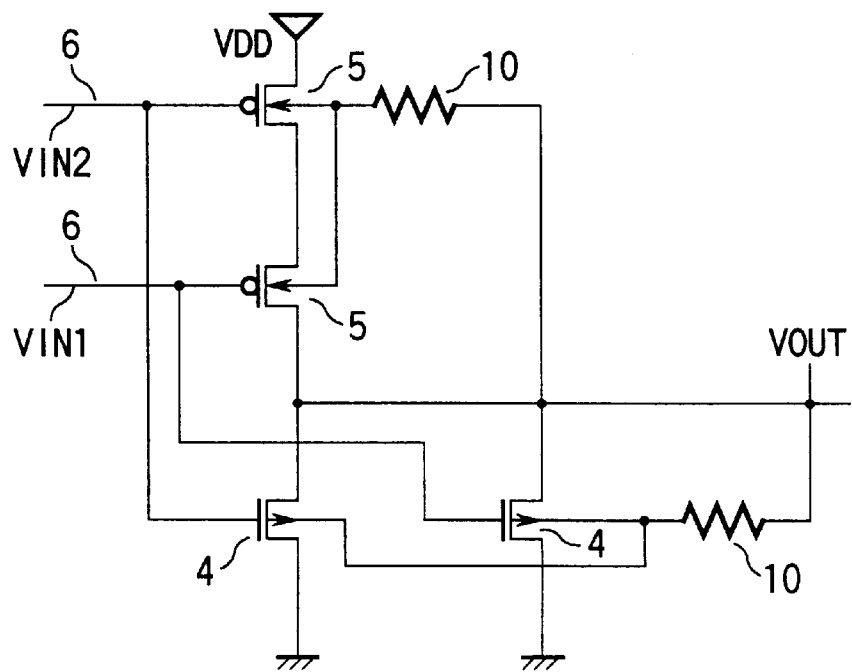

The present embodiment can be applied to a multi-input logic gate structure such as a NAND gate and a NOR gate, as well as the inverter. For example, FIG. 22A shows a double-input NAND gate, and FIG. 22B shows a double-input NOR gate. The explanation of the operation thereof is the same as in FIG. 21A, and is omitted. In FIG. 22A, resistors 10 are connected to respective wells. In FIG. 22B, for the same sort of wells, a resistor 10 is commonly used.

Figure 23:
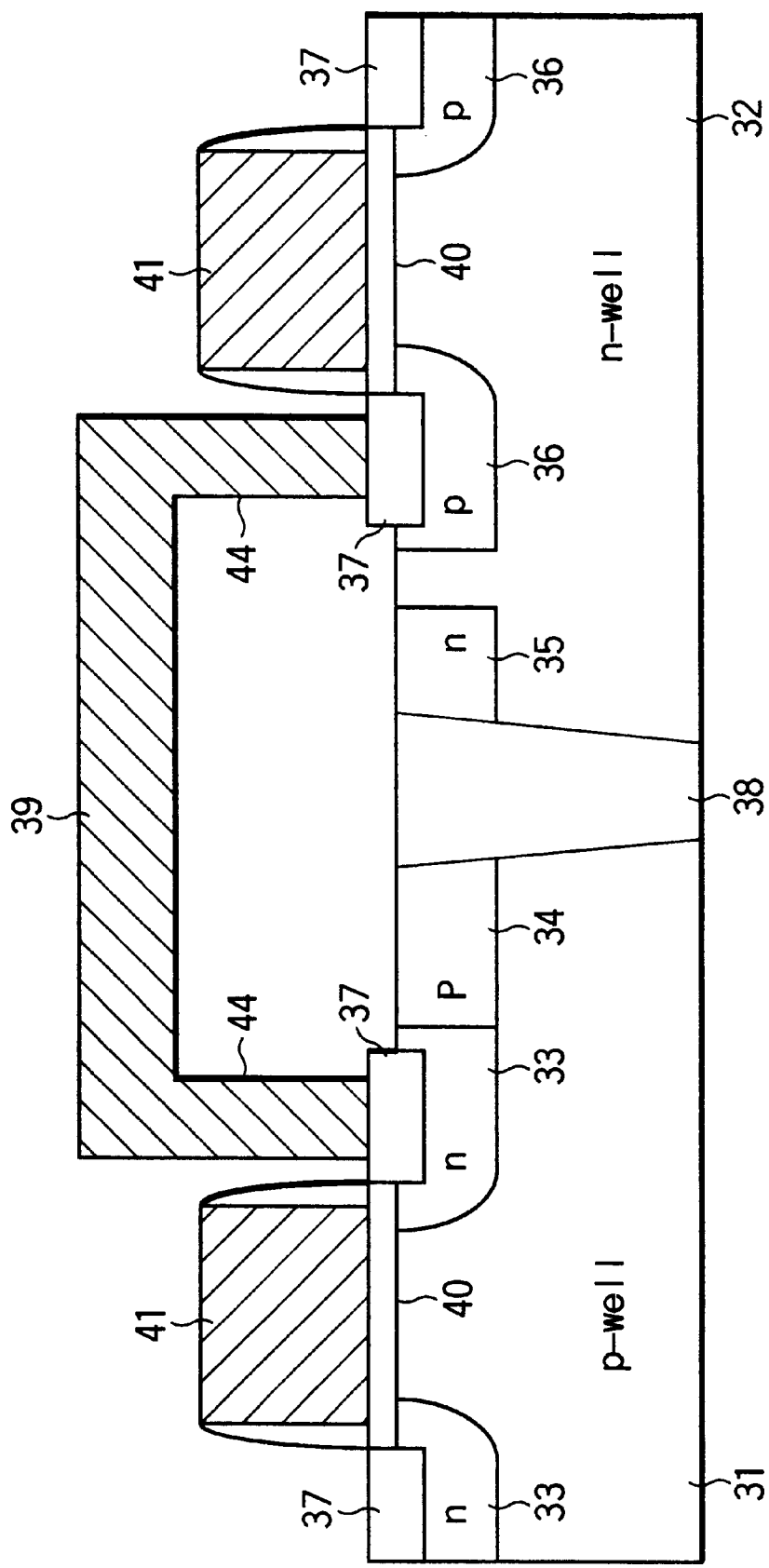
FIG. 23 is a view illustrating a cross sectional view of an element in the second embodiment.

In the present embodiment, an element structure shown in FIG. 23 may be used to realize the circuit structure shown in, e.g., FIG. 19A. In FIG. 23, a gate electrode 41 having e.g., polysilicon to which a B or P dopant is added is formed through a gate insulation film 40 having, e.g., silicon oxide or silicon nitride on a p-type well 31 and an n-type well 32 formed on a semiconductor substrate having, e.g., Si.

Source and drain layers 33 and 36 which, e.g., A or B is ion-implanted to and which has conductivity different from that of the above-mentioned well are formed at the both outside of the gate electrode. A silicide layer 37 such as a CoSi or TiSi layer is formed on the source and drain layers 33 and 36. One layer 33 of the source and drain layers of the n-type MISFET is connected through a wiring 39 formed of a metal such W, Ti, TiN, Al, or Cu to one layer 36 of the source and drain layers of the p-type MISFET. An element isolation layer 38 such as a silicon oxide film is formed between the p-type well 31 and the n-type well 32.

The characteristic of the embodiment is that either of a highly-doped layer 34 or 35 which a dopant such as As or B is added to at a high concentration and which has the same conductivity as that of the well is formed within the region to which the depletion layer of the source or drain electrode 33 or 36 connected to the wiring (layer) extends and consequently a tunnel current flows between the source/drain electrodes and the highly-doped layer, that the wiring 39 is not directly connected to the highly-doped layers 34 and 35, and the highly-doped layer 34 and the source/drain layers 33 are not connected by means of the silicide layer 37, and that the highly-doped layer 35 and the source/drain layers 36 are not connected by means of the silicide layer 37.

This structure makes it possible to make the resistance between the highly-doped layer 35 and the source/drain layers 36 higher than the resistance determined by the silicide layer 37 and obtain the resistance determined by a tunnel leakage current at the pn-junction between the layers 35 and 36.

Figure 24A:
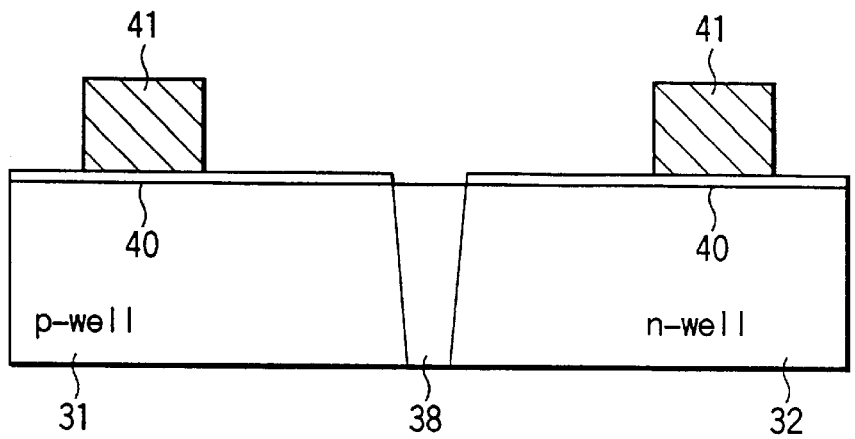
FIGS. 24A to 24C are views illustrating a process for manufacturing the element shown in FIG. 23.
Figure 24B:
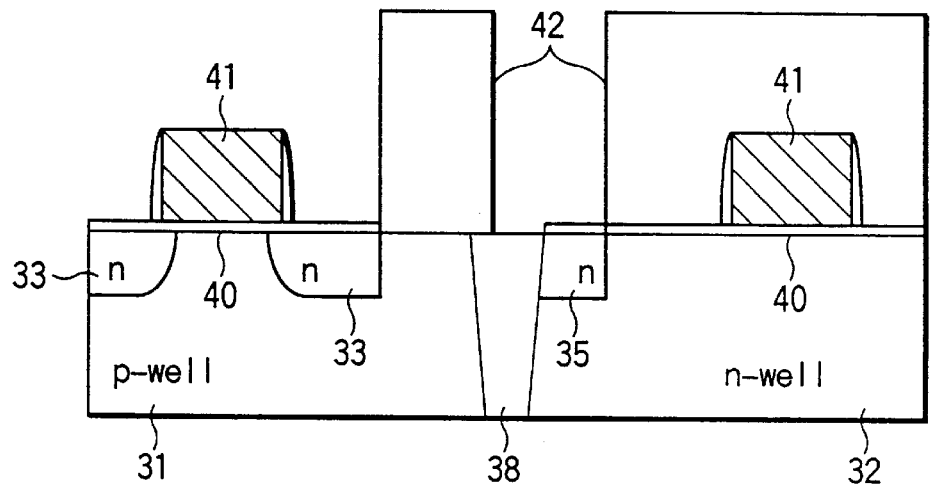
Figure 24C:
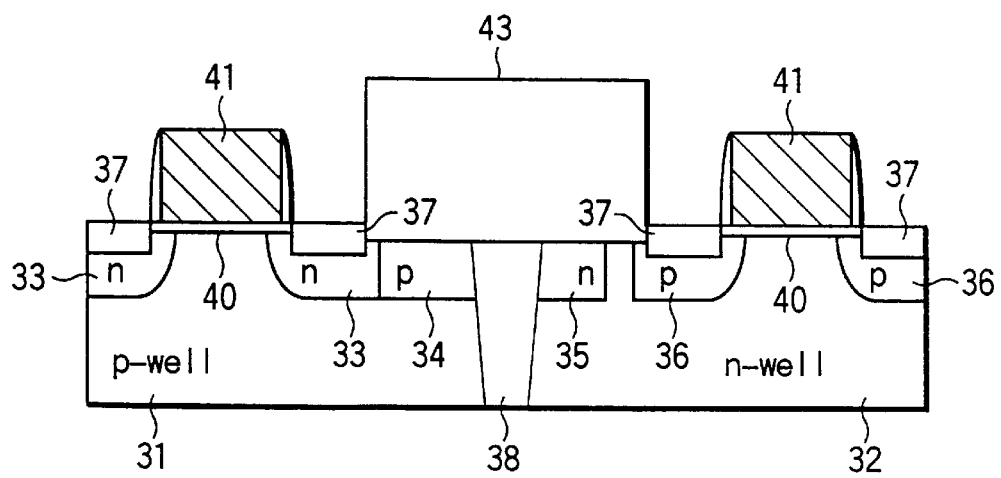

The following will describe the process for manufacturing the semiconductor structure in the embodiments, referring to FIGS. 24A to 24C.

At first, a semiconductor is prepared in which a p-type layer having a boron concentration of $10^{15}$ cm$^{-3}$ is formed. Well diffusion is then carried out by ion-implanting boron in an amount of about $10^{12}$ to about $10^{15}$ cm$^{-2}$ into a p-type well region 31 and ion-implanting in an amount of about $10^{12}$ to about $10^{15}$ cm$^{-2}$ into an n-type well region to optimize the dopant concentration in the well regions. Energy for ion-implication is, for example, from 100 eV to 1000 eV. The dopant concentration in the well regions may be from $10^{15}$ cm$^{-3}$ to $10^{19}$ cm$^{-3}$. The surface is then oxidized to form a Si oxide film having a thickness of e.g., 0.01 to 0.05 µm. On the film, a silicon nitride or silicon oxide film which will be a masking material for trenches is deposited so that its thickness will be, e.g., 0.3 to 0.5 µm.

Subsequently, an element separation 38 having a isolated trench is formed. The depth of the isolated trench is, e.g., from 0.1 to 2 µm. After forming the trench for isolating the element, an insulation film such as a silicon oxide film is deposited so that its thickness will be from 0.1 to 4 µm. Other portions than the element isolation trench are then removed off by etchback or polishing so that their height will be within the range of ±0.3 µm in comparison with the height of the region 38. After that, the masking material for the trench is removed off by, e.g., reactive etching. Well diffusion may be carried out by ion-implanting boron or indium to the p-type well region 31 and by ion-implanting phosphorus, arsenic or antimony to the n-type well region, so as to optimize the dopant concentration of the channel and well regions.

Subsequently, the surface of the semiconductor is oxidized or nitrided so that its thickness will be, e.g., from 1 to 20 nm to form a gate insulation film 40. The gate insulation film may be formed by deposition. On the whole surface thereof, polycrystal silicon film which will be a gate electrode 41 is then deposited, and a phosphorus or boron is ion-implanted thereto to make its resistance small, after which it is processed by lithography and reactive ion etching to form a gate electrode. Thus, a structure shown in FIG. 24A is obtained.

As shown in FIG. 24B, a resist 42 is then applied to the whole surface thereof and subsequently a lithographic process is carried out. For example, an arsenic, antimony or phosphorus, which is an n-type dopant, is ion-implanted thereto at an amount of from $10^{13}$ to $10^{16}$ cm$^{-2}$ at a voltage for acceleration of from 1 to 100 eV to form n-type source/drain layers 33 and an n-type region 35. By forming the regions 33 and 35 simultaneously, it is possible to reduce manufacturing steps, as compared with the case in which the regions 33 and 35 are independently formed. On the whole surface thereof, a resist 42 is then deposited, and subsequently a lithographic process is carried out. Boron, BF$_2$ or indium, which is a p-type dopant, is then ion-implanted thereto, at an amount of from $10^{13}$ to $10^{16}$ cm$^{-2}$ at a voltage for acceleration of from 1 to 100 eV to form p-type source/drain electrodes 36 and a p-type region 34. The distance between the region 35 and the layers 36, and one between the layers 33 and 34 are within the range from about 0 nm to 0.3 μm, which makes it possible that a tunnel leakage current flows.

In order to selectively form a silicide on the source/drain 33 and 36, on the whole surface of the resultant an insulation film 43 such as a silicon oxide film is deposited so that its thickness will be from 0.01 to 1 μm, and subsequently lithograph and etching processes are carried out to obtain a pattern in which the film remains on the layers 34 and 35. On the whole thereof, a metal such as Co or Ti is deposited so as to have a thickness of from 0.01 to 0.3 μm, and then heating treatment is conducted at 400° C. or higher to selectively from CoSi$_x$ or TiSi$_x$ on the source/drain. The remaining metal is removed off by etching to obtain a structure illustrated in FIG. 24C.

In the next step, which is not illustrated in any figures, an interlayer dielectric film is deposited thereon, and a wiring contact 44 is formed by lithography and reactive ion etching processes. At last, a metal such as Al or W is deposited thereon to form an upper wiring layer.

Figure 25A:
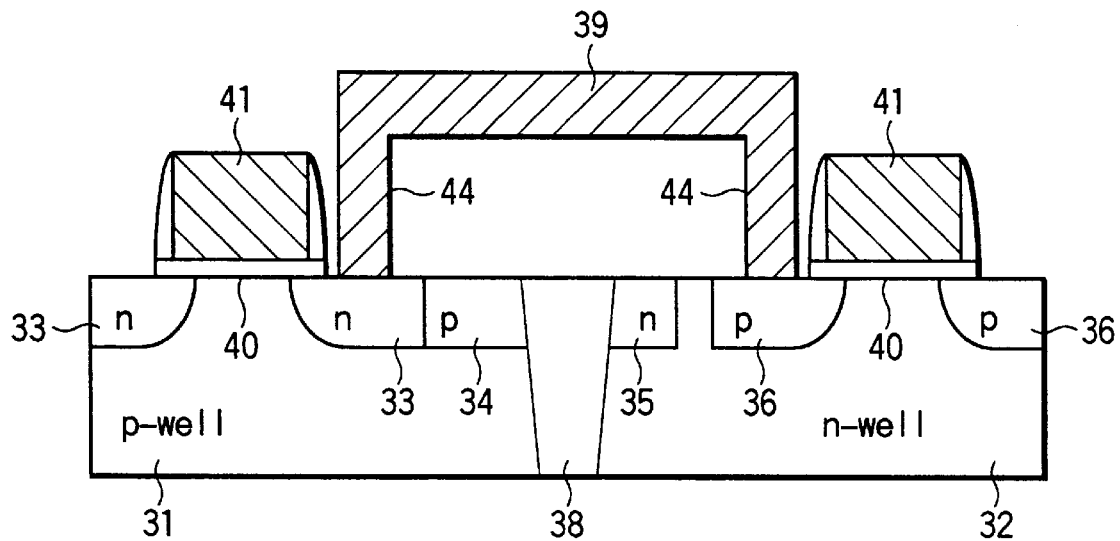
FIGS. 25A and 25B are views of a structure example of a high-speed switching circuit in the second embodiment.

FIG. 25A illustrates a modification of the structure shown in FIG. 23A. In the modification, for example, the silicide layer 37 is not disposed. This structure needs to connect a contact 44 with a source or drain layer 33 or 36 which is different from a substrate in a conductivity type and not to connect a contact 44 with a layer 34 or 35 which is the same as the substrate in a conductivity type. The modification shown in FIG. 25A can be manufactured without any additional steps to prior CMOS processes, and does not cause enlargement in stress due to silicidation, formation of defects nor deterioration of junction leak due to silicidation.

Figure 25B:
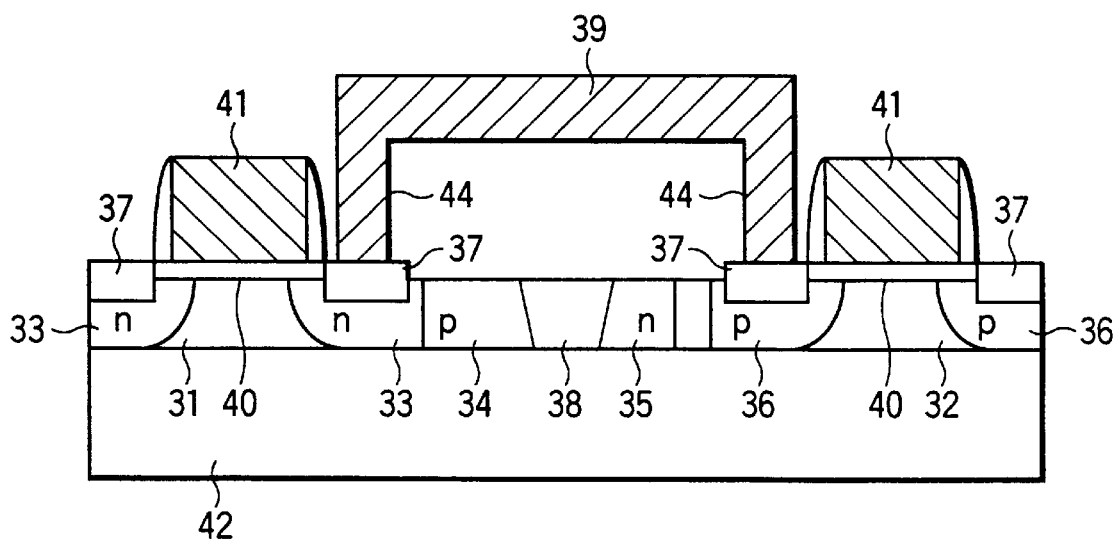

FIG. 25B shows another modification in which a semiconductor thin film is formed on an insulation film 42, as a transistor active region. In this modification, the thickness of the semiconductor thin layer is preferably such that the depletion layer having thickness, which is about 0.05 μm to 1 μm, that is, a depth to which a depletion layer formed by the source/drain layer is reached, to reduce depletion layer capacitance of the source/drain layers 33 and 36, specifically, e.g., from 0.05 to 1 μm. In this structure, respective transistor regions are completely isolated by an element isolation region 38. Thus, it is easy to control body voltages of the respective transistors.

Embodiment 3

The threshold voltage $V_{th}$ of a surface channel n-type transistor is given by the equation of: $V_{th}=2\phi_F+V_{FB}-Q_B\,t_i/\epsilon_i$, wherein $\epsilon_i$ represents the dielectric constant of a gate insulation film. In order to lower the threshold voltage to improve electric current drivability during active state, it is effective to reduce the acceptor surface density ($-Q_B$) of the depletion layer of the p-type well. This can be carried out by, for example, applying a substrate bias voltage in the forward direction between n-type source/drain electrodes and the p-type well. However, if the forward bias is applied into the structure wherein plural wells, which have different conductive types during active state and contact each other are formed, the problem of latching-up or instability of its well voltage occurs. This is serious in particular when the forward bias is applied. This will be described below.

Figure 26A:
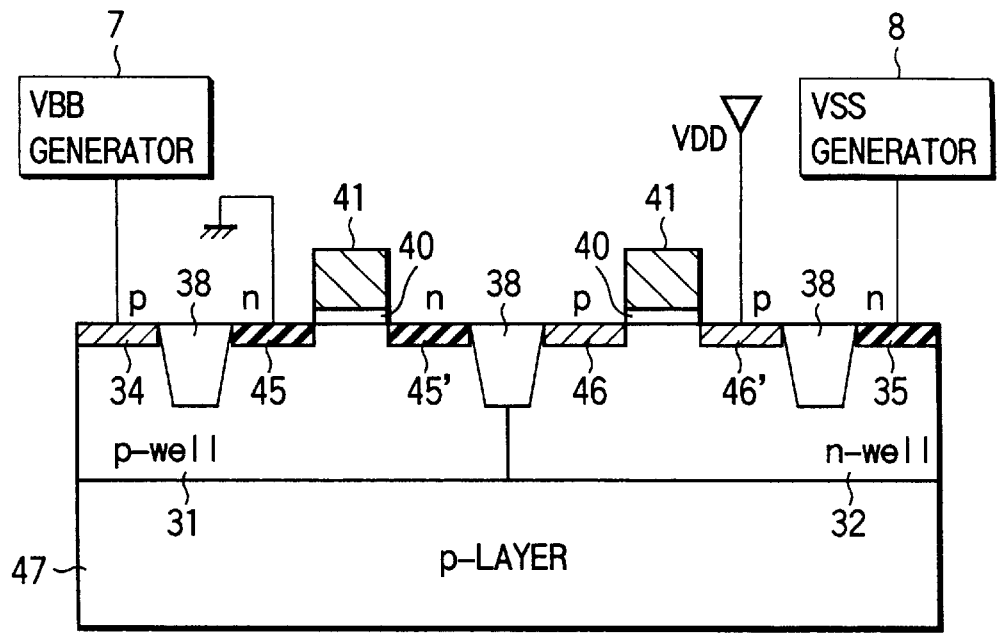
FIGS. 26A and 26B are views for explaining occurrence of latching-up in a structure coming in contact with a well.

FIG. 26A illustrates a cross sectional view of an element structure of a complementary type MISFET circuit formed in the contacting wells. To the same elements as in the above-mentioned embodiment, the same reference numbers are attached. The explanation thereof is omitted. In the structure in FIG. 26A, an electrode 45 is one of source/drain electrodes of an n-type MISFET formed in a p-type well 31 and is connected to a 0V point. An electrode 46' is one of source/drain electrodes of a p-type MISFET formed in an n-type well 32, is having a p-type semiconductor, and is connected to the $V_{DD}$ point. In the p-type well 31 and the n-type well 32, a pn-junction through a p-type layer 47 is formed. The p-type well 31 may or may not contact the n-type well 32 directly. The n-type well 32 is also connected through a n-type well electrode 35 to the $V_{SS}$ generator 8, and the p-type well 31 is also connected through a p-type well 34 to the $V_{BB}$ generator 7.

Figure 26B:
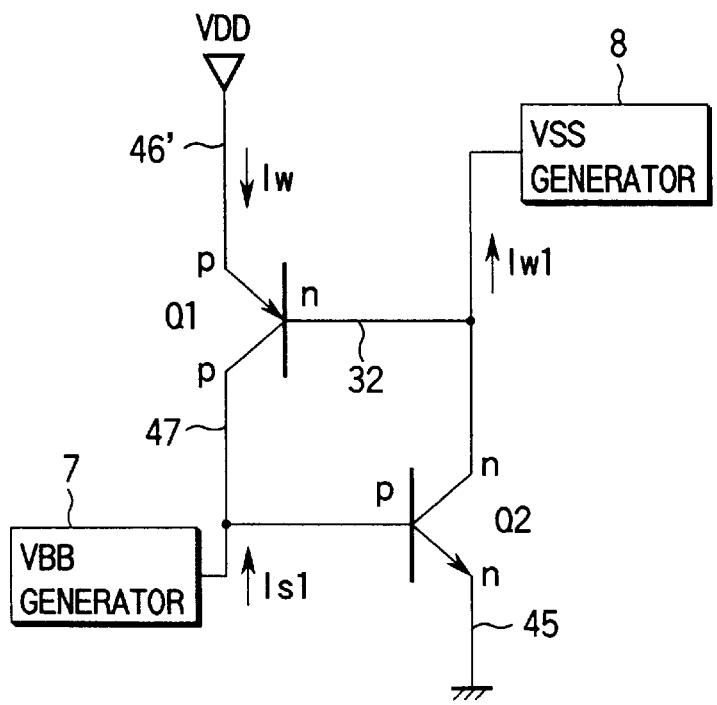

The p-type electrode 46', the n-type well 32 and the p-layer 47 constitute a pnp longitudinal transistor Q1. The n-type well 32, the p-layer 47 and n-type electrode 45 constitute an npn transverse transistor Q2. The respective bases of the Q1 and the Q2 are connected to the respective collectors of the Q2 and the Q1 to form a parasite thyristor structure. FIG. 26B shows the equivalent circuit thereof. In this connection, the following equation is satisfied:

$$I_H=(I_{co}-\alpha_{FP}\cdot I_{w1}-\alpha_{FN}\cdot Is1)/(\alpha_{FP}+\alpha_{FN}-1) \qquad (8)$$

wherein $\alpha_{FP}$ and $\alpha_{FN}$ are the common-base current gains of the Q1 and the Q2, respectively, $I_{co}$ is the sum of the backward saturation current value of both the transistors, $I_{w1}$ is the value of the current flowing from the n-type well 32 to the $V_{SS}$ generator 8, Is1 is the value of the current flowing from the $V_{BB}$ generator 7 to the p-type well 31, and $I_H$ is the value of the flowing-into current from the power source $V_{DD}$, i.e., the current value for holding latching-up, the so called holding current.

The above is already known and is described, for example, in the literature "Submicron Device I" written by Mitshumasa Koyanagi, published by Maruzen, 1987, pp. 182–pp. 183. In the structure having an element isolation distance larger than the depth of its well, the base width in the longitudinal transistor Q1 is shorter than the transistor Q2, in which its base region is formed along the traverse direction, and consequently the current amplification factor is larger. Thus, the following is satisfied:

$$\alpha_{FP}>\alpha_{FN}>0.$$

When the holding current $I_H$ is greater in the equation (8), latching-up is less caused. The inventors have found that latching-up is more easily caused in the case of forward-biasing the layer 32 which constitutes the base of the longitudinal transistor than in the case of applying the current at the same amount into the base of the traverse bipolar transistor, i.e., the p-type layer 47. This is because $I_H$ is smaller under the condition that $I_{s1}=0$ and $I_{w1}=I_0$ (>0) than under the condition that $I_{w1}=0$ and $I_{s1}=I_0$ (>0), in the light of the equation (8) and the relationship of $\alpha_{FP} > \alpha_{FN}$. In order to prevent latching-up, therefore, it is important not to fall the layer constituting the base of the longitudinal transistor into a forward bias condition.

Figure 27A:
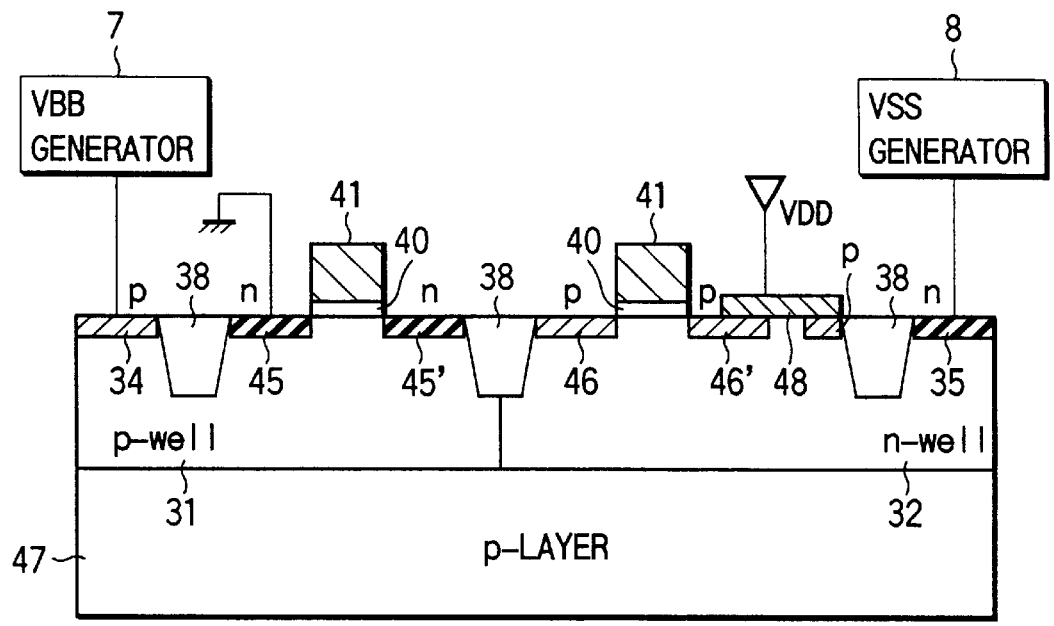
FIGS. 27A and 27B are views illustrating a cross sectional view of an element structure in the third embodiment, and an equivalent circuit of a parasite thyristor structure.
Figure 27B:
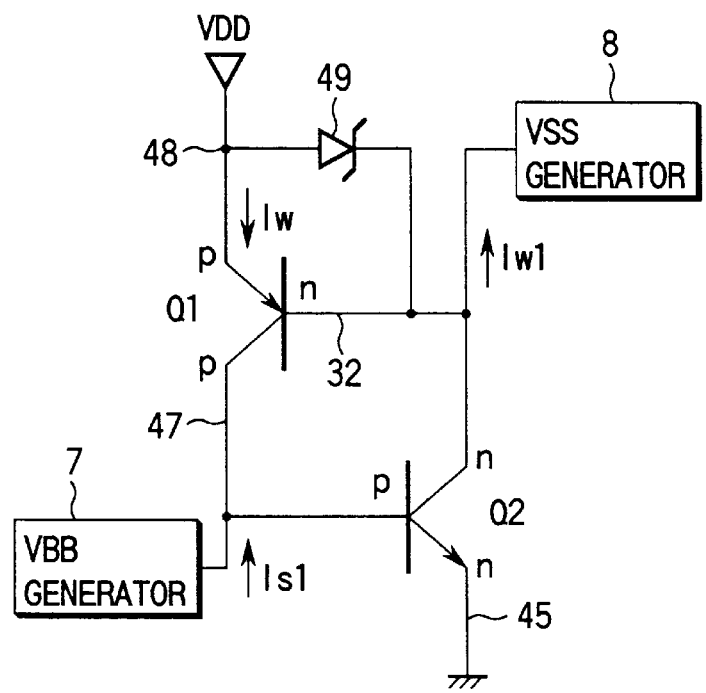

Thus, FIGS. 27A and 27B illustrate an embodiment of having resistance to latching-up when a substrate is forward-biased. As shown in FIG. 27B, a base terminal of a parasite pnp transistor Q1 is connected longitudinally to a cathode terminal of a Schottky barrier diode 49, and an anode terminal of the Schottky barrier diode 49 is connected to a power supply voltage $V_{DD}$ terminal. This diode 49 is selectively formed in the well having the longitudinal parasite transistor.

For example, the built-in voltage $V_{SF}$ at the Schottky barrier diode of Si against an n-type semiconductor is from 0.3 to 0.4V, and is lower than the built-in voltage (about 0.6V) at the pn-junction of Si. Thus, the voltage at the n-type well 32 does not fall down to not more than $(V_{DD}-V_{SF})$ in comparison with the $V_{DD}$. For this reason, it is possible to control the current injected from the source/drain electrode layers 46' of the p-type MISFET and prevent latching-up. Because the Schottky barrier diode is a majority carrier device and does not cause such charge accumulation in a space charge layer as in a pn-junction diode, the Schottky barrier diode responds immediately to change in a power supply voltage. In the Schottky junction, electrons, which are majority carriers for an n-type well, are injected as an current. For this reason, latching-up is less caused in the case in which holes injected in the pn-junction are carriers.

FIG. 27A shows a cross section of the element structure of the circuit shown in FIG. 27B. This figure is basically the same as FIG. 26A. However, a metal film or a conductive metal/semiconductor compound film 48 is formed on one electrode 46' of source/drain electrodes, which is having a p-type semiconductor and connected to the $V_{DD}$, of a p-type MISFET formed in an n-type well 32, to give ohmic contact. The metal film or the conductive metal/semiconductor compound film 48 is also formed on the n-type well 32 to make a Schottky junction with the n-type well. The portion of the conductive film 48 on the n-type well may be formed contacting one electrode 46' of the souse/drain electrodes. Alternatively, a new electrode having the same conductivity as the source/drain electrodes is formed, as a isolated region, and a Schottky barrier junction may be formed between this new electrode and the n-type well.

The conductive film 48 may consist of, for example, W, TiSi, TiN, Ti, WSi, CoSi or Al. Using the material, the conductive film 48 can be formed at a substrate surface dopant concentration of the n-type well 32 of $10^{18}$ cm$^{-3}$ or less. When a silicide is formed using, for example, TiSi$_x$ or CoSi$_x$ on the source/drain electrodes, the Schottky barrier diode 49 can be formed in the silicide process. Thus, the present embodiment can be realized without increase in manufacturing steps, as compared with the logic circuit manufacturing method using the silicide process.

Figure 28A:
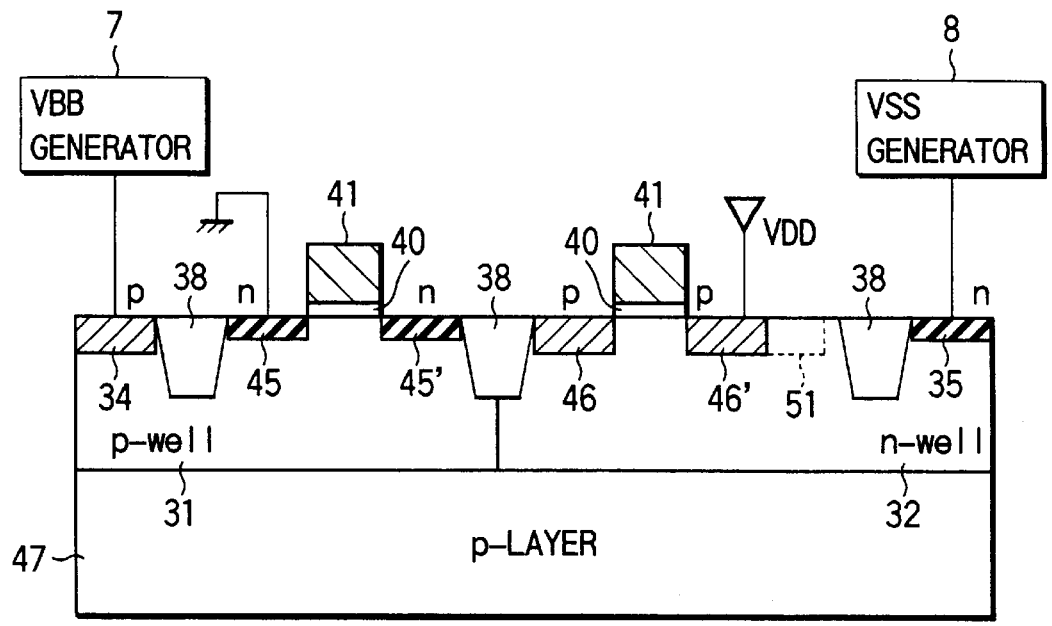
FIGS. 28A and 28B are views illustrating a cross sectional view of an element structure in the third embodiment, and an equivalent circuit of a parasite thyristor structure.
Figure 28B:
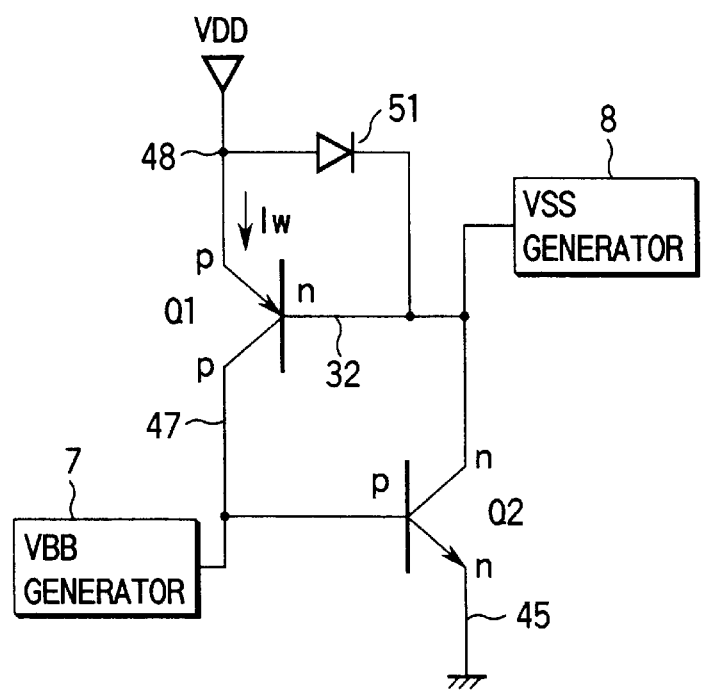

FIG. 28B shows a modification of the present embodiment obtained by replacing the Schottky barrier diode with a pn-junction diode having a smaller built-in potential of the pn-junction than that of the above-mentioned well and the source/drain junctions. This example is a pn-junction diode formed on silicon to which, e.g., Ge is implanted, or a pn-junction diode in which a dopant adding amount is, e.g., more than $10^{18}$ cm$^{-3}$ to cause band gap narrowing.

FIG. 28A shows an example of an element structure cross section of the circuit shown in FIG. 28B. FIG. 28B is basically the same as FIG. 26A. However, a SiGe layer 51 to which, e.g., Ge is added at an amount of from about $10^{18}$ to about $10^{22}$ cm$^{-3}$ is formed over an electrode 46', which is having a p-type semiconductor and connected to the $V_{DD}$, of a p-type MISFET formed in an n-type well 32, and the n-type well 32 (the portion in which slanting lines are drawn). The electrode 46' may be co-used for the source/drain layer, or may be separately formed for them. The built-in potential of the n-type well 32 against p-type electrodes 46' is set so that it is lower in the case wherein a layer 51 is formed than that wherein the layer 51 is not formed.

Under this condition, the $V_{SF}$ of the built-in voltage through the layer 51 against the n-type semiconductor is lower than the built-in voltage (about 0.6V) at the pn-junction of Si because the band gap of SiGe is narrower than that of Si. Thus, the voltage at the n-type well 32 does not fall down to not more than $(V_{DD}-V_{SF})$ in comparison with $V_{DD}$. For this reason, it is possible to control the current injected from the source/drain electrode layers 46 of the p-type MISFET and prevent latching-up.

Figure 29A:
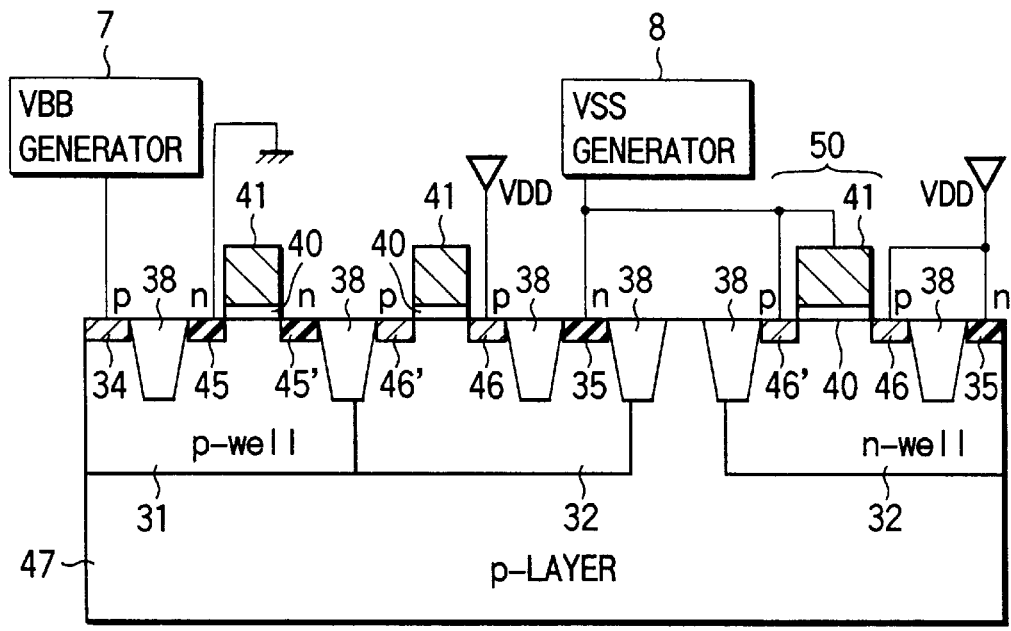
FIGS. 29A and 29B are views illustrating a cross sectional view of an element structure of a semiconductor device in the third embodiment, and an equivalent circuit of a parasite thyristor structure.
Figure 29B:
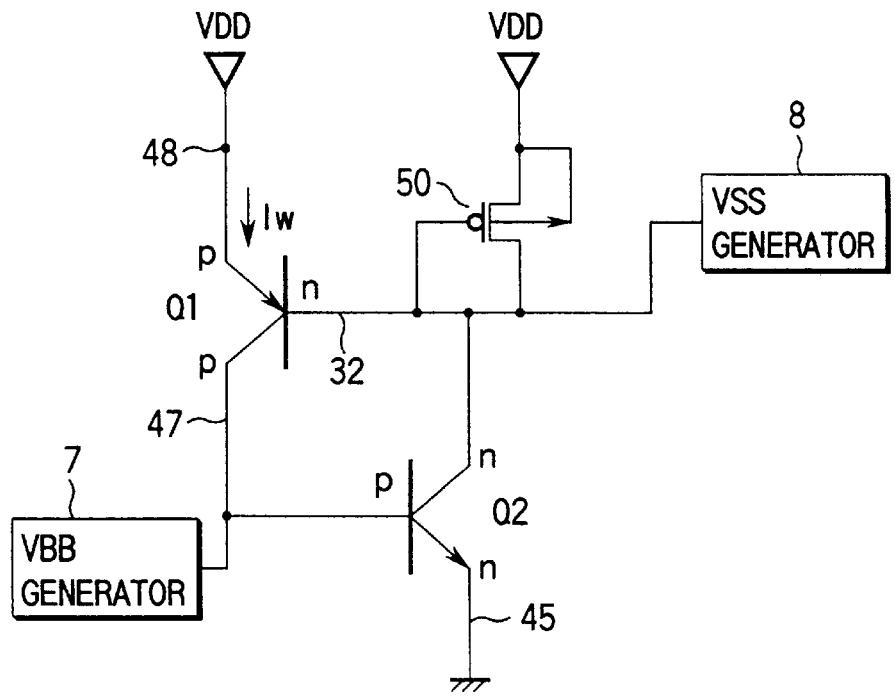

FIGS. 29A and 29B illustrate another embodiment of having resistance to latching-up when a substrate is forward-biased. As shown in FIG. 29B, one terminal of source/drain terminals and a gate electrode of a p-type MISFET 50 are connected to a base terminal of a parasite transistor Q1, and the other terminal of the source/drain electrodes of the MISFET 50 is connected to a power supply $V_{DD}$ terminal. In the case of representing the threshold voltage of the MISFET 50 by $V_{thp}$, the value $|V_{thp}|$ is kept lower than the built-in voltage of the pn-junction. Then, the transistor 50 becomes conductive at the voltage $(V_{DD}-V_{thp})$ or less. Thus, the voltage at the n-type well 32 does not fall down to not less than $(V_{DD}-V_{thp})$ in comparison with $V_{DD}$. For this reason, it is possible to control the current injected from the source/drain electrode layers 46 and 46' of the p-type MISFET and prevent latching-up.

FIG. 29A shows an example of a cross section of the circuit shown in FIG. 29B. In this figure, a gate electrode 41 and one of the source/drain electrodes 46' of a MISFET 50 are connected to a $V_{SS}$ generator of a p-type MISFET formed in an n-type well 32, and the other electrode 46 of the source/drain electrodes is connected to a voltage $V_{DD}$ point. According to this structure, the voltage clump transistor 50 can be manufactured simultaneously in the process for manufacturing other p-type MISFET 5. In other words, the circuit can be formed without increase in manufacturing steps.

Embodiment 4

About the structure having plural wells which are different in their conductive types and contact each other, the inventors have found that, in transition between active and standby states, latching-up and the problem of instability of a well voltage, as well as the problem stated in connection with the third embodiment, are caused in the case in which independent substrate bias circuits are connected to plural wells. This will be described in the following.

Figure 30A:
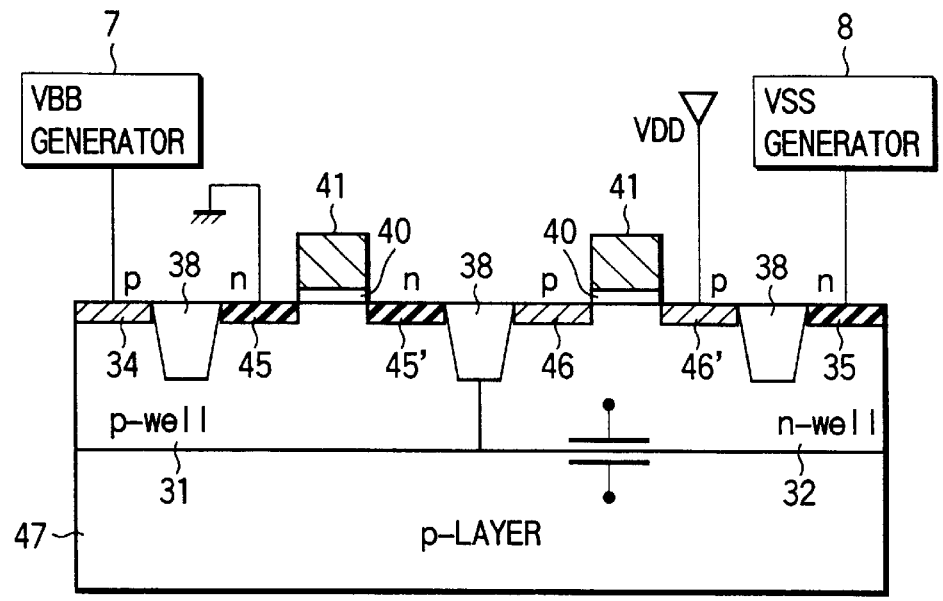
FIGS. 30A and 30B are a cross sectional view of an element structure for explaining a prior problem, and a timing chart, respectively.

FIG. 30A illustrates a cross section of a MISFET in which two different wells contact each other. This is the same structure as in FIG. 26A. Thus, detailed explanation is omitted. In this structure, a p-type layer 47 and an n-type well 32 have a large diffusion capacitance $C_1$. The n-type well 32 is connected through a n-type well electrode 35 to a $V_{SS}$ generator 8, and a p-type well 31 is connected through a p-type well electrode 34 to a $V_{BB}$ generator 7.

Figure 30B:
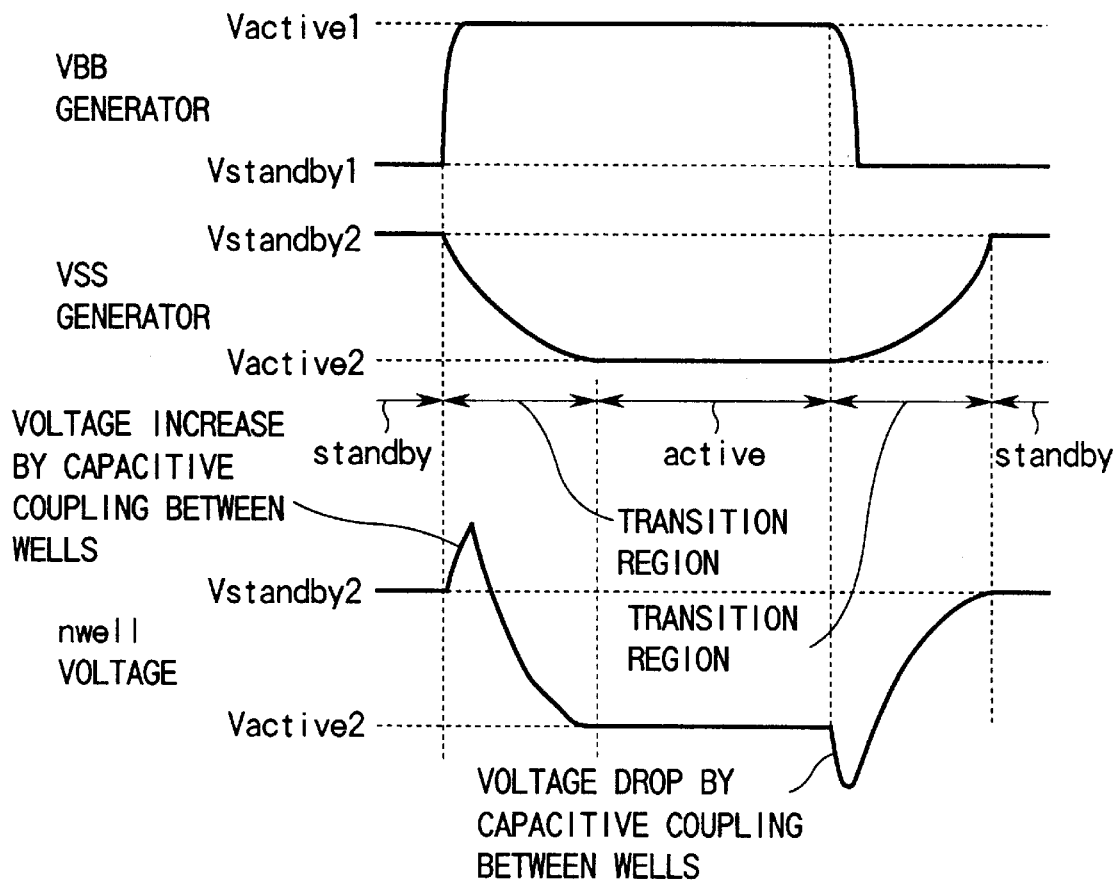

As shown in FIG. 30B, it is assumed that with transition from an active state to an standby state, the voltage at the $V_{BB}$ generator drops from $V_{active1}$ to $V_{standby1}$, and the voltage at the $V_{SS}$ generator rises from $V_{active2}$ to $V_{standby2}$.

FIG. 30B shows the output when there is no capacitive coupling between both of the wells. When electric current drivability of the $V_{SS}$ generator 8 is by far smaller than that of the $V_{BB}$ generator 7, by capacitive coupling between the p-layer 47 and n-type wells 32, the voltage at the n-type well 32 is reduced as much as $(\Delta V/\Delta t)(C_1/C_{tot})$, wherein $\Delta V/\Delta t$ represents a reduced amount per unit time at the $V_{BB}$ generator, and $C_{tot}$ represents the total capacitance of the n-type well 32. For this reason, the voltage of the n-type drops below $V_{active2}$ so that n-type well 32 is more forward-biased. Thus, latching-up is caused.

Reversibly, in transition from a standby state to an active state, the voltage of the n-type well 32 is more backward-biased than $V_{standby2}$ so that the electric field applied to the gate increases. This causes deterioration of breakdown voltage of the gate insulation film, increase in switching time, and break-down of the n-type well 32 and the source/drain electrodes 46 and 46' of the n-type MISFET.

Figure 31A:
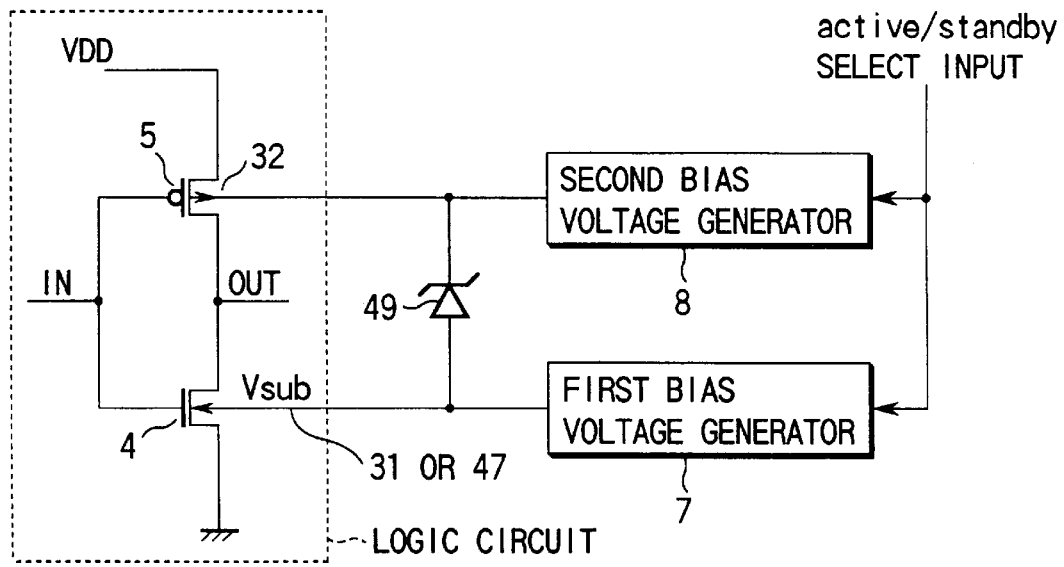
FIGS. 31A and 31B are a view of a circuit structure of a semiconductor device in the fourth embodiment, and a timing chart, respectively.
Figure 31B:
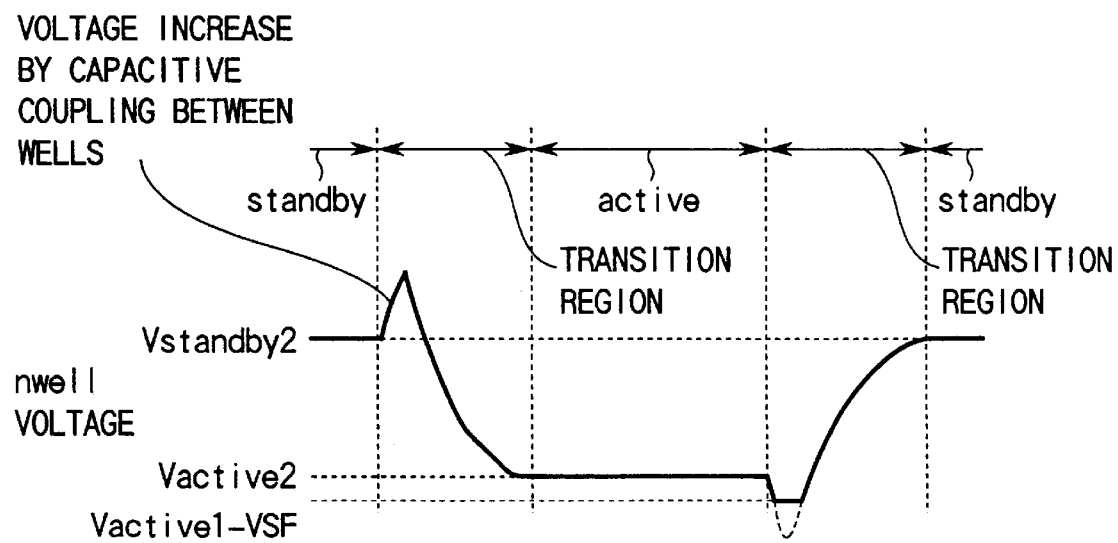

FIGS. 31A and 31B show a circuit of the embodiment which can overcome the above-mentioned problems, in particular latching-up. As in FIG. 31A, an n-type well 32 is connected to a cathode terminal of a Schottky barrier diode 49, and an anode terminal of this Schottky barrier diode 49 is connected to a p-type well 31 or a p-type layer 47. This diode 49 is selectively formed in the well in which a parasite transistor is formed longitudinally. For example, the built-in voltage $V_{SF}$ of a Schottky barrier diode of Si against an n-type semiconductor is from 0.3 to 0.4V, which is lower than the built-in voltage (about 0.6V) of the pn-junction of Si.

Thus, the built-in voltage of the p-type well 31 against the n-type well 32 is not $V_{SF}$ or more, so that latching-up is unlikely to be caused when an active state is transited to a standby state. Because the Schottky barrier diode is a majority-carrier device and does not cause such charge accumulation in a space charge layer as in a pn-junction diode, the Schottky barrier diode responds immediately to change in a power supply voltage. In the Schottky junction, electrons, which are majority carriers for an n-type well, contribute to generation of a current. For this reason, latching-up is less caused in the case in which holes injected in the pn-junction are carriers.

Figure 32:
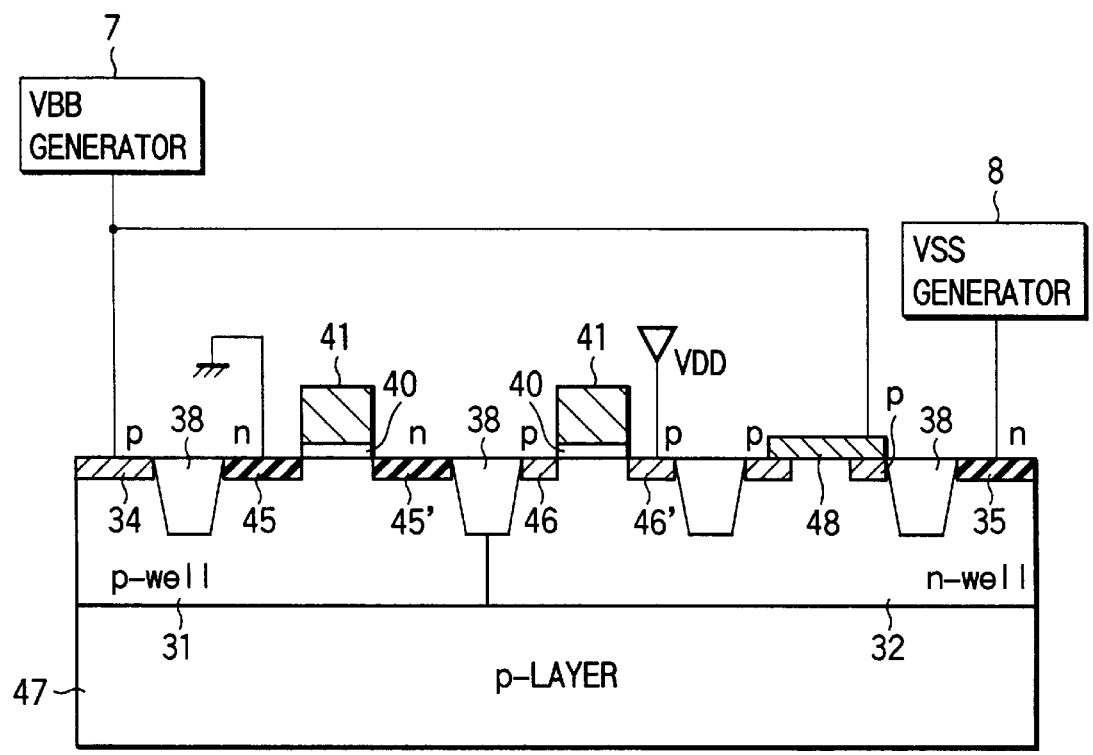
FIG. 32 is a view illustrating a cross sectional view of an element structure of the semiconductor device in the fourth embodiment.

FIG. 32 shows a cross sectional view of an element structure of the circuit shown in FIG. 31A, and is basically the same as FIG. 26A. However, a metal or a conductive metal/semiconductor compound film 48 is formed on an n-type well 32 to give ohmic contact and form a Schottky barrier junction with the n-type well 32. The conductive film 48 is further connected to a $V_{BB}$ generator 7. The materials of the conductive film 48 may be, for example, W, TiSi, TiN, Ti, WSi, CoSi or Al. Using the material, the conductive film 48 can be formed at a substrate surface doping concentration of the n-type well 32 of $10^{18}$ cm$^{-3}$ or less. When a silicide is formed using, for example, TiSi or CoSi on the source/drain electrodes, the Schottky barrier diode 49 can be formed simultaneously in the silicide process. Thus, the present embodiment can be realized without increase in manufacturing steps, as compared with the logic circuit manufacturing method using the silicide process.

In a modification of this embodiment, the Schottky barrier diode may be replaced with, e.g., a pn-junction diode having a smaller built-in potential of the pn-junction than that of the above-mentioned well and the drain/source junction, in the same manner as explained in FIG. 28B.

Figure 33A:
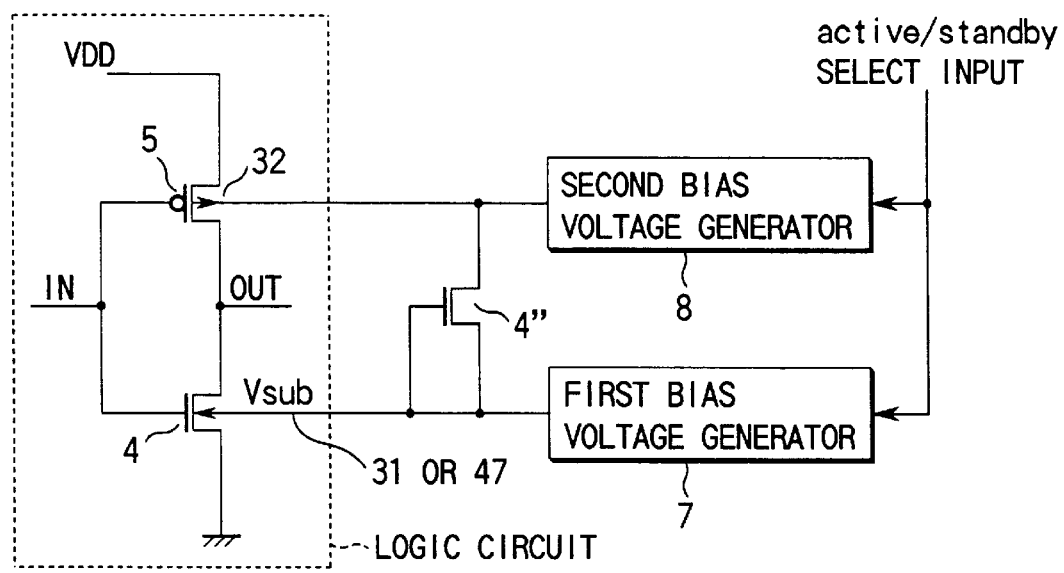
FIGS. 33A and 33B are views illustrating a circuit structure of the semiconductor device in the fourth embodiment.
Figure 33B:
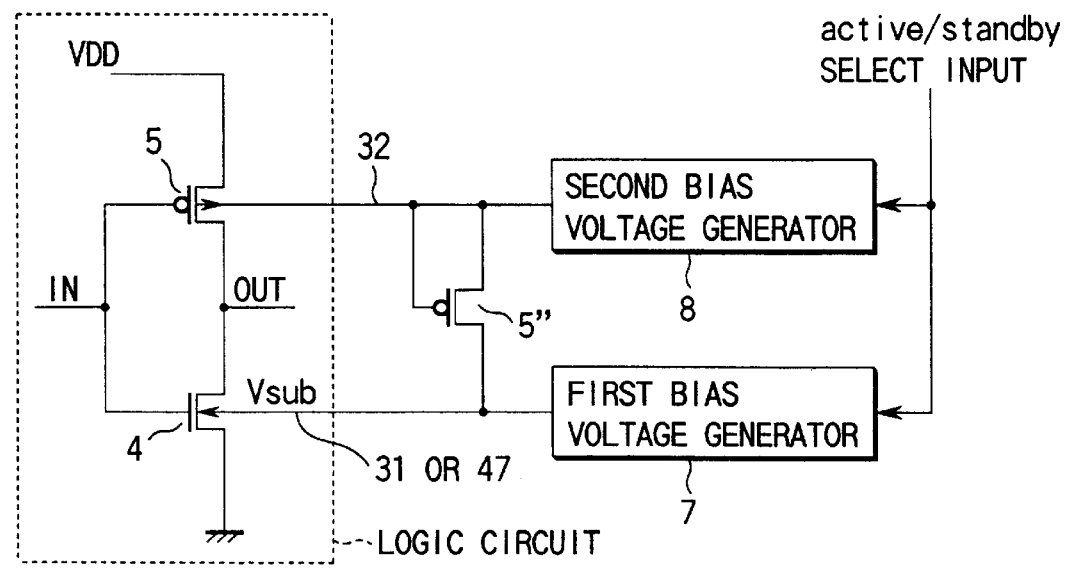

FIGS. 33 illustrates another embodiments having resistance to latching-up when a substrate is forward-biased. As shown in FIG. 33B, one of source/drain terminals of a p-type MISFET 5'' and a gate electrode thereof are connected to an n-type well 32, and the other of the source/drain terminals of the MISFET 5'' is connected to a p-type well 31. In the case of representing the threshold voltage of the MISFET 5'' by $V_{thp}$, the value $|V_{thp}|$ is kept lower than the built-in voltage of the pn-junction. Then, the transistor 50 becomes conductive at the voltage $(V_{DD}-V_{thp})$ or less, and the built-in voltage between the n-type well 32 and the p-type well 31 is not $V_{thp}$ or more, so as to control latching-up in the same manner as in the embodiment shown in FIG. 31.

In FIG. 33A, one of source/drain terminals of an n-type MISFET 41, and a gate electrode thereof are connected to a p-type well 31, and the other of the source/drain terminals is connected to an n-type well 32. The threshold voltage of the MISFET 4'', which is represented by $V_{thn}$, is set to less than the built-in voltage of the pn-junction. Then, the transistor 4'' becomes conductive at $V_{thn}$ or more and the built-in voltage between the n-type well 32 and the p-type well 31 is not $V_{thn}$ or more, to control latching-up in the same manner as in the embodiment shown in FIGS. 31A and 31B.

According to the structure shown in FIGS. 33A and 33B, the voltage clump transistor 4'' and 5'' can be manufactured simultaneously in the process for manufacturing other MOSFETs 4 and 5. In other words, the circuit can be formed without increase in manufacturing steps.

Figure 34:
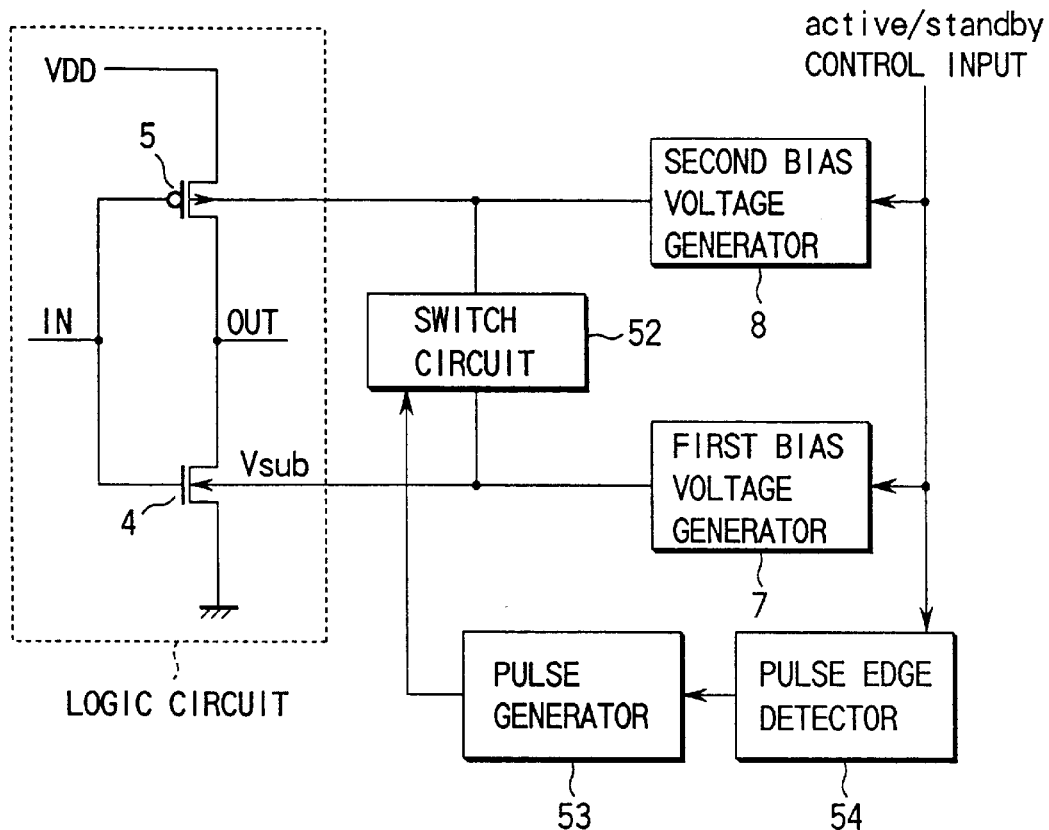
FIG. 34 is a view illustrating a circuit structure of the semiconductor device in the fourth embodiment.

FIG. 34 shows an example in which a switching circuit 52 for a short circuit of the above-mentioned two wells is provided to fix the voltage difference between the wells. In FIG. 34, an active/standby control input is connected to a detecting circuit 54 for detecting an edge caused by the change from an active state to a standby state or vice versa. The output thereof is connected to a pulse generating circuit 53. The output thereof is connected to an input of the switching circuit 52.

Figure 35:
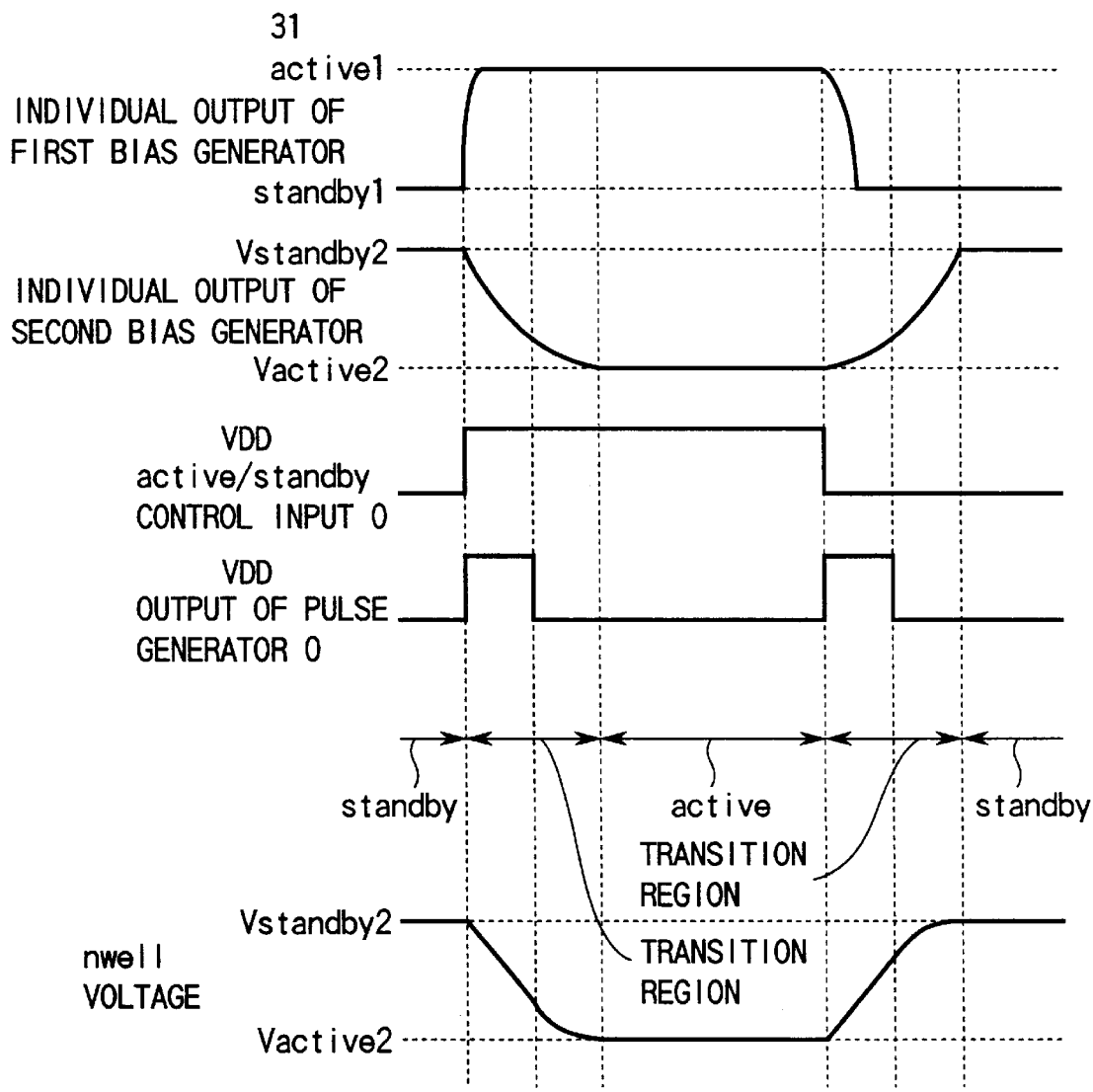
FIG. 35 is a timing chart of the semiconductor device in the fourth embodiment.

As shown in a timing chart of FIG. 35, when the active state is transited to the standby state or vice versa, this switching circuit 52 works to short-circuit the voltages of the wells to make the voltages at the n-type well 32 and the p-type wells 31 equal. For example, at standby state, the p-type well 31 is biased more negatively to the n-type well 32. Consequently, as active state, the voltage at the n-type well 32 is reduced to prevent under-shoot and over-shoot by capacitive coupling between the wells, as compared with the case in which the wells are not connected to each other.

Of course, the pulse generating circuit may a circuit wherein a pulse width is modulated using an output voltage as a control input, as well as a one-shot pulse generator for generating a constant pulse width.

Because the capacitors formed between both the wells are short-circuited in the above-mentioned fourth embodiment, the amount of the charge which is discharged to the power supply line is less than in the case in which a bias circuit is formed independently, so as to keep high reliability against electromigration and make the power supply line finer.

It is also possible to reduce the amount of the charge supplied by an external power supply at switching the active state and the stanedby state, thereby reducing an electric power to be consumed, and to reduce power supply noise, thereby realizing a lower noise generating circuit.

Figure 36:
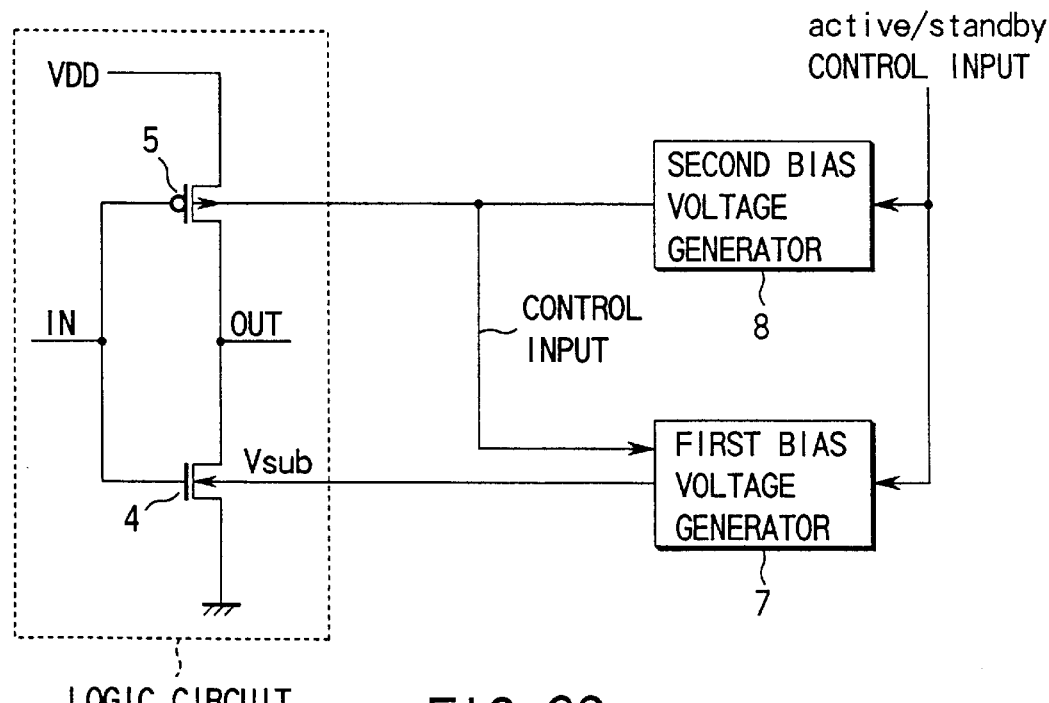
FIG. 36 is a view illustrating a circuit structure of the semiconductor device in the fourth embodiment.

In other modification, as in shown in FIG. 36, for example, the well voltage of the second bias generator 8, which is the output of the circuit 8, is inputted to the other bias generator, i.e., the first bias generator 7 so as to control the output of the first bias generator 7. Thus, drivability of the first bias generator 7 may be controlled. The second bias generator 8 may be having, e.g., a charge pump circuit.

The frequency or duty ratio of its oscillator may be used as a voltage control input.

The present invention is not limited to the above-mentioned embodiments. The description of the embodiments is mainly about the p-type well 31 and the n-type well 32 formed on the p-type layer 47, but the similar description for CMOS circuits is also applied to the p-type well 31 and the n-type well 32 formed on the n-type layer 47.

In the embodiments 1 to 4, the insulation films 38, 40 and 43 may be formed by the oxide film forming method using thermal oxidation or introduction of oxygen at a low accelerating energy, e.g., about 30 kV, the method for depositing an insulation film, the method for depositing silicon nitride, or combination thereof. All of the element isolation film or the insulation film used in the embodiments may be formed by methods for converting silicon into a silicon oxide film or a silicon nitride film other than the above-mentioned methods, for example, the method for introducing oxygen ion into a deposited silicon, or the method for oxidizing deposited silicon. For this insulation film, there may also be used a single layer of a ferroelectric material or paraelectric film or multiple layers thereof, such as tantalum oxide, titanium oxide, titanate strontium, titanate barium, an titanate zirconium lead films, as well as a silicon nitride film.

In the embodiments 1 to 4, the element isolation 38 is a trench isolation. It may be a LOCOS element isolation. It may be also formed by the recessed LOCOS or improved LOCOS method or the field shield isolation method or combination thereof.

In the embodiments 1 to 4, the semiconductor structure is formed on the p-type Si substrate. Alternatively, the substrate may be an n-type Si substrate, a GaAs substrate or an InP substrate.

The wiring 39 and the gate electrode 41 may be not only polycrystal silicon, but also monocrystal silicon, porous silicon, or amorphous silicon. It may be also SiGe mixed crystal, or a metal or a silicide such as GaAs, W, Ta, Ti, Hf, Co, Pt, or Pd. Laminated layers thereof may be used.

Embodiment 5

Figure 37:
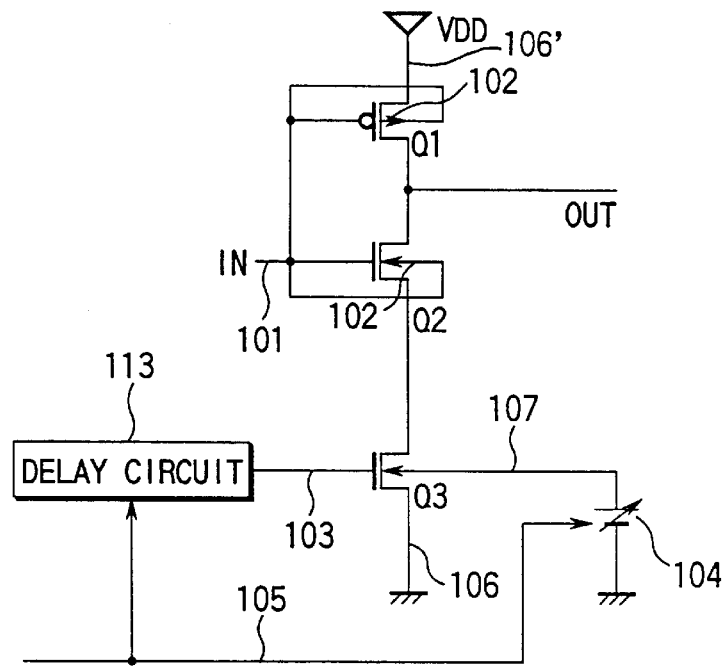
FIG. 37 is a view illustrating a circuit structure of an inverter in the fifth embodiment.

FIG. 37 illustrates an example of a circuit structure of an inverter according to the fifth embodiment of the present invention. In FIG. 37, in an n-type MISFET (Q2) a gate electrode and a substrate electrode are connected to each other to form a GST transistor. In the following embodiment, the electrode referred to as the substrate electrode for simplification may be a body electrode in a partially depleted transistor on an SOI (Silicon-On-Insulator) structure or a back gate electrode below a channel.

In FIG. 37, a source electrode of Q2 is connected to a drain electrode of an n-type MISFET transistor (Q3) for reducing a leakage current. A source electrode of the Q3 is connected to a current supply node 106. A substrate electrode of Q3 is connected to a substrate voltage supply node 107. The voltage of this node 107 has two stationary values at active and standby states. The node 107 is connected to, e.g., a voltage supply 104. The voltage supply 104 is connected to a control input node 105 for controlling a state into active or standby one.

The control input node 105 is connected through a delay circuit 113 to a node 103, and the node 103 is connected to a gate electrode of Q3. The voltage of this node 103 is $V_{active}$ when the substrate voltage is within the range corresponding to active state. The voltage of the node 103 is $V_{standby}$ when the substrate voltage becomes more negative and is outside the above-mentioned range to make high-speed operation impossible because of a rise in the threshold voltage. Thus, this node 103 can be used for an active/standby control signal for ensuring active operation of a circuit in which high-speed operation is required.

The transistor Q3 is a circuit for switching the source voltage of the transistor Q2. It is possible to make a leakage current small during standby state by raising the threshold voltage during standby state of Q3 to a higher value than the threshold voltage of Q2. In order to improve electric current drivability of Q3, it is desirable to make the threshold voltage during active state of Q3 lower than the threshold voltage of Q2.

A drain electrode of Q2 is connected to a source or drain electrode of Q1. A gate electrode of Q1 is connected to a gate electrode of Q2. Q1 constitutes a MISFET using conductive carriers, which are different from those used in Q2, i.e., a p-type MISFET. Thus, Q1 and Q2 constitute a CMOS inverter.

Figure 38:
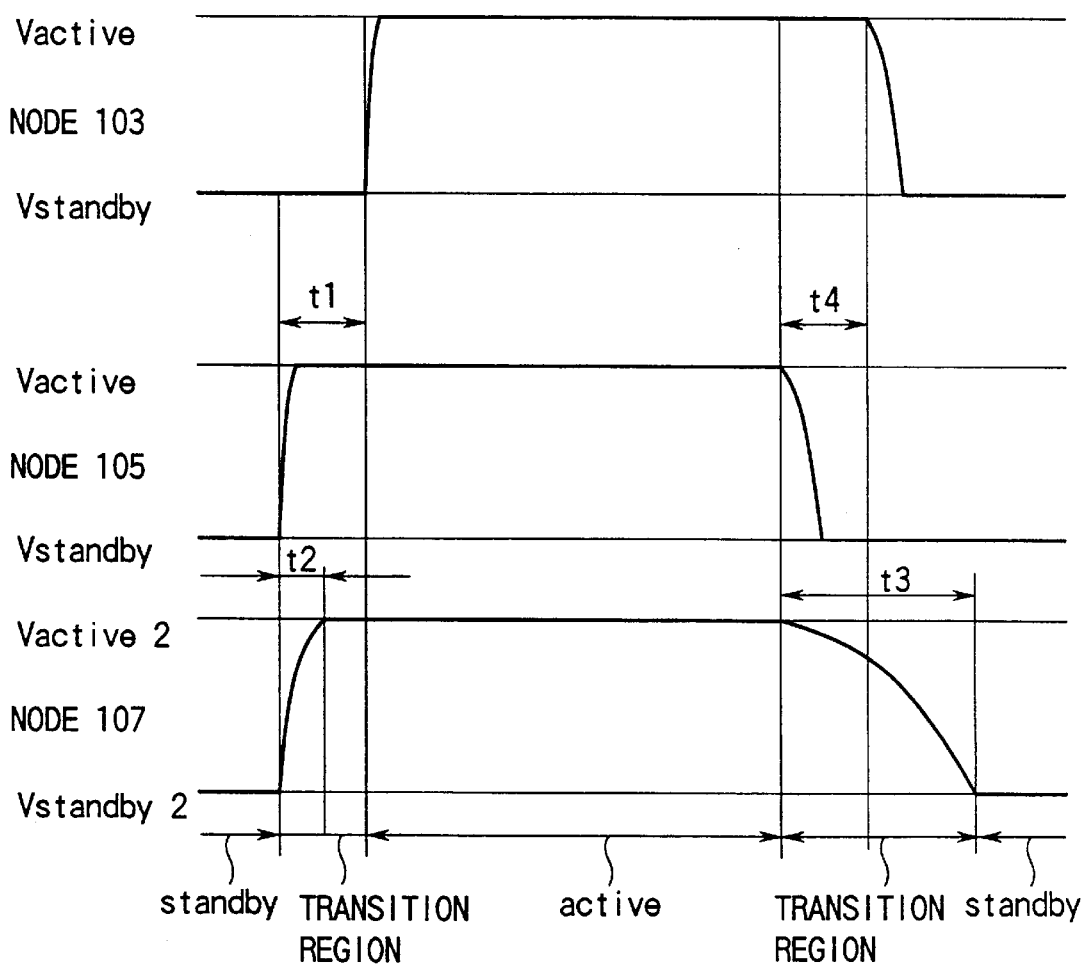
FIG. 38 is a view showing an operation timing of the fifth embodiment.

The following will describe operation of the present circuit referring to FIG. 38. It is assumed that the voltage of the control node 105 is changed from the voltage during standby state to that during active state. It is desirable that the voltage of the control node 105 during standby state and active state is between 0V and $V_{DD}$, because it is consistent with the voltages of other logic circuits and consequently voltage level shifter is unnecessary. For example, the voltage $V_{standby}$ during standby state is set to 0V and the voltage $V_{active}$ during active state is set to $V_{DD}$. Thus, the output voltage of the power supply 104, that is, the voltage of the node 104 is changed from $V_{active2}$ during active state to $V_{standby2}$ during standby state so that the substrate voltage and the source electrode are more biased in the backward.

To keep high electric current drivability and reduce a leakage current, it is desirable that the voltage difference of the node 107 between $V_{active2}$ and $V_{standby2}$ is higher than $V_{DD}$. It is desirable that the substrate bias is applied at a level of, e.g., $-3V_{DD}$ to 0V during standby state and at a level of about 0V to about 0.25V during active state.

Figure 39:
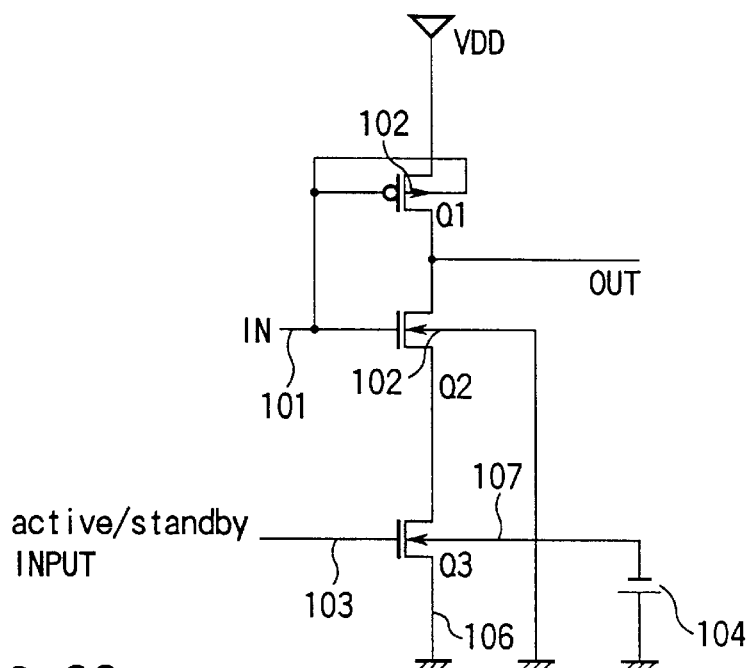
FIG. 39 is a view illustrating a prior multi-threshold CMOS.

FIG. 39 shows a prior example in which the substrate biases of Q2 and Q3 are fixed. The threshold voltages of Q2 and Q3 are represented by $V_{th1}$ and $V_{th2}$, respectively, and the channel widths of them are represented by $W_1$ and $W_2$, respectively. The following will explain that in the prior art it is difficult to reduce subthreshold leakage current, keep $W_2$ small and make the chip region small. In FIG. 39, a source electrode of an n-type MISFET (Q2) is connected to a drain electrode of an n-type MISFET (Q3) for reducing a standby leakage current. A source electrode of Q3 is connected to a current supply node 107. A substrate electrode of Q3 is connected to a substrate voltage supply node 107. The node 107 is connected to a power supply whose voltage is not changed between active state and standby state, for example, to a power supply 104. A node 103 is connected to an active/standby control input to become $V_{DD}$ during active state and become 0V during standby state.

The prior structure is know in, for example, a literature (S. Mutoh et al. "1-V Power Supply High-Speed Digital Circuit Technology with Multi-Threshold Voltage CMOS", IEEE J. Solid-State Circuits, vol. 30, No. 8, pp. 847–854, Aug., 1995). Differences of this prior structure from the present invention are that the voltage of the substrate voltage node 107 of Q3 is connected to the voltage supply 104 and is fixed so that the threshold $V_{th2}$ of Q3 is fixed, and that the substrate voltage of Q2 is fixed and the threshold $V_{th1}$ is also fixed.

Figure 40:
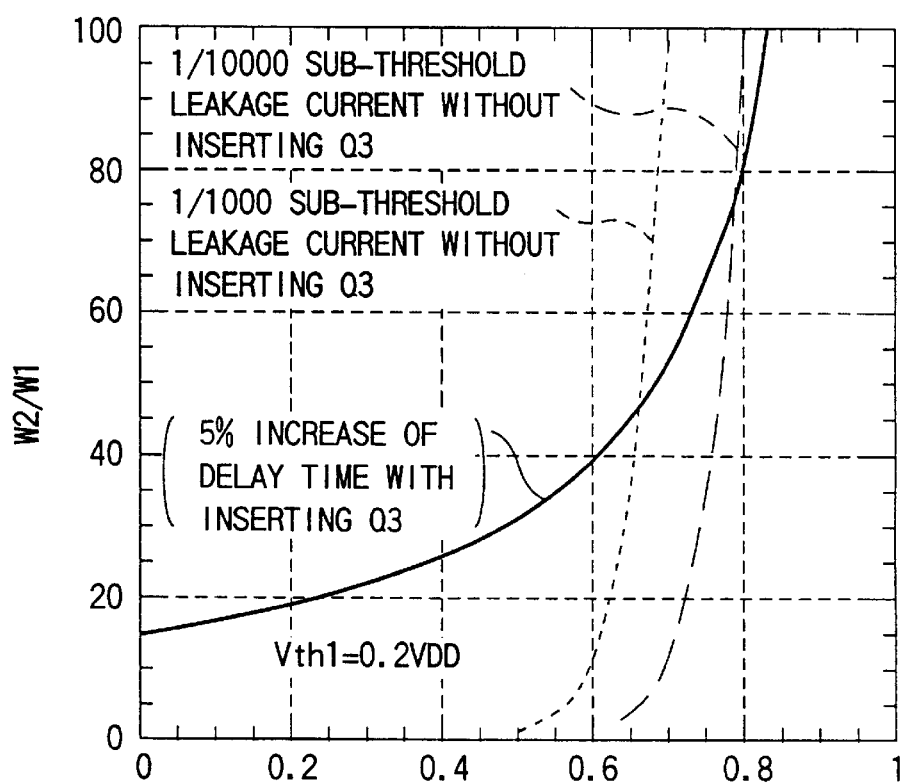
FIG. 40 is a channel relative dependency on the threshold when leak cut-off transistor is inserted.

FIG. 40 shows the simulation result of a necessary channel width ratio $W_2/W_1$, wherein the substrate bias effect by a rise in the source voltage of Q2 is ignored, when $V_{th1}$ is $0.2V_{DD}$ and the subthreshold swing coefficients of Q2 and Q3 are 100 mV/decade, respectively. To reduce the electrical power consumed by a subthreshold leakage current during active state to a very small percentage, for example, about 10% of the electrical power consumed by charging-current of the load capacitance of the CMOS inverter of Q1 and Q2, and to shorten delay time of the inverter, hitherto $V_{th1}$ has been typically selected from $0.1V_{DD}$ to $0.3V_{DD}$. Thus, the $V_{th1}$ is set to $0.2V_{DD}$ herein.

The horizontal axis in FIG. 40 represents the threshold voltage $V_{th2}$ of Q normalized by the power supply voltage $V_{DD}$, and the vertical axis represents a the channel width of Q3 normalized by the channel width of Q2. When Q3 is inserted, the series resistance at the source side of Q2 increases and the saturation current of Q2 decreases so that gate delay time increases. The requirement for keeping by 5% increase in the gate delay time of the case wherein Q3 is not inserted is shown by the solid line in FIG. 40. The dotted line in FIG. 40 shows the requirement for reducing the leakage current during standby state to 1/1000 of the case wherein Q3 is not inserted.

To satisfy these requirements, it is necessary that the channel width ratio $W_2/W_1$ is 45 or more. Thus, the region of Q3 is larger than that of Q2, so that it is difficult to enhance an integrated scale. The broken line in FIG. 40 shows the requirement for reducing the leakage current during standby state to 1/10000 of the case wherein Q3 is not inserted. To satisfy these requirements, it is necessary that the channel width ratio $W_2/W_1$ is 70 or more. Thus, in the prior art it is difficult to keep a subthreshold leakage current small and enhance an integrated scale.

On the contrary, in the present embodiment shown in FIG. 37, a GST transistor is used for Q2. For this reason, when the positive voltage $V_{DD}$ is applied to the a gate in this structure, a positive voltage is also applied to the substrate. Thus, at this time, the threshold voltage is reduced by a substrate bias effect in comparison with the case wherein the substrate voltage is kept 0V, and electric current drivability rises during active state. When the gate voltage is 0V, the substrate voltage also is 0V. Therefore, the leakage current is one when the substrate bias voltage is kept 0V. Therefore, the ON/OFF ratio is improved in comparison with the prior art in which the substrate voltage of Q2 is fixed to a constant value. It is possible to set the threshold voltage so as to reduce the subthreshold leakage current during active state and improve electric current drivability during active state.

As compared with the prior art shown in FIG. 39 in which the substrate bias of Q3 is not changed, in the present embodiment the substrate bias of Q3 is controlled during active state and the substrate bias voltage is applied so that the voltage during active state of the substrate electrode is more directed toward the forward direction than that during standby state. Thus, it is possible to lower the threshold voltage of Q3 during active state and raise it during standby state by a substrate bias effect. Accordingly, even if during active state the threshold voltage Q3 is lowered and the channel width ratio $W_2/W_1$ is small, increase in the series resistance at the source side of Q2 can be prevented. Increase in gate delay time can be also controlled. Furthermore, it is possible to enlarge an integrated scale by decreasing the region of Q3.

It is also possible to raise the threshold voltage of Q3 and keep a subthreshold leakage current small during standby state. FIG. 40 demonstrates that, e.g., when $W_2/W_1$ is 20, the threshold voltage of Q3 during standby state is $0.8V_{DD}$, and that of Q3 during active state is $0.1V_{DD}$, the leakage current during standby state can be 1/10000 or less of that when Q3 is not inserted and the current drivability during active state can be kept 95% or more of that when the Q3 is not inserted. It is very difficult to obtain the property of a low leakage current as standby state and a high current drivability during active state, in the transistor in which the substrate bias voltage is fixed and the gate voltage of the leakage current cut-off transistor Q3 changes between 0V and $V_{DD}$.

As described above, use of the structure of the present embodiment makes it possible to realize a circuit for accomplishing both reduction of the electrical power consumed by the leakage current and high-speed operation. Thus, it is possible to reduce a penetration current at both of standby state and active state and obtain high electric current drivability in the structure of the present invention in which GST transistor is connected in series to the substrate bias changing transistor, in comparison with the prior structure in which transistors whose substrate bias is not changed are connected in series to each other. In the present embodiments, the voltage of the node 103 connected to the gate electrode of Q3 is from 0V to $V_{DD}$. Thus, it is limited within the voltage range which is used for the logic circuit. Accordingly, any bias generator for applying a voltage to the gate electrode is unnecessary so that fewer elements can easily constitute the circuit, as compared with the sixth embodiment which will be described later.

In the present embodiment, the gate voltage is limited to the range from 0V to $V_{DD}$ and the drain voltage is limited to the range from 0V to $V_{DD}$, so that the absolute value of the voltage applied to the gate insulation film of the Q3 is limited to $V_{DD}$ or less at the drain terminal. As a result, problems occur less frequently such as dielectric breakdown due to an applied voltage and increase in a tunnel leakage current of the gate insulation film, as compared with the sixth embodiment.

In the present embodiment, the substrate electrode node 107 generally has a larger capacitance than the gate electrode node 103 and the electric supply ability of the voltage supply 104 is smaller than that of the nodes 106 and 106' for supplying the voltages 0V and $V_{DD}$, thereby resulting in time delay t2 for charging the capacity till the active state becomes stationary. The delay circuit 113 shown in FIG. 37 is one for preventing increase in delay time caused by insufficient application of the substrate bias of the circuit working at the active voltage. The prevention is caused by setting the voltage of the gate electrode into the voltage of its active state after the voltage of the substrate electrode node 107 becomes a sufficiently stationary, active voltage. For stable operation, it is desirable that the delay time t1 is longer than t2. Thus, introduction of the delay circuit is desired.

In the case of generating the negative voltage $V_{standby}$, electric current drivability is in general smaller than the case of generating $V_{active2}$. Therefore, the time t3 during which the active state is changed to the standby state is far longer than time t2 during which the standby state is changed to the active state. The delay time of a circuit for changing a substrate bias is measured (see, e.g., T. Kuroda et al., "A 0.9V 150 MHz 10 mW 4 mm$^2$ 2-D-Descrete Cosign Transform Core processor with Variable Threshold-Voltage Scheme", IEEE, Journal of Solid-State Circuit, Vol. 31, No. 11, pp. 1770–1779). It reports that, e.g., t2 is 1 μs or less and t3 is 100 μs or more. Thus, it is possible to reduce the penetration current flowing through Q3 during time when the active state is transited to the standby state by shortening the transition time t4 when the active state is transited to the standby state of the delay circuit 113 in comparison with the t3.

Figure 41A:
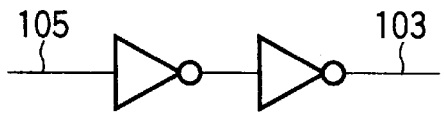
FIGS. 41A to 41C are views of examples of delay circuits of the fifth embodiment.
Figure 41B:
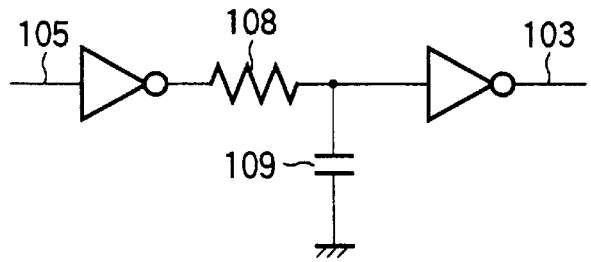
Figure 41C:
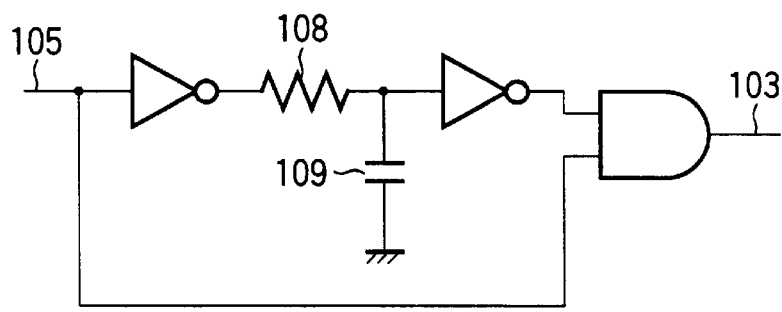

FIGS. 41A to 41C show examples for realizing the delay circuit 113. For example, two or even-numbered inverters may be in series-connected to cause time delay t1 by gate delay, as shown in FIG. 41A. As shown in FIG. 41B, a delay circuit having, e.g., RC (a resistor 108 and a capacitor 109) may be introduced between the inverters shown in FIG. 41A. As shown in FIG. 41C, time t4 when the voltage of a node 103 changes from $V_{active}$ to $V_{standby}$ is made shorter than time t3 when the voltage changes from $V_{standby}$ to $V_{active}$, by the product with an input node 105.

Figure 42:
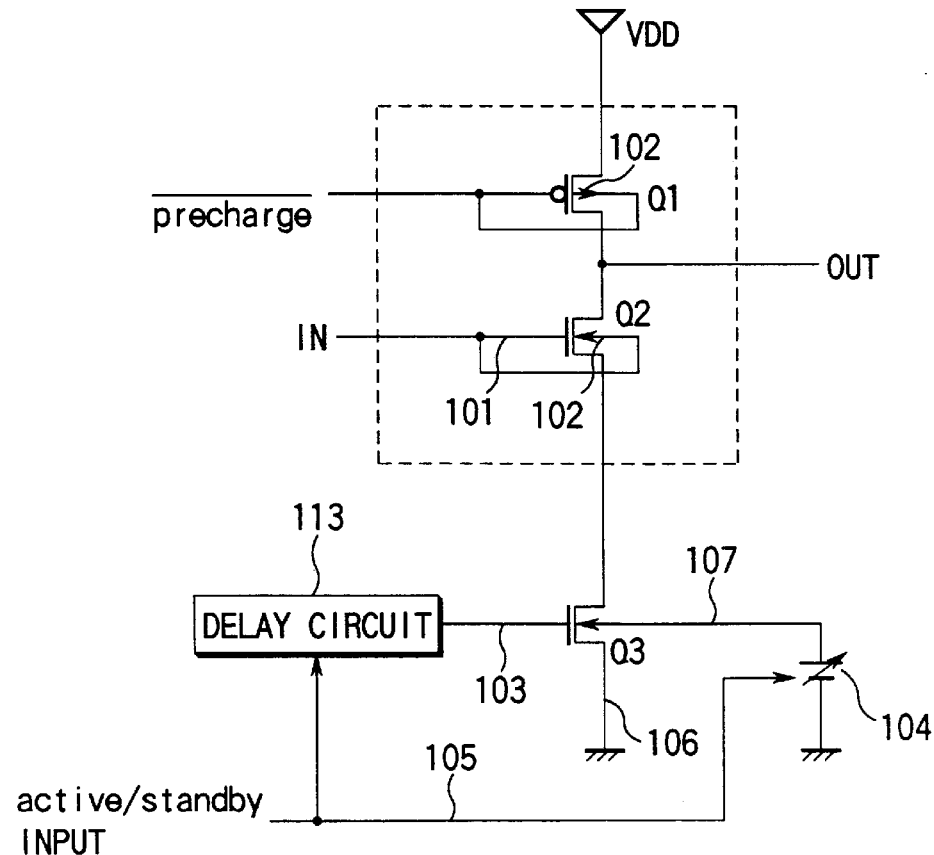
FIG. 42 is a view illustrating a modification 1 of the fifth embodiment.

FIG. 42 illustrates a modification 1 of the present embodiment. This modification 1 is different from the above-mentioned structure in the circuit structure of Q1. In the modification 1, a gate electrode of Q1 is connected to a substrate electrode 102 to constitute a GST transistor, and its input is connected to a precharge inversion input. The block surrounded by a dotted line constitutes a dynamic inverter. The dynamic inverter is known publicity in, e.g., a literature (S. Thompson et al., 1997 "Symposium on VLSI Technology Digest of Technical Papers, p. 69").

In this circuit, at first the voltage at the precharge inversion input is lowered to make the transistor of Q1 conductive, after which the voltage at the precharge inversion input is raised to make the transistor of Q1 a cut-off state, thereby accumulating charges in the connection node of Q1 and Q2. After that, a logic signal is provided to the input of Q2, so as to discharge the charges in the connection node by Q2 in accordance with the logic signal. Thus, an output signal is obtained which is a inverted signal of the input. In the modification 1, it is possible to reduce a penetration current at both standby state and active state and maintain electric current drivability during active state, in the same manner as in the above-mentioned basic embodiment. The modification has the characteristics of the dynamic inverter, that is, the characteristics that the input needs to drive only the capacitor of the gate of Q2 but not to drive the gate capacitor of Q1 and that high-speed operation can be realized.

Figure 43:
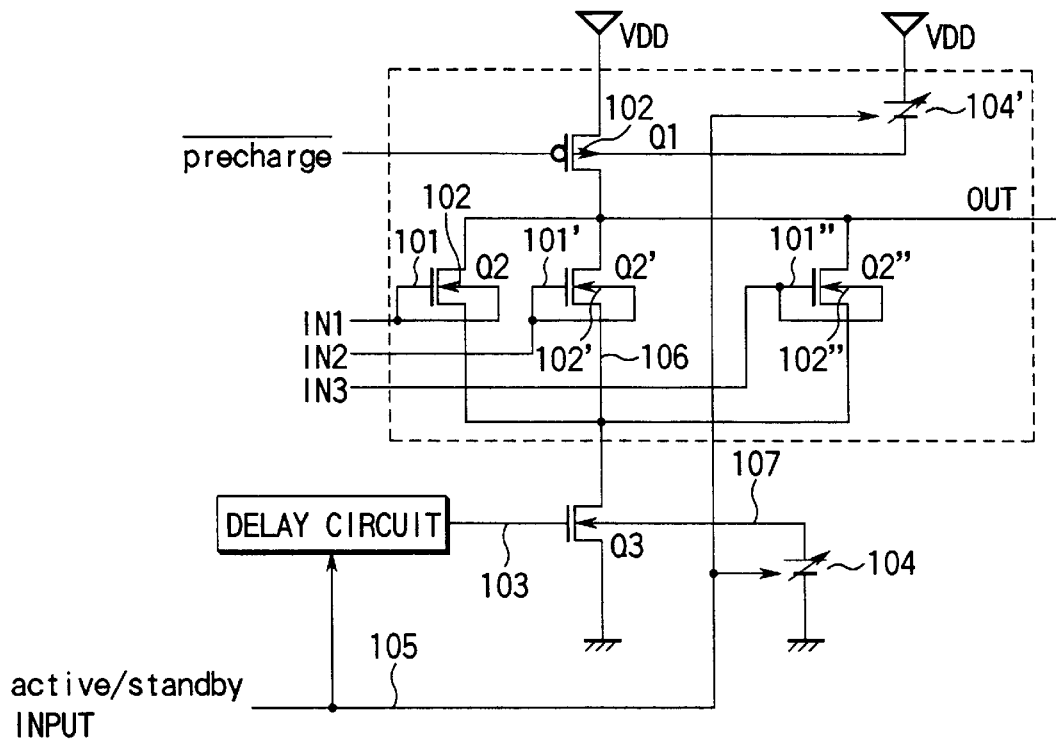
FIG. 43 is a view illustrating a modification 2 of the fifth embodiment.

FIG. 43 illustrates a modification 2 of the present embodiment. The modification 2 relates to the same dynamic circuit as the modification 1. GST transistors Q2, Q2' and Q2" are in parallel connected to each other, so that a source electrode of Q2 is connected to source electrodes of Q2' and Q2" and a drain electrode of Q2 is connected to drain electrodes of Q2' and Q2". This structure causes realization of 3 input-NOR in which IN1, IN2 and IN3 are inputs. The modification is different from the modification 1 in that a substrate bias changing transistor is used as Q1, instead of the GST transistor. This makes it possible to reduce a pn-junction forward leakage current flowing from the connection node of Q1 and Q2 to a substrate node through a drain electrode of Q1 when Q1 becomes a conductive state.

Figure 44:
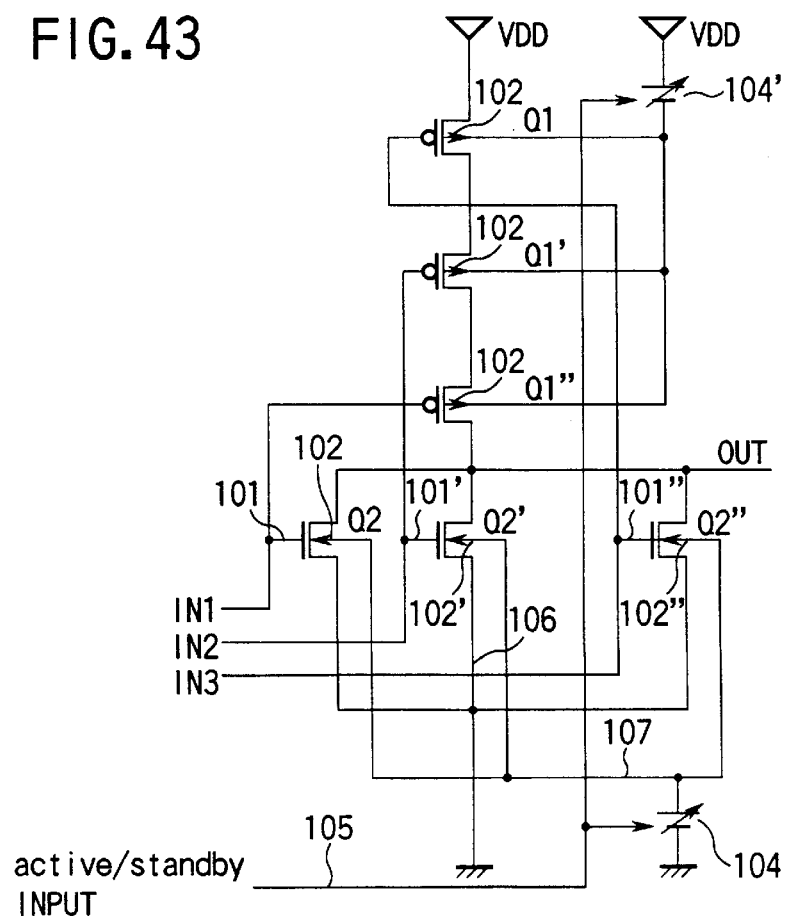
FIG. 44 is a view illustrating a static 3 input NOR circuit, which is compared with the modification 2 shown in FIG. 43.

FIG. 44 shows a prior static 3 input-NOR circuit for comparison about characteristics with the modification 2. In the prior multi-input (n inputs in the example) NOR circuit, the channel width of a p-type MISFET (Q1) needs to be kept about n times as wide as that of a one-input inverter when rising delay time is equal to falling delay time and the channel width of Q2 is the same as that of the inverter.

This is because, for example, in FIG. 44 Q1, Q1' and Q1" are in series-connected and consequently the channel resistance per unit channel width is about 3 times as much as that in the case of only single Q1. Since electric current drivability per unit channel width of a p-type MISFET is lower than that of a n-type MISFET, it is necessary to prepare a p-type MISFET having a width, for example, of from 1.3 to 2 times as large as that of a width of an n-type MISFET. Thus, the input capacitance of the multi-input static NOR circuit shown in FIG. 44 is larger than that in the modification 2 shown in FIG. 43 because of increase in the gate capacitance of the p-type MISFET.

Figure 45:
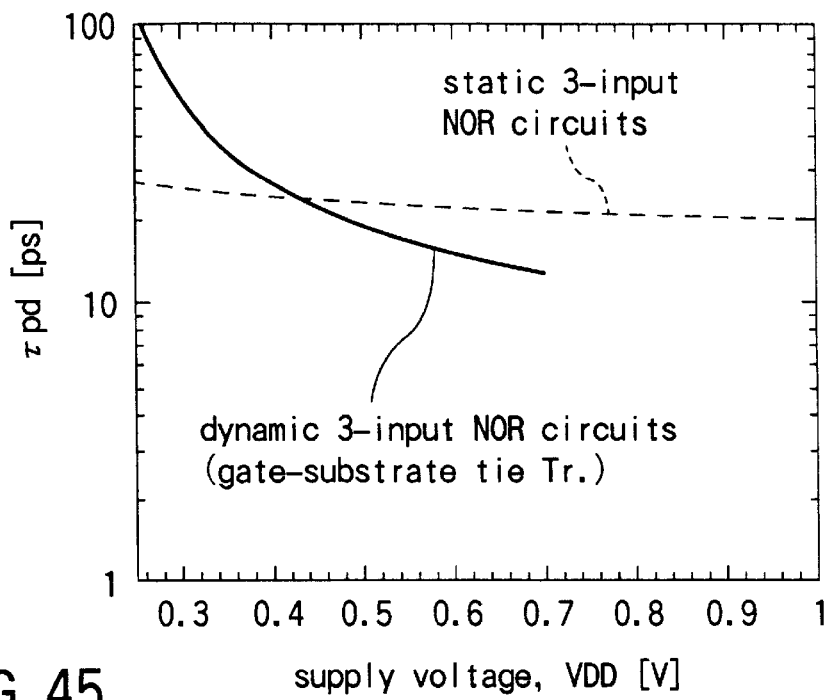
FIG. 45 is a view illustrating dependency of the delay time of the NOR circuits shown in FIGS. 42 and 43 on the power supply voltage.

FIG. 45 shows the result obtained by comparison of gate delay time to an input, when the respective circuits shown in FIGS. 43 and 44 are driven by inverters of fan-out 1 and the power supply voltage $V_{DD}$ is changed. In FIG. 45, a solid line represents delay time of the dynamic circuit shown in FIG. 43, and a broken line represents delay time of the static circuit shown in FIG. 44. It is assumed that the threshold of the dynamic circuit Q2 is 0.3V and that of the static circuit Q2 is $0.2V_{DD}$ or less. In the dynamic circuit, the threshold voltage is higher and the subthreshold current flowing through Q2 during active state is smaller. As shown in FIG. 45, under this condition, in the dynamic circuit shown in FIG. 43, delay time is shorter within the range from 0.5V to 0.7V. It is understood that the electrical power to be consumed can be low and high-speed operation can be realized.

Figure 46:
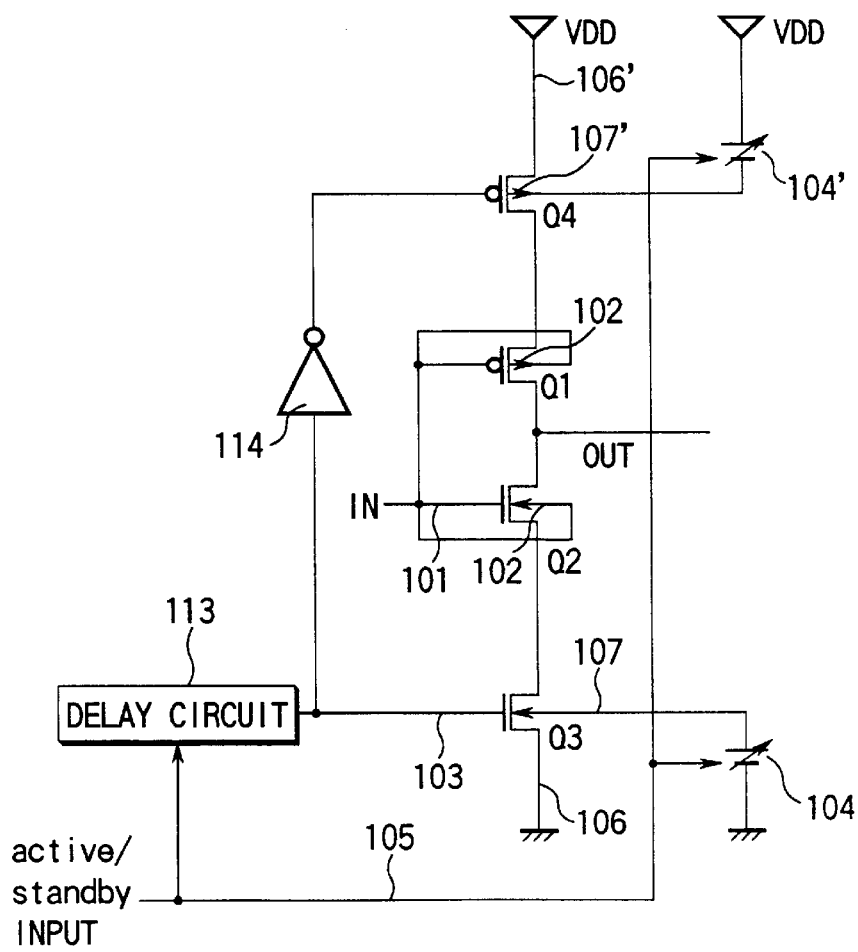
FIG. 46 is a view illustrating a modification 3 of the fifth embodiment.

FIG. 46 illustrates a modification 3 of the present embodiment. In addition to the present embodiment, in the modification 3, a source electrode of a p-type MISFET (Q1) is connected to a drain electrode of a p-type MISFET (Q4), and a source electrode of Q4 is connected to a current supply node 106', A substrate electrode of Q4 is further connected to a substrate voltage node 107'. The voltage of the node 107' has two stationary values during active state and standby state, and is electrically connected to, for example, a voltage supply 104'. The voltage supply 104' is connected to a control input node 105 for controlling a state into active or standby one. A gate electrode of Q4 is connected through an inverter 114 to a node 103.

When the substrate voltage is within the range of range of active state, the voltage of node 103 is $V_{active}$, and when the substrate voltage becomes more negative and is out of the range so that high-speed operation cannot be carried out because of a rise in the threshold voltage, the voltage of the node 103 is $V_{standby}$. Thus, this node 103 can be used for an active/standby control signal for ensuring active operation in a circuit in which high speed operation is required.

The transistor Q4 is a circuit for switching the source voltage of the transistor Q1. It is possible to make a leakage current at a standby state small by raising the threshold voltage during standby state of Q4 over that of Q1.

The modification 3 can be applied to a random logic circuit in which its input is indefinite during standby state, because leakage current cut-off transistors Q3 and Q4 are introduced to the respective source terminals of Q1 and Q2. Of course, even if the leakage current cut-off transistor Q4 is introduced to only the p-type MISFET Q1, it is possible to reduce the leakage current about Q1.

Figure 47:
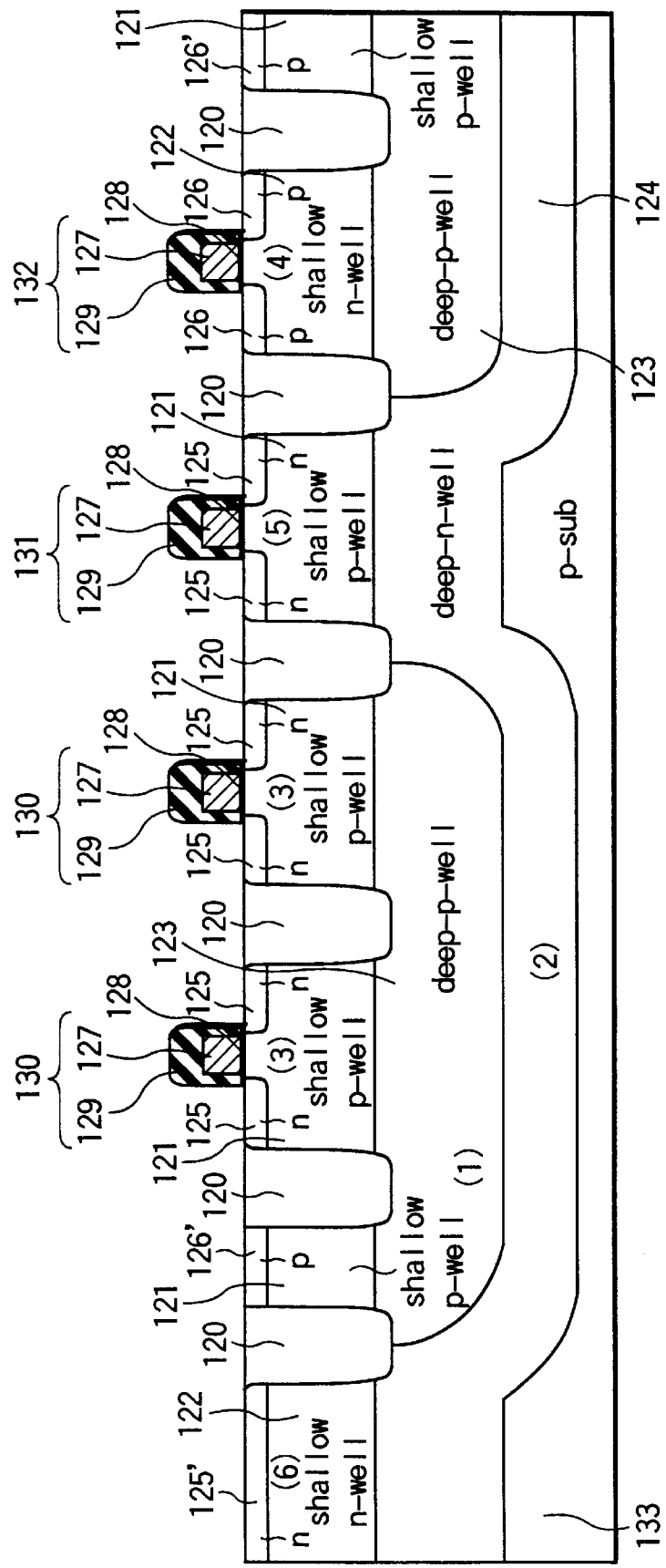
FIG. 47 is a cross section of a well structure for realizing the fifth embodiment.

FIG. 47 is a cross section of an example in which the structure of the present embodiment is embodied on a semiconductor p-type substrate 133. In FIG. 47, references numbers 130, 131 and 132 represent substrate bias changing transistors, a GST transistor having an n-type MISFET, and a GST transistor having a p-type MISFET, respectively. These are formed on one semiconductor p-type substrate 133.

In FIG. 47, reference number 120 denotes element isolation regions having, e.g., $SiO_2$ or SiN. The element isolation regions 120 are formed so that they have such depth that p-type well regions 121 and n-type well regions 122 can be se isolated. The depth is within, for example, the range from 0.01 to 2 μm. Inside the wafer of the regions 121 and 122, deep p-type well regions 123 and a deep n-type region 124 are further formed. These regions 123 and 124 are for isolating the wells between the transistors 131, between the transistors 132, and between the transistor 131 and the transistor 132.

In the GST transistor region, under the p-type well regions 121 the n-type well region 124 is formed so that the regions of 121 and 124 contact each other. Under the n-type well regions 122, the p-type well regions 123 are formed so that the regions contact each other. In the GST transistor region, the p-type well regions 121 and 123 are formed separately, and the n-type well regions 122 and 124 are formed separately. This structure makes it possible to apply a substrate bias to the respective p-type well regions 121 and n-type well regions 122 independently, in the GST transistor region.

In the n-type MISFET 30, under the p-type well regions 121 the p-type well regions 123 are formed so that they contact each other. The p-type well regions are formed in series under the neighboring MISFETs 130 so that a substrate bias is commonly supplied to the two MISFETs. As not shown in FIG. 47, under the n-type well regions 122 the n-type well regions 124 are formed so that they contact each other. The n-type well regions are formed in series under the neighboring p-type MISFET substrate bias changing transistors, so that a substrate bias can be commonly supplied to the plural MISFETs.

In order to constitute the MISFETs, on the surface of the substrate, formed are gate insulation films 128, gate electrodes 127 and insulator regions 129 for keeping insulation between the gate electrodes and the source/drain electrodes to make a parasite capacitance small. In the n-type MISFETs 130 and 131, n-type layers 125 which are functioned as source/drain electrodes are formed at the both outsides of the gate electrodes 127. In the portion in which a p-type MISFET 132 is formed, p-type layers 126 which are source and drain electrodes are formed at both outsides of the gate electrode 127. As shown at the right end of FIG. 47, shallow p-type well regions 121 and p-type layer 126' are formed to apply an electric bias to the deep p-type well regions 123. As shown at the left end of FIG. 47, shallow n-type well regions 122 and a n-type layer 125' are formed to apply an electric bias to the deep n-type region 124.

In the present embodiment, the deep n-type well region 124 of the GST transistor is connected to the deep n-type region 124 of the substrate bias changing transistor. Of course, however, they may be isolated. In the isolated structure, independent voltages can be applied to respective deep n-type well regions 124.

The characteristic of the present embodiment which prior arts do not have is that the n-type well region 124 is formed between the p-type well regions 123 and the p-type substrate 133, so that a voltage can be applied to the regions 123 independently on the p-type substrate 133. In this structure, the voltage at the n-type well region 124 is higher (e.g., 0.1 to 1V) than the p-type well regions 121 in which the GST transistor 131 is formed, reverse bias is applied to them, and the pn-junction capacitance between the regions 121 and 124 is kept small, thereby keeping a parasite capacitance small to enable high-speed operation.

The voltage at the p-type well region 123 is lower (e.g., 0.1 to 1V) than the n-type well region 122 in which the GST transistor 132 is formed, reverse bias is applied to them, and the pn-junction capacitance between the regions 122 and 123 is kept small, thereby keeping a parasite capacitance small to enable high-speed operation of the transistor.

These can be set about their voltages independently on the substrate 133. The respective p-type well regions 123 and the respective n-type well regions 124 can be electrically isolated. For this reason, minority carriers which generate from other p-type well regions 123 or n-type well region 124 on the same chip do not diffuse to the other wells isolated from them, so as to prevent latching-up and error operation of a software. It is also possible to prevent a problem of latching-up of the respective wells caused by changing the substrate voltage toward the power supply voltage direction, the change being caused by capacitive coupling between the substrate and the circuit or the wiring, in turning the power supply on.

In the present structure, the conductivity type of each of the p-type well regions, the n-type well regions and the p-type substrate may be totally reversed.

The following will describe the process for manufacturing the semiconductor structure in the embodiments, referring to FIGS. 48 to 51. At first, a semiconductor is prepared in which a p-type layer 133 having a boron concentration of $10^{15}$ cm$^{-3}$ is formed. The surface of the semiconductor is then oxidized to form a Si oxide film having a thickness of e.g., 0.01 to 0.05 $\mu$m. On the film, a silicon nitride or silicon oxide film which will be a masking material for trenches is deposited so that its thickness will be, e.g., 0.3 to 0.5 $\mu$m.

Subsequently, element separations 120 having isolated trenches are formed. The depth of the isolated trenches is, e.g., from 0.1 to 2 $\mu$m. After forming the trenches for isolating the elements, an insulation film such as a silicon oxide or silicon nitride film is deposited so that its thickness will be from 0.1 to 4 $\mu$m. Other portions than the element isolation trenches are then removed off by etchback or polishing so that their height will be within the range of ±0.3 $\mu$m in comparison with the height of the interface between the semiconductor substrate 133 and the Si oxide film. After that, the masking material for the trenches is removed off by, e.g., reactive ion etching.

Subsequently, the surface of the semiconductor is oxidized or nitrided so that its thickness will be, e.g., from 0.01 to 0.05 $\mu$m to form a Si oxide or Si nitride film 134. On the whole surface thereof, a resist 135 is applied and a lithographic process is carried out. For example, boron or indium is ion-implanted thereto at an amount of from $10^{13}$ to $10^{16}$ cm$^{-2}$ at a voltage for acceleration of from 30 to 2000 eV to form p-type well regions 123. The implantation depth is such that the p-type layer at least extends below the bottom interface of the element separations 120, and the implantation is carried out so that the p-type well regions are formed in series under the plural element separations 120.

Figure 48:
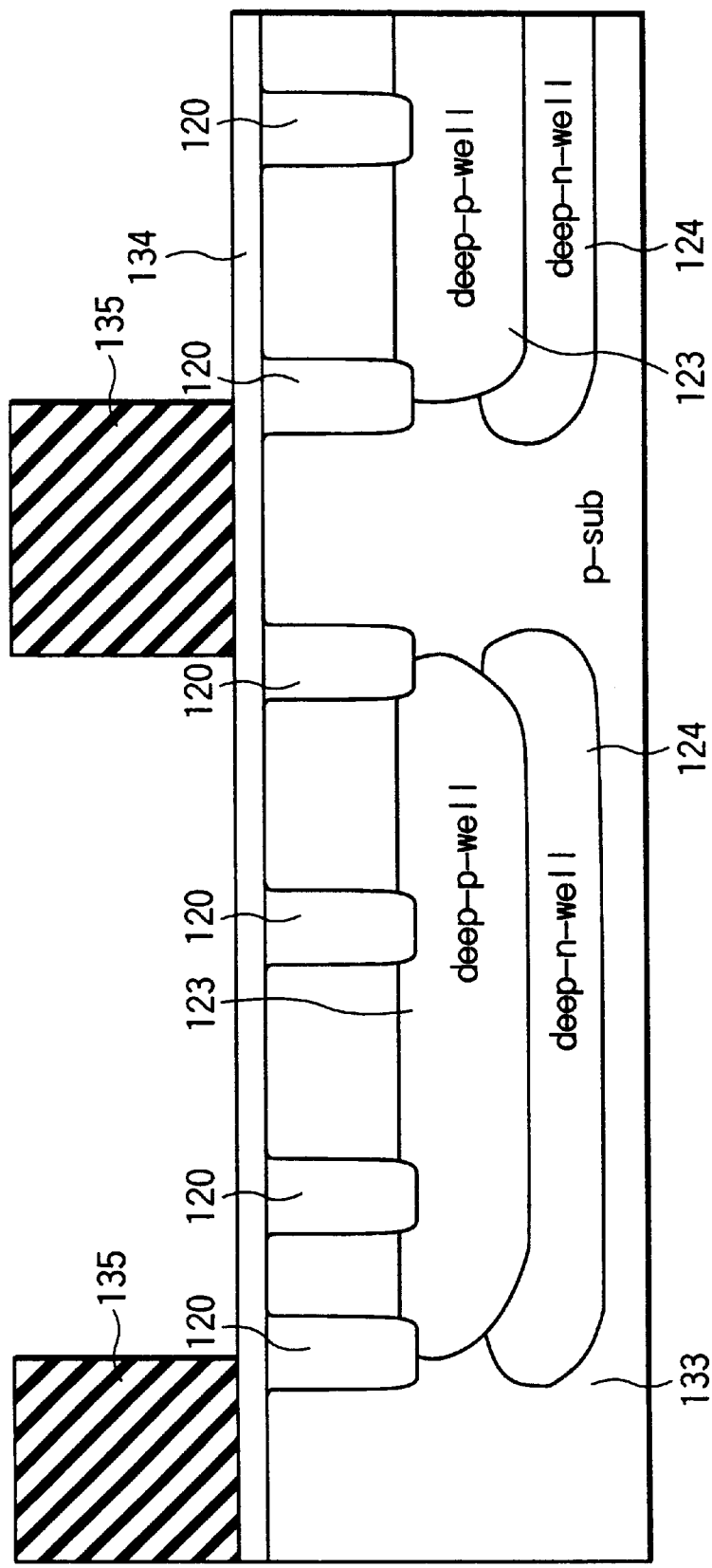
FIG. 48 is a cross section of the step of manufacturing a well structure for realizing the fifth embodiment.

For example, phosphorus or arsenic is ion-implanted thereto at an amount of from $10^{13}$ to $10^{16}$ cm$^{-2}$ at a voltage for acceleration of from 50 to 2000 eV to form an n-type well regions 124 in the more inner region of the substrate than the p-type well regions 123. Phosphorus or arsenic may be implanted as not a single-charged positive ion but double-charged positive ion, with reduction in voltage for acceleration. Thus, a structure having the cross section shown in FIG. 48 is manufactured.

Figure 49:
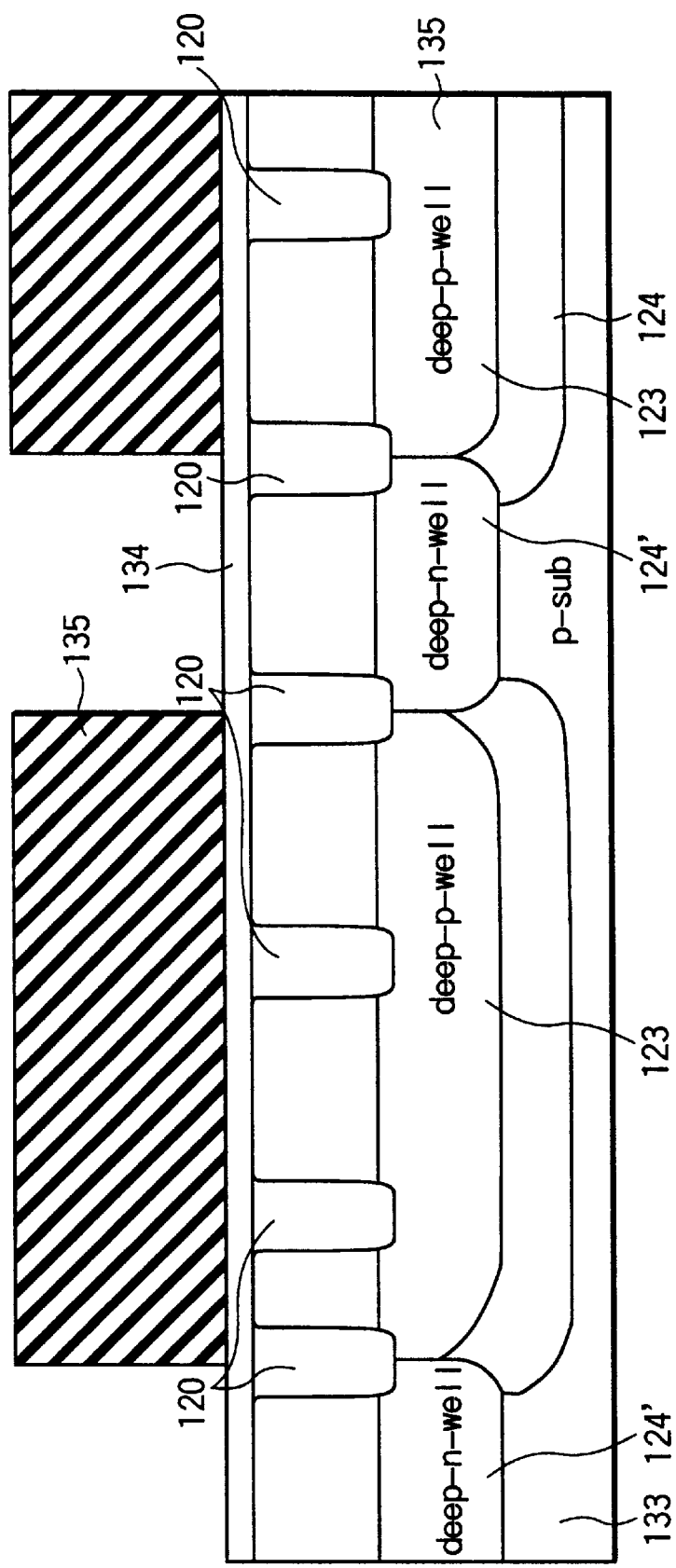
FIG. 49 is a cross section of the step of manufacturing a well structure for realizing the fifth embodiment.

As shown in FIG. 49, a resist 135 is then applied again on the whole surface and a lithographic process is carried out. For example, phosphorus, arsenic or antimony is ion-implanted thereto at an amount of from $10^{13}$ to $10^{16}$ cm$^{-2}$ at a voltage for acceleration of from 30 to 2000 eV to form an n-type well region 124'. The implantation depth is such that the n-type layer at least extends below the bottom interface of the element separations 120. The implantation is carried out so that the p-type well regions 123 are surrounded by the n-type well regions 124 and 124' to be isolated from the p-type substrate 133 electrically. After that, a heating process at 700–1100° C. may be carried out for from 10 seconds to 60 minutes, in order to remove ion implantation damages.

Figure 50:
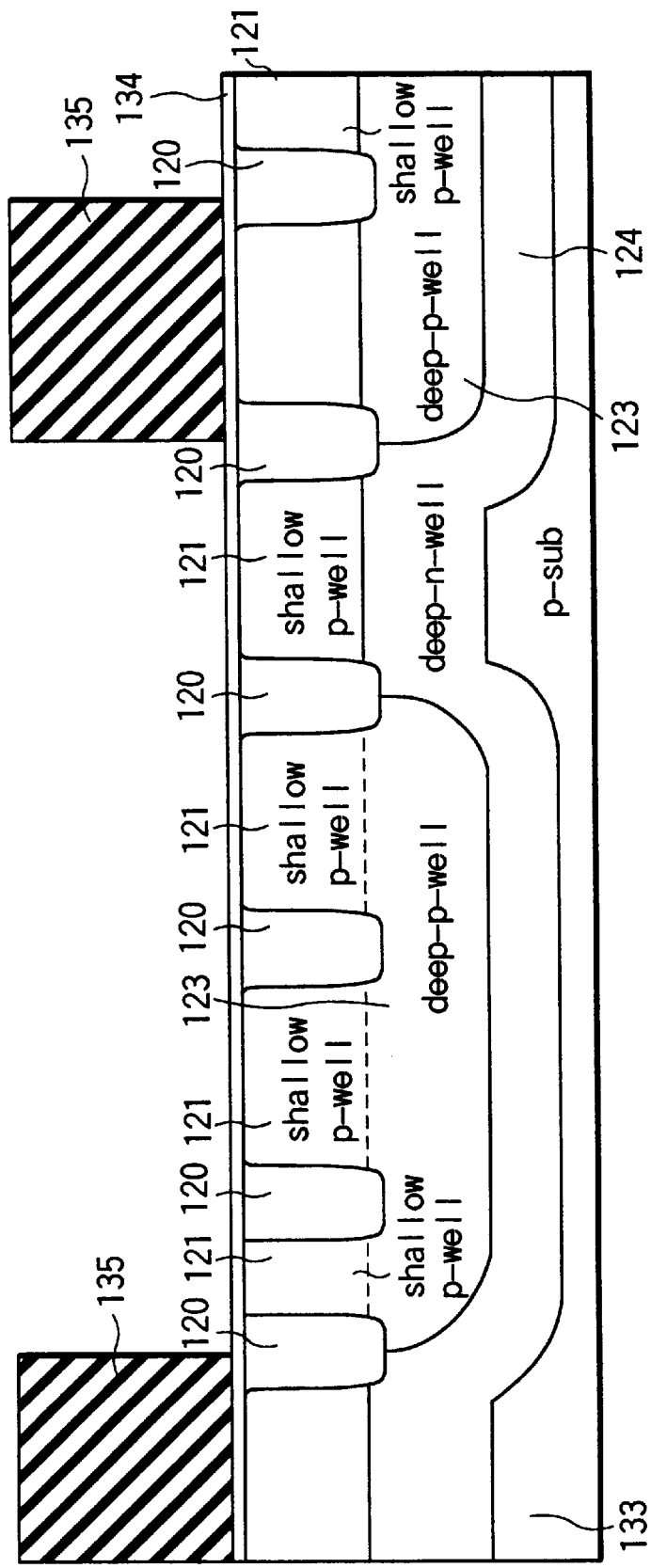
FIG. 50 is a cross section of the step of manufacturing a well structure for realizing the fifth embodiment.

Subsequently, the resist 135 is ashed off. As shown in FIG. 50, on the whole surface thereof, a resist 135 is then applied again and a lithographic process is carried out. For example, boron or indium is ion-implanted thereto at an amount of from $10^{13}$ to $10^{16}$ cm$^{-2}$ at a voltage for acceleration of from 30 to 500 eV to form p-type well region 121. The boundary between the p-type well regions 121 and the n-type well 124 region is formed so that it is will be nearer to the surface of the element separations 120 than the bottom interface thereof. By such a manner as above, the respective wells of the GST transistor can be isolated. The p-type well regions 121 and the p-type well regions 123 are formed to contact each other, so that the n-type layer is not inserted between them.

This manufacturing manner makes it possible to form the respective wells and well separations of the GST transistor 131 having the n-type MISFET, the well of the n-type substrate bias changing MISFET 130, and the shallow p-type well region 121 for applying an electric bias to the p-type well region 123 shown at the right end of FIG. 50, simultaneously.

Figure 51:
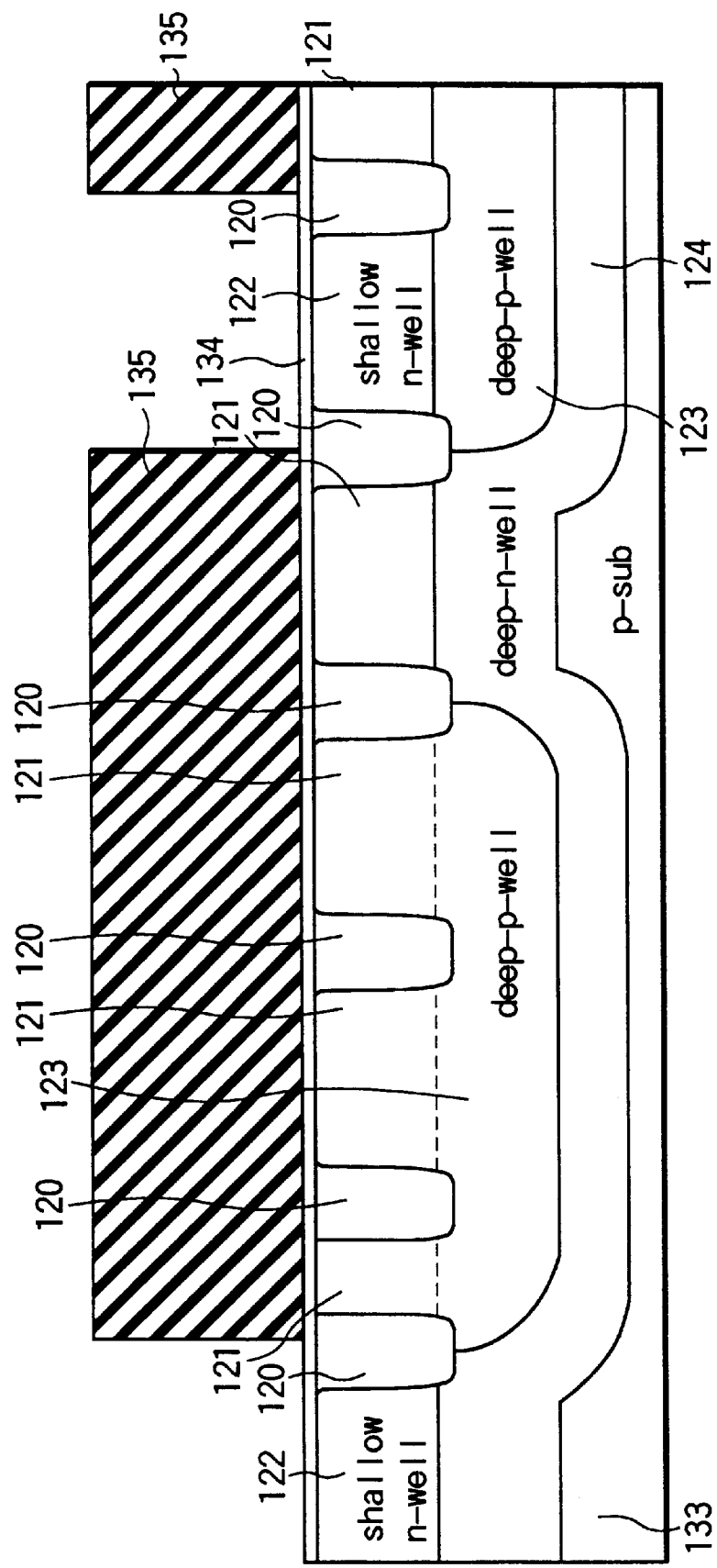
FIG. 51 is a cross section of the step of manufacturing a well structure for realizing the fifth embodiment.

Subsequently, the resist 135 is ashed off. As shown in FIG. 51, on the whole surface thereof, a resist 135 is then applied again and a lithographic process is carried out. For example, phosphorus, arsenic or antimony is ion-implanted thereto at an amount of from $10^{13}$ to $10^{16}$ cm$^{-2}$ at a voltage for acceleration of from 30 to 500 eV to form n-type well regions 122. The boundary between the n-type regions 122 and the p-type well regions 123 is formed so that it is will be nearer to the surface of the element separations 120 than the bottom interface thereof. By such a manner as above, the respective wells of the GST transistor can be isolated. The n-type well region 122 and the n-type well region 124 are formed to contact each other so that any p-type layer 123 is not inserted between them.

The manufacturing manner makes it possible to form the respective wells and well separations of the GST transistor 132 having the p-type MISFET, the well of the p-type MISFET, and the shallow n-type well region 122 for applying an electric bias to the n-type well region 124 shown at the left end of FIG. 47, simultaneously. It is evident that in the shallow n-type well region 122 at the left side in the figure, of course, a substrate bias changing transistor having a p-type MISFET can be formed and a voltage can be applied to the n-type well region 122 independently on the substrate 133.

As described above, a new point of the process for manufacturing the present invention is that it is possible to form the wells of both the p-type and the n-type of GST transistors and the wells of the both the p-type and n-type substrate bias changing transistor simultaneously with only 4 lithographic masks, apply a bias voltage to them independently on the p-type substrate 133, and use a portion of its surface as the terminal for applying the voltage. It is also possible to make the manufacturing steps fewer because of reducing the number of the used masks, improve position-fitting precision between the GST transistor and the substrate bias changing transistor in comparison with the prior manufacturing process in which more lithographic steps are used, and reduce the region for the chip.

For this reason, it is possible to integrate the CMOS circuit which is having the substrate bias changing transistor and the GST transistor and which is described in the present embodiment on a single chip to make the region of the chip smaller, and realize higher-speed operation.

After the formation of the above-mentioned wells, a heating step at 700–1100° C. may be carried out for from 10 seconds to 60 minutes to remove ion implantation defects. Furthermore, the resist 135 is ashed off and then the insulation film 134 is removed off by, e.g., ammonium fluoronate solution. After that, the surface of the semiconductor is oxidized or nitrided with a thickness of, e.g., 3–100 nm, so as to form a gate insulation film 128. On the whole surface thereof, a polycrystal silicon film which will be a gate electrode 127 is deposited, followed by implantation of phosphorus or boron, thereby lowering resistance of the film. On the whole surface thereof, e.g., an insulation film 129 such as a silicon oxide film or a silicon nitride film may be deposited that its thickness will be from 10 to 300 nm.

Then, lithography and reactive ion etching processes are carried out to form a gate electrode. On the whole surface thereof, an insulation film 129 such as a silicon oxide or a silicon nitride is deposited so that its thickness will be, e.g., from 1 to 300 nm, and the resultant is subjected to anisotropic ion-etching, so that the film 129 selectively remains on the side wall of the gate electrode. This insulation film 129 surrounds the upper surface and the side surface of the gate, to prevent short circuit of the gate and the source/drain electrodes and reduce capacitive coupling between them. Thus, a more reliable and higher-speed logic circuit can be realized.

Subsequently, on the whole surface thereof, a resist is then applied and a lithographic process is carried out. For example, phosphorus, arsenic or antimony, which is an n-type dopant, is ion-implanted thereto at an amount of from $10^{13}$ to $10^{16}$ cm$^{-2}$ at a voltage for acceleration of from 1 to 30 eV to form n-type source/drain layers 125 and n-type well contact layers 125'. On the whole surface thereof, a resist is then applied and a lithographic process is carried out. For example, boron or BF$_2$, which is a p-type dopant, is ion-implanted thereto at an amount of from $10^{13}$ to $10^{16}$ cm$^{-2}$ at a voltage for acceleration of from 1 to 30 eV to form p-type source/drain layers 126 and p-type well contact layers 126'. Thus, a structure shown in FIG. 47 is obtained.

As not shown in any drawings, subsequently deposition of Co or Ti having a thickness of 0.01 to 0.3 μm on the whole surface and heating process at 600° C. or more may be carried out to selectively form a CoSi$_x$ or TiSi$_x$ film on the source/drain. The remaining metal is removed off by etching. A silicide is formed on the source/drains to make resistance lower. After that, an interlayer dielectric film is deposited thereon, and lithography and reactive ion etching processes are carried out to form a wiring contact. Furthermore, a metal such as Al or W is deposited to form an upper wiring layer. Thus, a semiconductor device is completed.

In one example of the present cross section structure, the width of the element separation is 0.1 μm, the depth of the element separation is 0.2 μm, the born concentration in the substrate 133 is 1×10$^{15}$ cm$^{-3}$, the peak depth of the n-type well region 124 formed at more inner portion of the substrate than the p-type region is 0.5 μm, the peak concentration therein is 2×10$^{17}$ cm$^{-3}$, and the full width at half maximum thereof, in which the concentration becomes a half of the peak concentration, is 0.1 μm. The n-type well 124 is formed by implantation of, e.g., phosphorus. The peak depth of the p-type well region 123 is 0.25 μm, the peak concentration therein is 5×10$^{17}$ cm$^{-3}$, and the full width at half maximum thereof is 0.07 μm. The p-type well is formed by implantation of, e.g., boron. Additionally, the peak depth of the n-type well region 124' is 0.25 μm, the peak concentration therein is $5\times10^{17}$ cm$^{-3}$, and the full width at half maximum thereof is 0.09 μm. The n-type well are 124' is formed by implantation of, e.g., phosphorus.

The peak depth of the shallow p-type well region 121 is 0.13 μm, the peak concentration therein is $1\times10^{18}$ cm$^{-3}$, and the full width at half maximum thereof is 0.05 μm. The shallow p-type well region 121 is formed by implantation of, e.g., boron. The peak depth of the shallow n-type well region 122 is 0.13 μm, the peak concentration therein is $1\times10^{18}$ cm$^{-3}$, and the full width at half maximum thereof, is 0.05 μm. The shallow n-type well region 122 is formed by implantation of, e.g., phosphorus.

For the n-type source/drain layer 125, and the n-type contact layer 125' contacting the n-type well region 122, the peak depth is 0.01 μm, the peak concentration is $2\times10^{20}$ cm$^{-3}$, and the width, which is measured from the depth, necessary for decreasing the concentration to $1\times10^{18}$ cm$^{-3}$ is 0.05 μm. These are accomplished by implantation of arsenic or phosphorus. For the p-type source/drain layer 126, and the p-type contact layer 126' contacting the n-type well region 121, the peak depth is 0.01 μm, the peak concentration is $2\times10^{20}$ cm$^{-3}$, and the width, which is measured from the depth, necessary for decreasing the concentration to $1\times10^{18}$ cm$^{-3}$ is 0.05 μm. These are accomplished by implantation of boron or BF$_2$.

In this structure, even if the voltages 0V, 0.6V, 0.6V, 0V, 0V and 0.6V are applied to the n-type source/drain layers 125, the p-type well regions 121, the n-type well region 124, the p-type well regions 123, the n-type well regions 122 and the p-type source/drain layers 126, respectively, it is possible to keep leakage currents from the n-type source/drain layers 125 and the p-type source/drain layers 126 below $10^{-7}$ A/μm$^2$ and $10^{-7}$ A/μm$^2$, respectively. Thus, when the power supply voltage $V_{DD}$ is 0.6V, latching-up is not caused.

Because the leakage currents are based on operations of the npn and pnp bipolar transistors, leakage currents can be more reduced in the case of applying a voltage higher than 0V and lower than 0.6V to the n-type source/drain layers 125 and applying a voltage higher than 0V and lower than 0.6V to the p-type source/drain layers 126, in comparison with the case of applying the voltage 0V to the n-type source/drain layers 125 and applying the voltage 0.6V to the p-type source/drain layers 126. Therefore, by inserting the leakage cut transistors, which are represented by, e.g., Q3 and Q4 in FIG. 46, it is possible to make the source/drain voltage of the GST transistor higher than 0V and lower than 0.6V, and greatly reduce the leakage current from the source/drain electrodes of the GST to the well in comparison with the case of the GST transistor alone.

Embodiment 6

Figure 52:
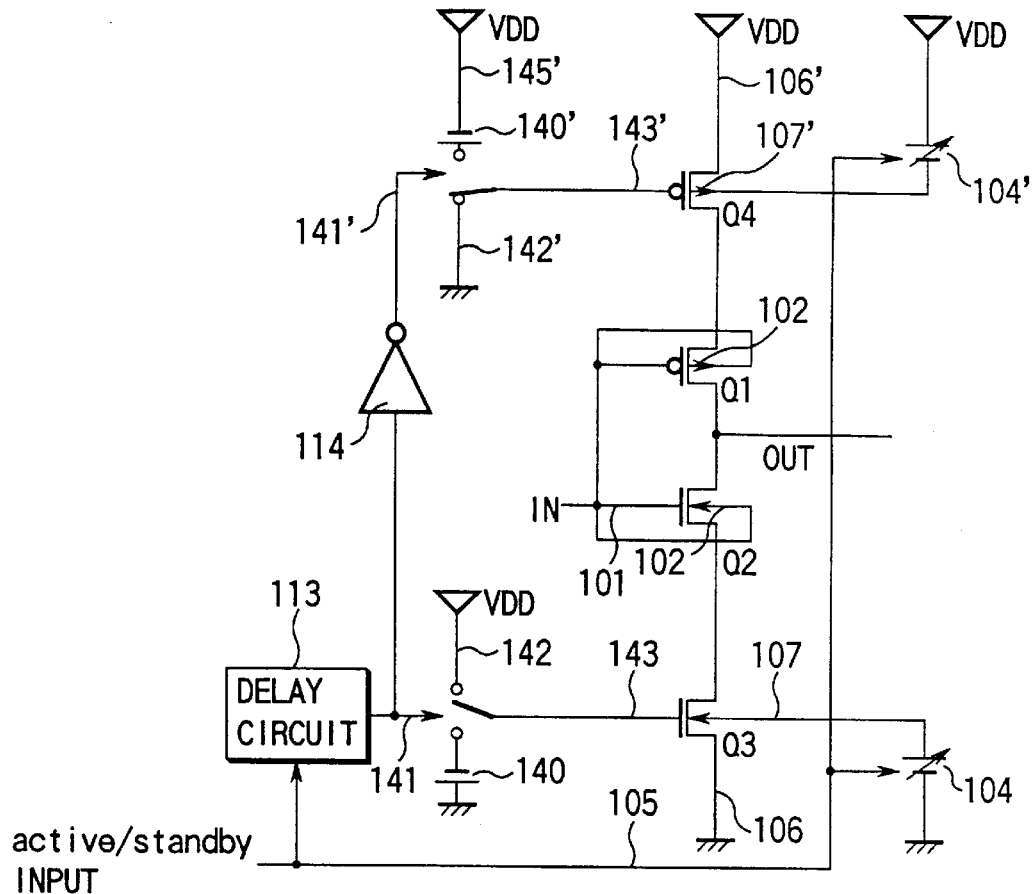
FIG. 52 is a view illustrating a structure of a logic circuit relating to the sixth embodiment.

FIG. 52 illustrates a structure of a logic circuit relating to the sixth embodiment shown in FIG. 46 of the present invention. The present embodiment is different from the fifth embodiment in the manner of application of the gate voltage of the leakage current cut-off transistor Q3 and Q4. To the same elements as in the fifth embodiment, the same reference numbers are attached. Detailed explanation thereof is omitted.

In FIG. 52, a gate electrode 143 of Q3 is connected through a switching circuit alternatively to a negative bias power supply 140 or a node 142 for giving a voltage more positive than the voltage from the power supply 140. The node 142 is one for supplying the voltage of a power supply $V_{DD}$, in FIG. 52. An output 141 from a delay circuit 113 is supplied to the switching circuit, as a control signal. The switching circuit is functioned so that the nodes 142 and 143 are connected to each other during active state and the nodes 140 and 143 are connected to each other during standby state.

In FIG. 52, a gate electrode 143' of Q4 is connected through a switching circuit alternatively to a bias power supply 140' for giving a voltage more positive than the power supply voltage $V_{DD}$ or a node 142' for giving a voltage more negative than the voltage from the bias power supply 140'. The node 142' is one for supplying the, e.g., voltage 0V, in FIG. 52. An output 141' obtained by inverting an output 141 from the delay circuit 113 with an inverter 114 is supplied to the switching circuit, as a control signal. The switching circuit is functioned so that the nodes 142' and 143' are connected to each other during active state and the nodes 140' and 143' are connected to each other during standby state.

The gate voltage applying circuits of Q3 and Q4 may be formed each independently. One of Q3 and Q4 may be formed into the structure of the present embodiment, and the other may be formed into the structure of Q3 or Q4 shown in FIG. 46.

The operation during active state of the present embodiment is the same as that of the fifth embodiment. Thus, explanation thereof will be omitted. At standby state, it is possible to more reduce the subthreshold leakage current of Q3 because the gate voltage of Q3 is negatively biased in comparison with 0V in the fifth embodiment. At standby state, it is also possible to more reduce the subthreshold leakage current of Q4 because the gate voltage of Q4 is positively biased in comparison with $V_{DD}$ in the fifth embodiment. When the gate capacitance is smaller than the well capacitance, it is possible to reduce the charge amount in charge and discharge for lowering a leakage current, thereby reducing an electrical power consumed at standby/active operation switching time and making higher speed operation possible, in the case wherein the gate voltage is negative than that wherein the gate voltage is positive. In the former case, sufficient cutoff is made possible even if electric current supplying ability of the substrate bias generator 104 and 104' is low. Thus, the areas of the generators may be small.

In the present embodiment, the transistors in which its substrate biases are changed are used for Q3 and Q4, so as to reduce a drain leakage current. This is because in the fine MISFET the manner of changing the substrate bias is more effective for reducing the drain leakage current of the transistors without degradation in reliability than the manner of making the gate voltage negative. This will be descried referring to FIGS. 53A to 53C.

Figure 53A:
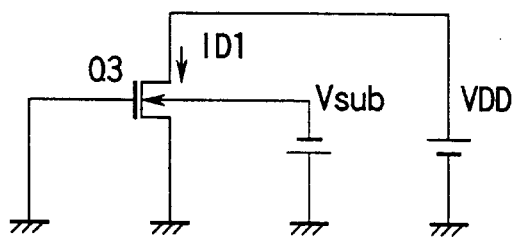
FIGS. 53A to 53C are views for expelling the operation of the sixth embodiment.
Figure 53B:
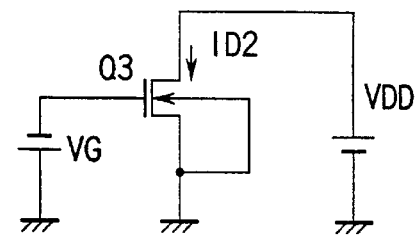
Figure 53C:
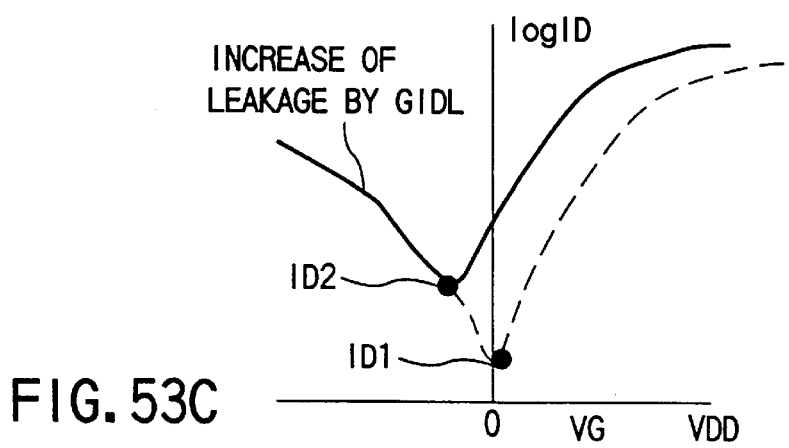

FIG. 53A is a schematic view of a circuit of Q3 in the fifth and sixth embodiments for reducing a leakage current by a substrate bias. A drain electrode of Q3 is connected to the $V_{DD}$ supplying a positive voltage, for example, one of from 0.1 to 5V. It is assumed that the threshold voltage of the transistor is positive, the gate voltage is 0V and the transistor is cut-off. By making the substrate bias $V_{sub}$ negative, a drain leakage current is reduced. On the contrary, in FIG. 53B the substrate bias is fixed to, for example, 0V, and a negative gate voltage is applied so as to reduce a drain current. FIG. 53C shows the relationship between the drain current $I_D$ and the gate voltage $V_G$.

In the n-type MISFET, application of the negative gate voltage causes reduction in a subthreshold leakage current.

In FIG. 53C, this subthreshold leakage current is shown by a positive gradient against the gate voltage. However, when in fine transistors the gate voltage is applied negatively under the condition that the drain voltage is applied, a tunnel leakage current, the so-called GIDL (Gate-Induced Drain Leakage current) flows between the drain electrode and the substrate electrode through the surface layer of the drain electrode strongly inverted by the gate voltage. The GIDL becomes larger when the gate voltage is more negative. The GIDL is shown with a negative gradient against the gate voltage, in FIG. 53C. The GIDL is known in, for example a literature (J. Chen, T. Y. Chan, I. C. Chen, P K. Ko and C. Hu, "Subbreakdown Drain Leakage Current in MOSFET", IEEE Electron Device Letters, vol. RDL-8. No. 11, November, pp. 515–517, 1987).

When the gate voltage is applied more negatively so that the difference between the gate voltage and the drain voltage, the GIDL becomes larger. Therefore, in the transistor in which its substrate voltage shown in FIG. 53B is fixed to 0V, the drain leakage current is reduced merely to the minimum value $I_{D2}$ which is by the drain and gate voltages, as shown by a solid line in FIG. 53C. On the contrary, in the circuit in which the substrate voltage is applied negatively to reduce the drain leakage current, the difference between the gate and drain voltages does not change, so that increase in the GIDL by application of the substrate bias hardly occurs. As shown by a dashed line in FIG. 53C, therefore, it is possible to reduce the subthreshold leakage current by the substrate bias effect that the threshold voltage is shifted more positively, even when the gate voltage is 0V. Accordingly, the GIDL can be reduced in the case of applying the gate voltage of 0V than in the case of applying the gate voltage negatively. As a whole, the drain leakage current can be reduced to $I_{D1}$, which is smaller than $I_{D2}$.

Embodiment 7

Figure 54:
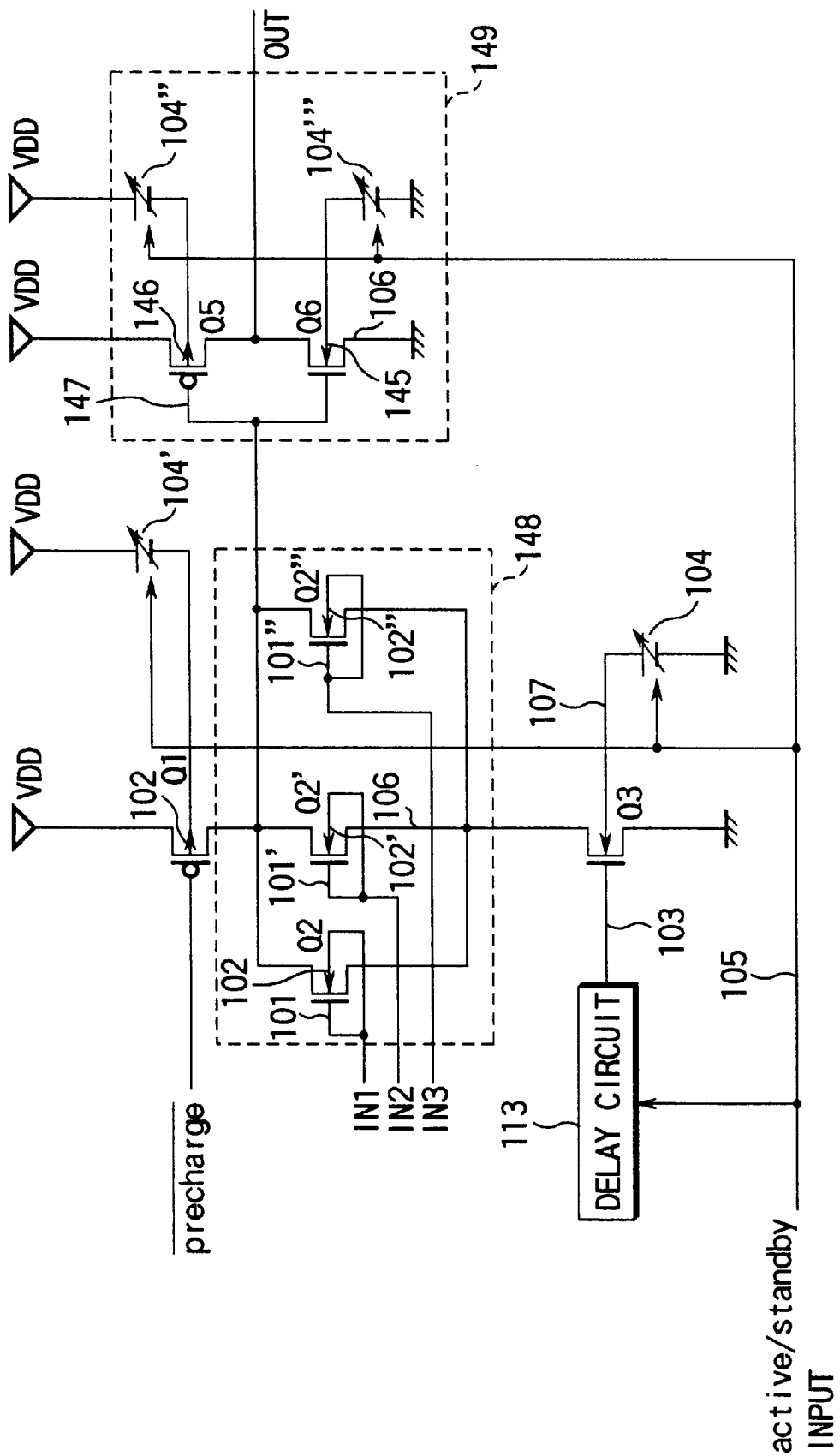
FIG. 54 is a view illustrating a structure of a logic circuit relating to the seventh embodiment.

FIG. 54 shows the seventh embodiment of the invention, in which the circuit shown in FIG. 43 in the fifth embodiment is applied to a precharge logic circuit. The same reference numbers are attached to the same portions in the fifth and seventh embodiments. Detailed explanation thereof is omitted.

In FIG. 54, a connecting node 147 of MISFETs Q2 and Q1 is connected to a gate electrode of a p-type MISFET (Q5) and a gate electrode of an n-type MISFET (Q6). A drain electrode of MISFET Q5 is connected to a drain electrode of MISFET Q6 to constitute a static inverter. A substrate electrode of MISFET Q5 is connected to a substrate voltage supply node 146. The node 146 has two stationary voltage values during active state and standby state, and is connected to, e.g., a voltage supply 104". This voltage supply 104" is also connected to a control input node 105 for controlling a state into active or standby one.

A substrate electrode of MISFET Q6 is connected to a substrate voltage supply node 145. The node 145 has two stationary voltage values during active state and standby state, and is connected to, e.g., a voltage supply 104'". This voltage supply 104'" is also connected to a control input node 105. In other words, MISFETs Q5 and Q6 constitute a substrate bias changing transistor.

This static inverter is for raising current drivability of a logic circuit in the next step and a logic amplitude thereof, or adjusting a late rising waveform of a dynamic NOR circuit in the previous step to obtain a rapid falling waveform. The structure at the left side from the node 147 is the same as in FIG. 43 and the operation of the dynamic circuit is the same as in the fifth embodiment, the explanation of which is omitted. Thus, as the structure at the left side from the node 147, other structures explained in connection with the fifth and sixth embodiments may be used.

The characteristic of the present embodiment is that MISFET Q2 is having a GST transistor and MISFETs Q5 and Q6 are respectively having a transistor in which its gate electrode and its substrate electrode are not electrically connected to each other. This structure makes it possible to cut off a short cut current path in the case wherein only a GST transistor constitutes an inverter. This will be explained, referring to FIG. 54.

Figure 3:
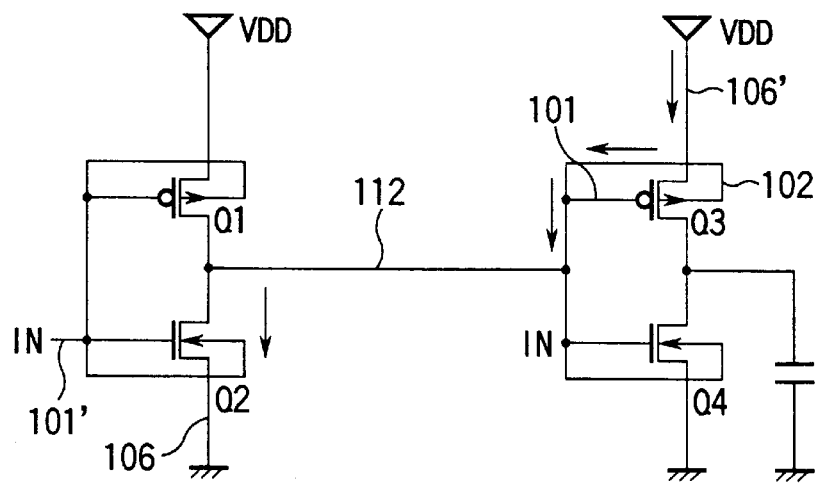
FIG. 3 is a view for explaining a problem of a static inverter having a GST transistor.

It is assumed that in the structure shown in FIG. 54 either of IN1, IN2 and IN3 is a "H" level, e.g., $V_{DD}$. At that time, either of Q2, Q2' or Q2" becomes conductive, so that the voltage at the node 147 is reduced below $V_{DD}$ and a current flows from the node 147 to which drains Q2 and Q1 are connected to a ground level through Q3. In the present embodiment, the transistor of Q5 is having not a GST transistor but a substrate bias changing transistor, so that a short cut current, as shown in FIG. 3, flowing between the gate electrode and $V_{DD}$ through Q5 is not generated. Thus, the short cut current does not cause a rise in the voltage at the node 147 so as to prevent logic error operation and leakage based on the short cut current.

Next, it is assumed that all of IN1 to IN3 are "L" levels, for example, 0V. At that time, all of MISFETs Q2, Q2' and Q2" are cut-off, and the voltage of node 147 is about $V_{DD}$. In the present embodiment, the transistor of Q6 is having not a GST transistor but a substrate bias changing transistor, so that a short cut current is not generated which flows from the gate electrode of Q6 to the source electrode thereof through the substrate electrode. Thus, the short cut current does not cause a drop in the voltage at the node 147 so as to prevent logic error operation and leakage based on the short cut current.

Figure 55:
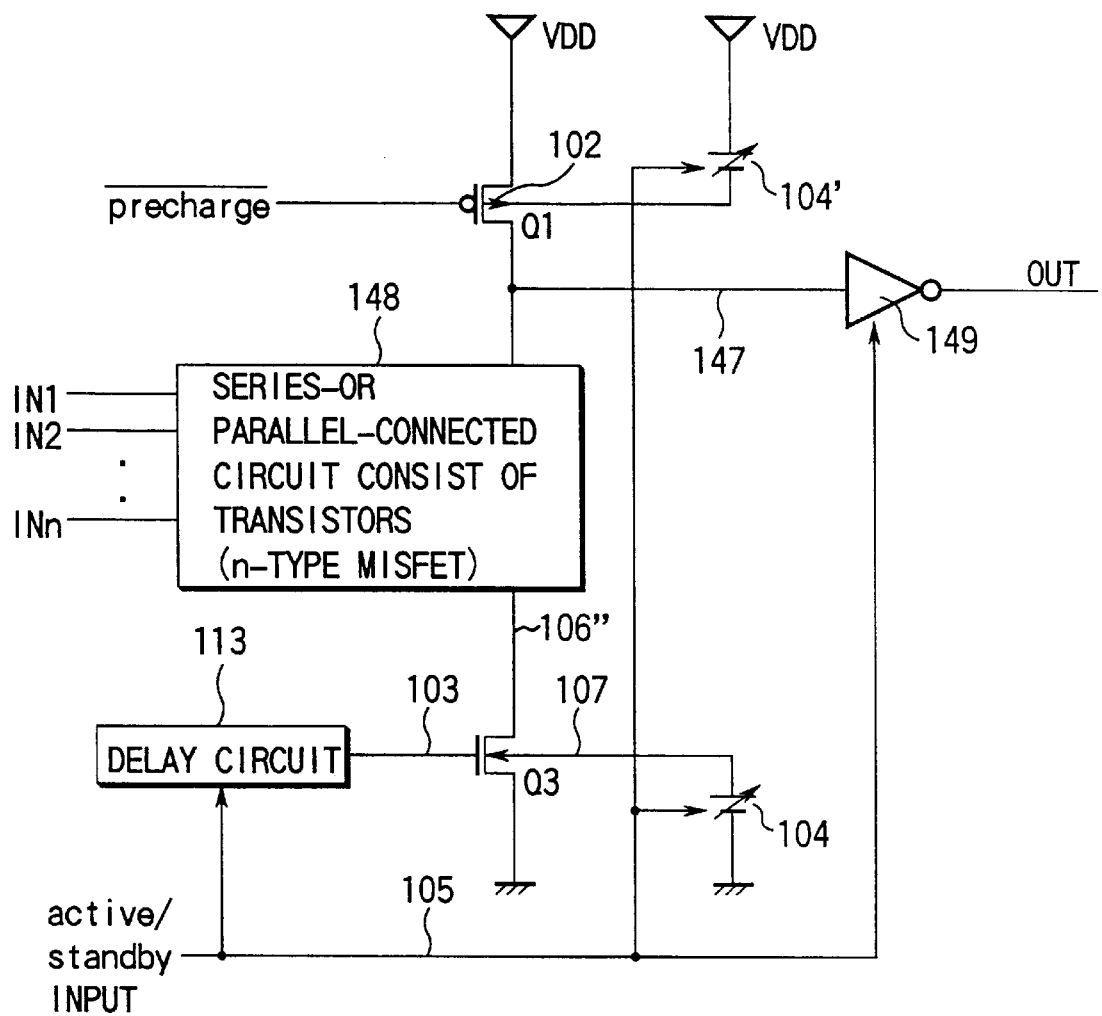
FIG. 55 is a view illustrating a modification of the seventh embodiment.
Figure 56:
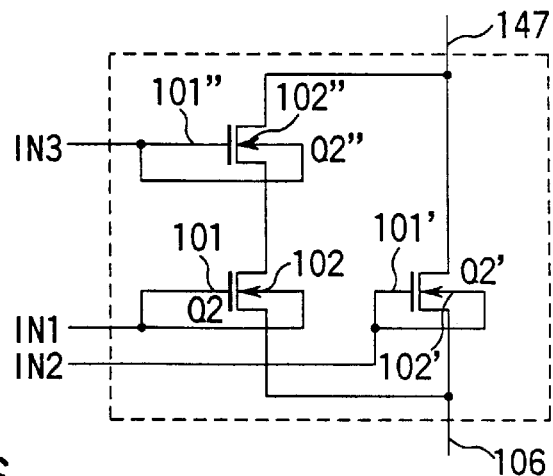
FIG. 56 is a view illustrating an example of a functional block show in FIG. 55.

FIG. 55 shows a modification of the present embodiment. This modification makes 3 input-OR shown in FIG. 54 general. In FIG. 55, the reference number 148 denotes a series or parallel circuit having GST transistors. These constitute a logic circuit by connecting in series or in parallel source/drain electrodes of an n-type MISFET having inputs connected to substrate electrodes and the gates shown by INx (x=1, 2, . . . , n) in this figure. An example of the circuit block 148 may be a circuit shown in FIG. 56.

In this circuit, a drain electrode of an n-type MISFET transistor Q2 is connected to a source electrode of an n-type MISFET transistor Q2" in series. They are connected to source/drain electrodes of an n-type MISFET transistor Q2' in parallel. In this circuit, a node 147 can be connected electrically to a node 106" when both of IN1 and IN3 are $V_{DD}$ or when IN2 is $V_{DD}$. Thus, an AND or an OR circuit can be realized by such a circuit, so as to synthesize any non-inversion logic circuit.

In FIG. 55, the output node 147 of the circuit block 148 is connected to, e.g., an input of a circuit block 149 having a CMOS inverter. It is important that in the circuit block 149 its gate input is having not a GST transistor but a transistor in which voltages can be applied to its gate and substrate terminal independently. This makes it possible to prevent logical error operation caused by change in the voltage of the node 147, the change being based on the short cut current from the voltage node of the circuit block 149 to the node 147 thereof, and leakage by the short cut current, as described in connection with the present embodiment.

Of course, the circuit block 149 may be formed by other logic circuit than the inverter, for example, a NOR or a NAND. Namely, it is sufficient that the circuit block 149 has a transistor in which voltages can be applied to its substrate and gate connected to the node 47 as its input.

Figure 57:
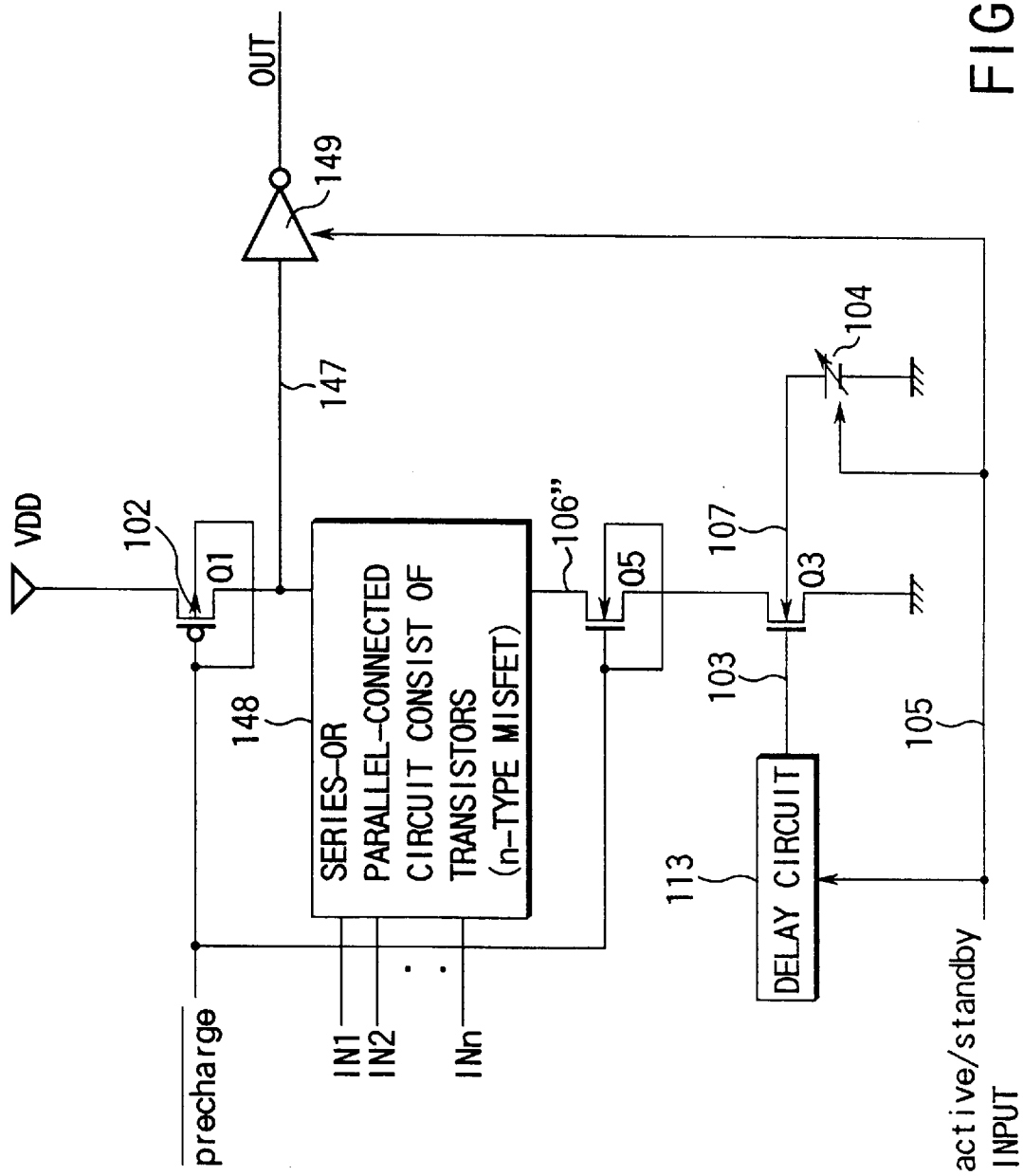
FIG. 57 is a view illustrating another modification of the seventh embodiment.

FIG. 57 illustrates another modification of the present embodiment. It is different from the above-mentioned modification in that a GST transistor (Q5) is introduced between Q3 and the circuit block 148. Specifically, a source electrode of Q5 is connected to a drain electrode of Q3, and a drain electrode of Q5 is connected to the circuit block 148. A substrate electrode and a gate electrode of Q5 are connected to each other, and the substrate electrode and a gate of Q1 are connected to each other, so as to constitute a precharge inversion input.

This is the so-called domino logic circuit. Q5 connected to the circuit block 148 in series is driven synchronously with Q1. Thus, when the precharge inversion input is stationary value, i.e., 0V or $V_{DD}$, the short cut current does not flow from the power supply $V_{DD}$ to 0V to reduce electrical power consumption. By using a GST transistor as Q1, it is possible to realize a higher ON/OFF ratio during active state than that of a substrate bias changing transistor.

As described above, according to the fifth and sixth embodiments of the invention, even if the channel width of a leakage reducing transistor Q3 connected in series for reducing a subthreshold leakage is small, it is possible to suppress increase in gate delay time and realize a higher integrated scale with Q3 region being small. It is also possible to raise the threshold voltage of Q3 during standby state and to keep the subthreshold leakage current small. Furthermore, it is possible to reduce leakage currents during standby state and active state and have a high electric current drivability during active state, in the structure wherein the GST transistor and the substrate bias changing transistor are connected to each other than in the prior structure wherein transistors each substrate bias of which is not changeable are connected to each other.

By using the structure of the modification 2 of the fifth embodiment, it is possible to realize a dynamic NOR circuit making higher-speed and lower electrical power consumption possible, in comparison with prior static NOR circuits.

Furthermore, by using the well structure for realizing the fifth embodiment, it is possible to form a GST transistor and a substrate bias changing transistor having CMOSs in the well region on a semiconductor substrate by using 4 lithographic masks, thereby reducing or shortening the manufacturing steps, as compared with the prior method of forming them separately. It is also possible to improve a lithographic registration of wells between the GST transistor and the substrate bias changing transistor and reduce the region of the chip, in comparison with the case of using more lithographic steps than the present embodiment. For this reason, it becomes possible to integrate the CMOS circuit of the substrate bias changing transistor and the GST transistor on a single chip, to reduce the region of the chip, delay by diffusion capacitance of the source and the drain and wiring delay, and to realize higher-speed operation.

These wells can be set about their voltages independently on the semiconductor substrate. Thus, respective p-type well regions and respective n-type well regions can be electrically isolated. For this reason, minority carriers which generate from other p-type well regions or n-type well regions formed on the same chip do not extend to the wells electrically isolated from them, so as to prevent latching-up and error operation of a software. It is also possible to prevent a problem of latching-up caused by changing the substrate voltage to the power supply voltage direction, the change being caused by capacitive coupling between the substrate and the circuit or the wire, in turning the power supply on.

Using the structure of the seventh embodiment does not cause the problem of the short cut current in the case of connecting in series GST transistor's, so as to reduce electrical power consumption.

The present invention is not limited to the above-mentioned embodiments. In the embodiments 5–7 the insulation films 129, 120, 128 and 134 may be formed by the oxide film forming method using thermal oxidation or introduction of oxygen at a low accelerating energy, e.g., about 30 kV, the method for depositing an insulation film, the method for depositing silicon nitride, or combination thereof. The element isolation film or the insulation film described in the embodiment may be formed by methods for converting silicon into a silicon oxide film or a silicon nitride film other than the above-mentioned methods, for example, the method for introducing oxygen ion into a deposited silicon, or the method for oxidizing deposited silicon. For this insulation film, there may also be used a single layer of a ferrodielectric material or paradielectric film or multiple layers thereof, such as tantalum oxide, titanium oxide, titanate strontium, titanate barium, titanate zirconium lead films, as well as a silicon nitride film.

In the embodiments, the element separation is a trench isolation. It may be also formed by the LOCOS isolation method, the recessed LOCOS or improved LOCOS method, mesa separation, or the field shield isolation method or combination thereof.

In the embodiments, a p-type Si substrate is used as the semiconductor layer 133. Alternatively, the substrate may be an n-type Si substrate, a SOI substrate, a GaAs substrate, or an InP substrate, SiGe mixed crystal substrate, or SiGeC mixed crystal. The present embodiments may be applied to a p-type MISFET, instead of an n-type MISFET. For the understanding of these modifications of the invention, the following changes in the above description about the present embodiments should be made. Namely, the n-type and the p-type should be changed to the p-type and the n-type, the dopants of As, P, Sb should be changed to either one of In or B, and As, P or Sb used in ion-implantation should be changed to In, B or $BF_2$.

The respective layers 125, 126, 125' and 126', and the gate electrode 127 may be mono-crystal silicon, polycrystal silicon, porous silicon, or amorphous silicon, SiGe or SiGeC mixed crystal, or a metal or a silicide such as GaAs, W, Ta, Ti, Hf, Co, Pt, or Pd. Laminated layers thereof may be used.

The present invention can be changed within the scope claimed in the claims.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

We claim:

1. A semiconductor device comprising: a chip including a MISFET having a source and a drain, in which one of the source and the drain is connected to a second current supply node; an impedance element having a first terminal connected to the other of the source and the drain and a second terminal connected to a first current supply node; and a switching element, wherein a well or a body electrode of the MISFET has an active state and a standby state, and is connected to a bias voltage generator for generating different voltages through the switching element, the threshold voltage $V_{ths}$ during standby state of the MISFET is higher than the threshold voltage $V_{tha}$ during active state of the MISFET, a voltage applied to a gate of the MISFET being able to take two stationary values, and the following relationship is satisfied:

$$V_{DD}(1-V_{ths}/V_{DD})<V_{ths}-V_{tha}$$

where $V_{DD}$ represents the higher voltage among the two stationary values.

2. A semiconductor device according to claim 1, wherein the voltage of the first current supply node is $V_{DD}$ and the voltage of the second current supply node is 0V when the MISFET is an n-type.

3. A semiconductor device according to claim 1, wherein the voltage of the first current supply node is 0V and the voltage of the second current supply node is $V_{DD}$ when the MISFET is a p-type.

4. A semiconductor device according to claim 1, wherein the impedance element is a resistor or a MISFET in which one of its source and drain is connected to its gate.

5. A semiconductor device according to claim 1, wherein the impedance element is a p-type MISFET when the MISFET is an n-type, and a gate of the p-type MISFET is connected to a gate of the n-type MISFET.

6. A semiconductor device according to claim 1, wherein a well or a body voltage of the n-type MISFET is higher than $V_{DD}$ when the MISFET is an n-type.

7. A semiconductor device according to claim 1, wherein the impedance element is an n-type MISFET when the MISFET is a p-type, and a gate of the n-type MISFET is connected to a gate of the p-type MISFET.

8. A semiconductor device according to claim 1, wherein a well voltage of the p-type MISFET is lower than 0V when the MISFET is a p-type.

9. A semiconductor device according to claim 1, wherein the chip has a substrate bias control circuit comprising a logic circuit including a MISFET, a step-down circuit, an n-type MISFET and a p-type MISFET, one of a source and a drain of the p-type MISFET in the substrate bias control circuit is connected to third current supply node, one of a source and a drain of the n-type MISFET is connected to fourth current supply node, gates of these MISFETs are commonly connected to the active/standby control input terminal, the other of the source and the drain of the p-type MISFET and the n-type MISFET are commonly connected to be connected to a substrate or a body electrode of the MISFET in the logic circuit, and one of power supply terminals of the logic circuit is connected to a current/voltage output portion of the step-down circuit, and the other of the power supply terminal is connected to either the first or the second current supply node.

10. A semiconductor device according to claim 9, wherein the substrate bias control circuit comprises two oscillators in which their oscillated frequencies or duty rations are different from each other, and a switching circuit for switching outputs from these oscillators by active/standby control input to supply the outputs into an input of an inverter having the p-type MISFET and the n-type MISFET.

11. A semiconductor device according to claim 9, wherein the substrate bias control circuit has a booster circuit for applying a higher voltage than a power supply voltage into the inverter having the p-type MISFET and the n-type MISFET.

12. A semiconductor device according to claim 9, wherein a voltage of the third current supply node is $V_{DD}$ and a voltage of the fourth current supply is 0V.

13. A semiconductor device according to claim 1, wherein the chip comprises a logic circuit having a MISFET, a first voltage supply node for giving a higher voltage than a power supply voltage $V_{DD}$ supplied to the logic circuit, a second voltage supply node for giving a lower voltage than the $V_{DD}$, selecting circuit for selecting either one of outputs from the first and second voltage supply nodes in accordance with either one of inputs under the two conditions during active state and standby state so as to give the output to a substrate or a body electrode of the MISFET of the logic circuit, and a charging MISFET in which one of its source and drain is connected to the substrate and the body electrode of the MISFET of the logic circuit, and the charging MISFET turns from a cut-off condition to a conductive condition in changing from the condition during standby state to the condition during active state and the other of the source and the drain of the MISFET is kept within the range from 0 or more Volt to $V_{DD}$ or less voltage.

14. A semiconductor device comprising a chip including a logic circuit having a MISFET which is selectively operated under an active condition or a standby condition, a first voltage supply node for giving a voltage, which is lower than a ground voltage, corresponding to the standby condition, a second voltage supply node for giving a voltage, which is higher than a power supply voltage, corresponding to the active condition, a switching circuit for selecting either one of the first and second voltage supply nodes to give the voltage thereof a substrate or a body electrode of the MISFET in the logic circuit, wherein the switching circuit comprising a p-type MISFET and an n-type MISFET, the first voltage supply node being connected to one of a source and a drain of the n-type MISFET, and the second voltage supply node being connected to one of a source and a drain of the p-type MISFET, and the others of the sources and the drains of the n-type MISFET and the p-type MISFET being commonly connected to the substrate or the body electrode of the MISFET in the logic circuit, gates of the p-type MISFET and the n-type MISFET being commonly connected to a control input terminal for control of the two conditions, i.e., the active condition and the standby condition, and voltages at the control input terminal being within a range from a ground voltage of the logic circuit to a power supply voltage thereof.

15. A semiconductor device according to claim 14, wherein the first voltage supply node generates a negative voltage $V_1$ under the standby condition, a voltage $V_2$ of the first voltage supply node under the active condition is a voltage more positive than the $V_1$, the second voltage supply node outputs a positive voltage $V_3$, and a voltage $V_4$ of the second voltage supply node under the standby condition is a voltage more negative than the $V_3$ under the active condition; and which satisfies the following relationship:

$$V_{th1}<V_s \text{ and } V_{th3}>V_a, \text{ and } (V_{th2}V_a \text{ and } V_{th1}<V_a) \text{ or } (V_{th3}>V_s \text{ or } V_{th4}<V_s)$$

provided that when the voltage of the first voltage supply node of the selecting circuit is fixed to $V_1$ and a control signal is changed, a control input voltage which changes from a cut-off condition to a conductive condition is represented by $V_{th1}$; when the voltage of the first voltage supply node of the selecting circuit is fixed to $V_2$ and the control signal is changed, a control input voltage which changes from the cut-off condition to the conductive condition is represented by $V_{th2}$; when the voltage of the second voltage supply node of the selecting circuit is fixed to $V_3$ and the control signal is changed, a control input voltage which changes from the cut-off condition to the conductive condition is represented by $V_{th3}$; when the voltage of the second voltage supply node of the selecting circuit is fixed to $V_4$ and the control signal is changed, a control input voltage which changes from the cut-off condition to the conductive condition is represented by $V_{th4}$; the stationary voltage of the control signal under the standby condition is represented by $V_s$; and the voltage of the control signal under the active condition is represented by $V_a$.

16. A semiconductor device comprising: a chip in which first and second MISFETs and a voltage supply node are formed, wherein a gate and a well electrode, or the gate or a body electrode of the first MISFET being connected to each other, a source of the first MISFET and a drain of the second MISFET being connected to each other, a source of the second MISFET being connected to a current supply node, a well or a body electrode of the second MISFET being connected to the voltage supply node and being able to fall in at least two stationary conditions during standby state and during active state, $V_{th}$ and $V_{ths}$ being set to satisfy $V_{th}<V_{ths}$ wherein $V_{ths}$ represents the threshold voltage during standby state of the second MISFET and $V_{th}$ represents the threshold voltage of the first MISFET, and the voltage of a gate of the second MISFET being able to fall in at least two stationary conditions during standby state and active state, the second MISFET becoming a cut-off state during standby state, and the second MISFET becoming conductive as active state.

17. A semiconductor device according to claim 16, wherein the gate and the well electrode of the first MISFET or the gate and the body electrode thereof being connected to each other, and plural of the MISFETs are in parallel connected so that sources thereof are common and drains thereof are common and gates thereof are independently biased from each other.

18. A semiconductor device according to claim 16, wherein the conductive type of the majority carriers of the first and the second MISFET are the same.

19. A semiconductor device according to claim 16, wherein the relationship $V_{th}>V_{tha}$ is satisfied when the threshold during active state of the second MISFET is represented by $V_{tha}$.

20. A semiconductor device according to claim 16, wherein a backward bias is applied to the well or the body electrode of the second MISFET during standby state, and a forward bias is applied to the well or the body electrode of the second MISFET during active state, compared to the source electrode voltage the second MISFET.

21. A semiconductor device according to claim 16, wherein a source electrode of the third MISFET is connected to a node to which the source electrode of the first MISFET and the drain electrode of the second MISFETs are connected, and the gate electrode of the third MISFET is connected to the well or the body electrode thereof, and the third and the first MISFETs are formed on the same chip.

22. A semiconductor device comprising a chip in which first, second and third MISFETs and a voltage supply node, wherein a gate and a well electrode of the first MISFET or the gate and a body electrode thereof being connected to each other, a drain of the first MISFET being connected to a drain electrode of the second MISFET and a gate electrode of the third MISFET, a source electrode of the second MISFET being connected to a current supply node, majority carriers of the first MISFET and the third MISFET are the same conductive type, a well or a body electrode of the third MISFET is connected to the voltage supply node and has two stationary conditions during standby state and during active state, and a voltage is applied to the well or the body independently of its gate voltage.

23. A semiconductor device according to claim 22, wherein the gate and the well electrode of the first MISFET or the gate and the body electrode thereof being connected to each other, and plural of the MISFETs are in parallel connected so that sources thereof are common and drains thereof are common and gates thereof are independently biased from each other.

24. A semiconductor device according to claim 22, wherein the conductive type of the majority carriers of the first and the second MISFET are different from each other.

25. A semiconductor device according to claim 22, wherein a backward bias is applied to the well or the body electrode of the second MISFET during standby state, and a forward bias is applied to the well or the body electrode of the second MISFET during active state, compared to the source electrode voltage the second MISFET.

* * * * *